US012706278B2

(12) United States Patent
Wang et al.

(10) Patent No.: US 12,706,278 B2
(45) Date of Patent: Aug. 11, 2026

(54) HYBRID FREQUENCY PLASMA SOURCE

(71) Applicant: Lam Research Corporation, Fremont, CA (US)

(72) Inventors: Yuhou Wang, Fremont, CA (US); Alexander Miller Paterson, San Jose, CA (US); John Stephen Drewery, San Jose, CA (US); Ying Wu, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 246 days.

(21) Appl. No.: 18/685,884

(22) PCT Filed: Aug. 31, 2022

(86) PCT No.: PCT/US2022/042271

§ 371 (c)(1),
(2) Date: Feb. 22, 2024

(87) PCT Pub. No.: WO2023/038838

PCT Pub. Date: Mar. 16, 2023

(65) Prior Publication Data

US 2026/0128258 A1 May 7, 2026

Related U.S. Application Data

(60) Provisional application No. 63/241,967, filed on Sep. 8, 2021.

(51) Int. Cl.
*H01J 37/32* (2006.01)

(52) U.S. Cl.
CPC .. *H01J 37/32183* (2013.01); *H01J 37/32165* (2013.01)

(58) Field of Classification Search
CPC ........ H10P 50/283; H10N 50/01; H03H 7/38; H01J 37/32183; H01J 37/32174;
(Continued)

(56) References Cited

U.S. PATENT DOCUMENTS 10,264,663 B1 4/2019 Long et al.
10,304,663 B1 5/2019 Kapoor et al.
(Continued)

OTHER PUBLICATIONS

ISR & WO PCT/US2022/042271, dated Dec. 23, 10 pages.

*Primary Examiner* — Renan Luque
(74) *Attorney, Agent, or Firm* — Polygon IP, LLP

(57) ABSTRACT

A plasma system includes a first matchless plasma source (MPS) that generates a first sinusoidal waveform having a first frequency. The plasma system includes a first filter coupled to the first MPS to filter a second frequency. The plasma system further includes a first capacitive circuit coupled to the first filter to balance reactances of the first filter and a radio frequency (RF) coil to further provide a first RF signal to a point. The plasma system includes a second MPS that generates a second sinusoidal waveform having the second frequency. The plasma system includes a second filter coupled to the second MPS to filter the first frequency. The plasma system includes a second capacitive circuit that is coupled to the second filter to balance a reactance of the second filter with the reactance of the RF coil to further provide a second RF signal to the point.

23 Claims, 32 Drawing Sheets

(Dual Frequency MPS)

(58) Field of Classification Search
CPC ........... H01J 37/32165; H01J 37/32155; H01J 37/32119; H01J 37/321; H01J 37/32; H01J 2237/334; C23C 16/505
See application file for complete search history.

(56) References Cited

U.S. PATENT DOCUMENTS

| | | | | |
|---|---|---|---|---|
| 2018/0158709 | A1 | 6/2018 | Tsuji et al. | |
| 2020/0118792 | A1* | 4/2020 | Mopidevi | H01J 37/3211 |
| 2020/0126764 | A1 | 4/2020 | Inoue et al. | |
| 2020/0203119 | A1 | 6/2020 | Van Zyl | |
| 2020/0373126 | A1* | 11/2020 | Na | H01J 37/32183 |
| 2021/0398774 | A1* | 12/2021 | Liu | H01J 37/321 |
| 2022/0013330 | A1 | 1/2022 | Driessen et al. | |
| 2022/0122809 | A1* | 4/2022 | Wada | H01J 37/32541 |
| 2022/0199365 | A1 | 6/2022 | Long et al. | |
| 2023/0223236 | A1 | 7/2023 | Kamp et al. | |

* cited by examiner

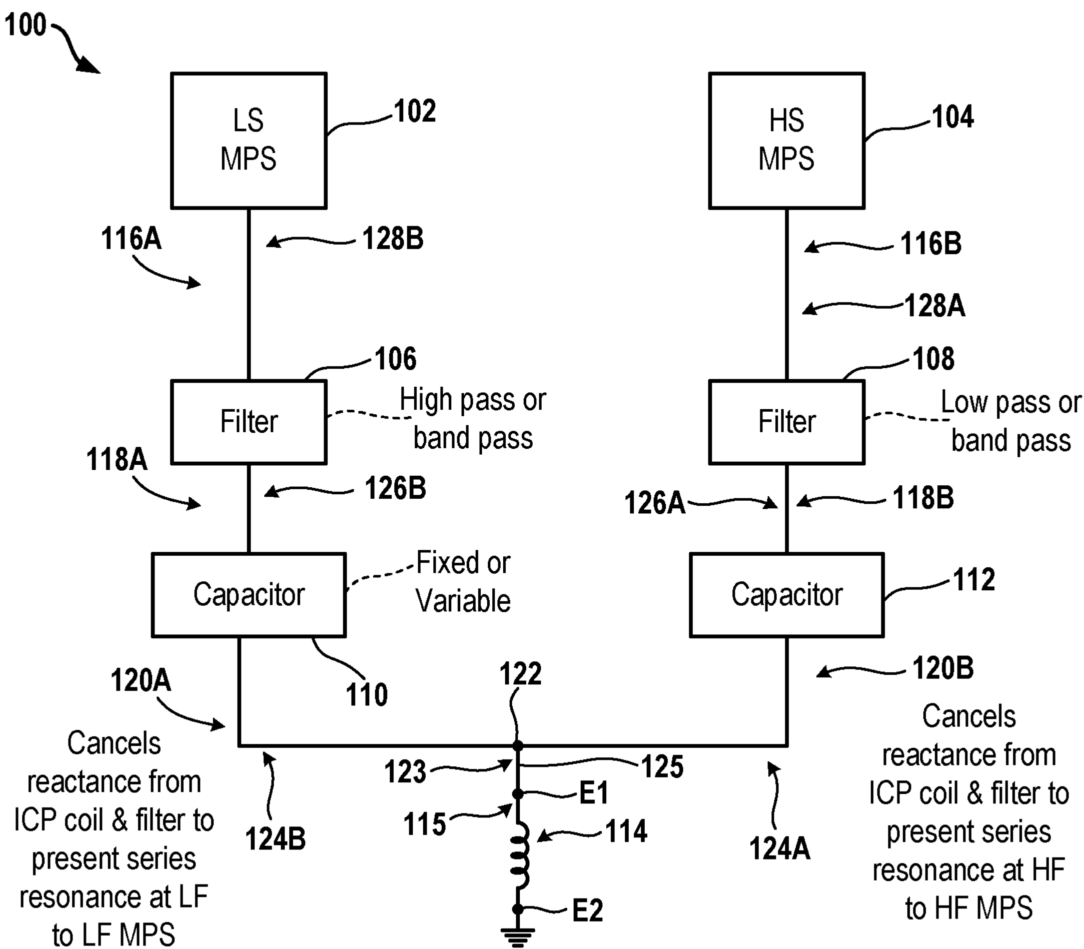
FIG. 1 (Dual Frequency MPS)
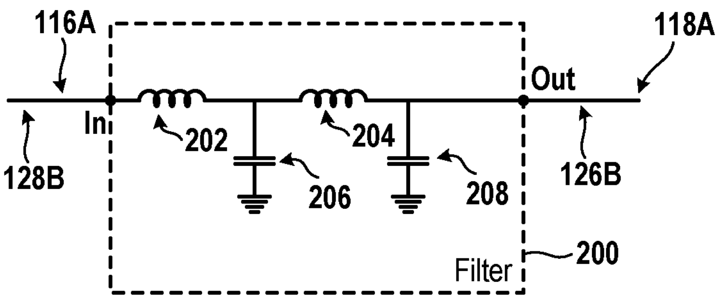
FIG. 2A (Low-pass Filter)

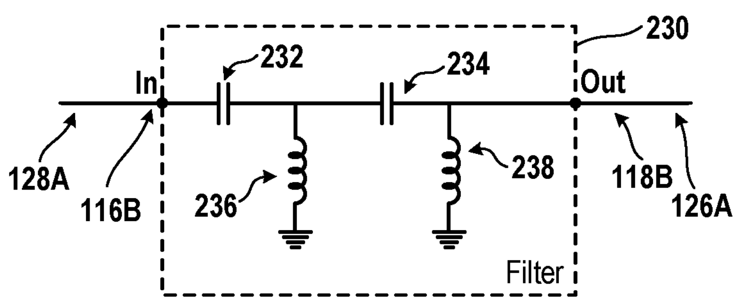
FIG. 2B (High-pass Filter)
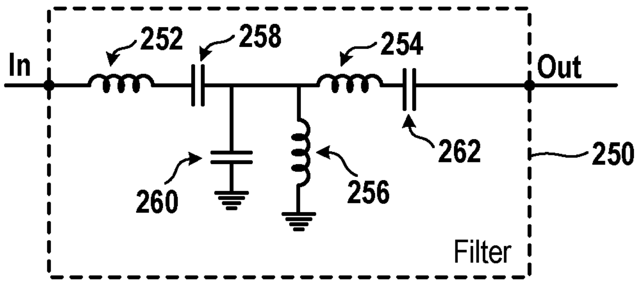
FIG. 2C (Band-pass)
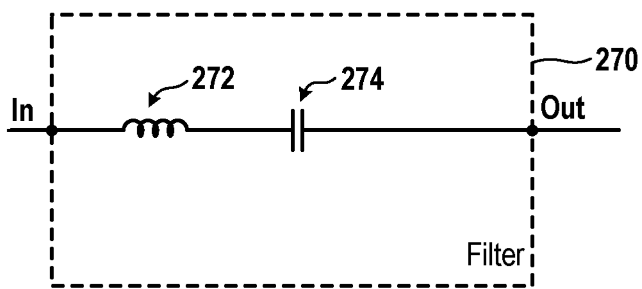
FIG. 2D (Band-pass Filter)

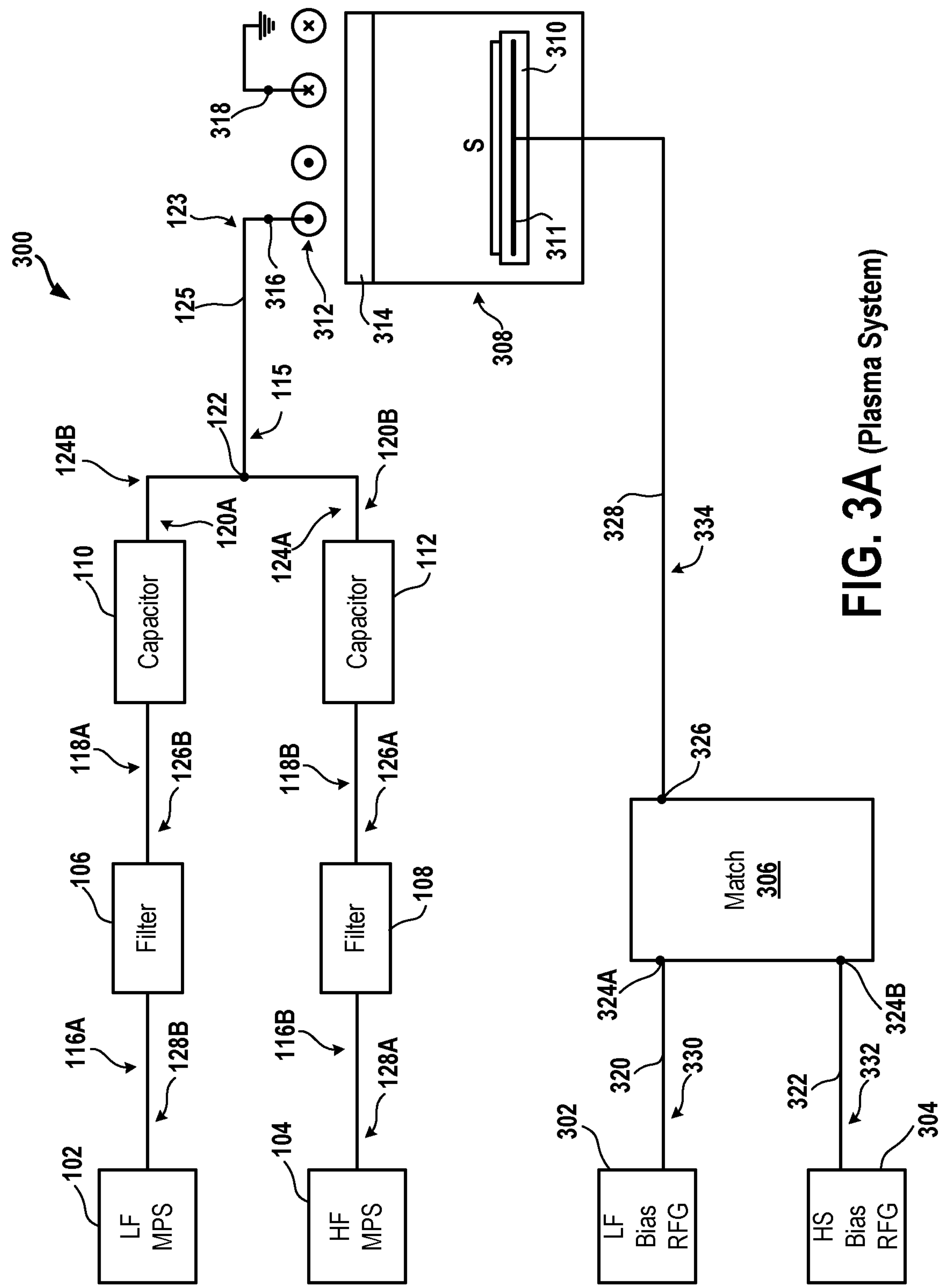
FIG. 3A (Plasma System)

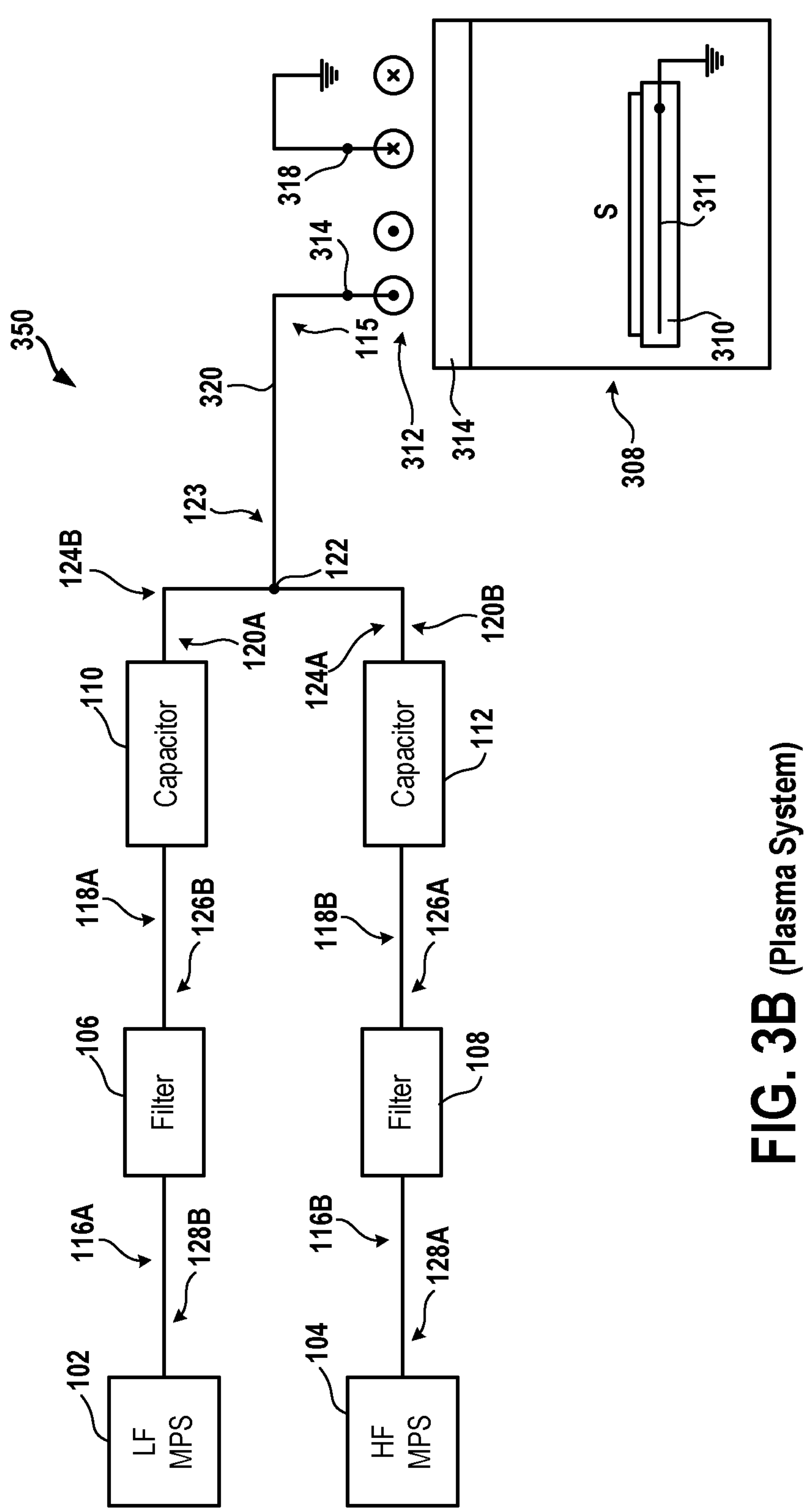
FIG. 3B (Plasma System)

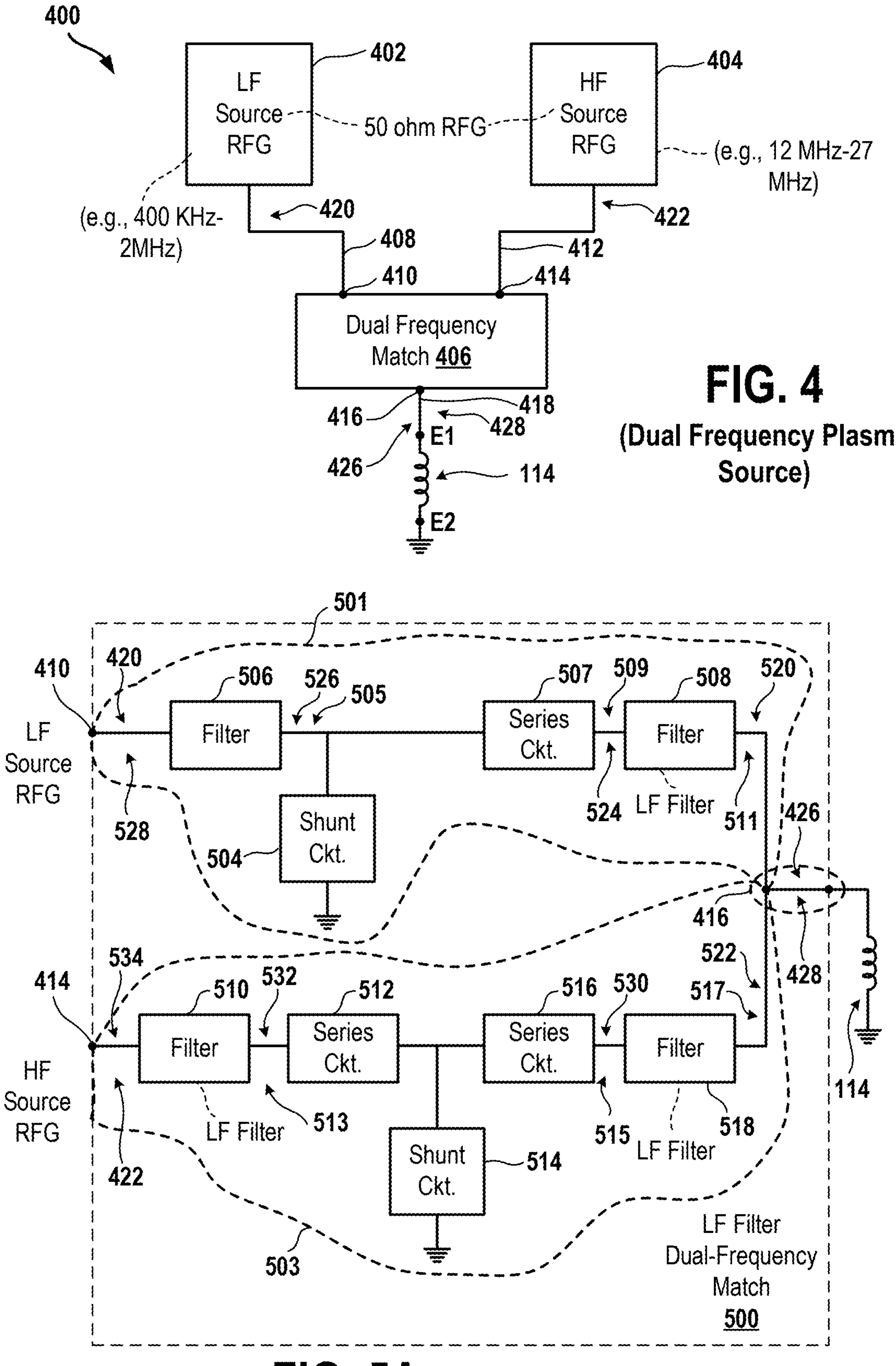
FIG. 4 (Dual Frequency Plasma Source)
FIG. 5A (Dual-Frequency IMN)

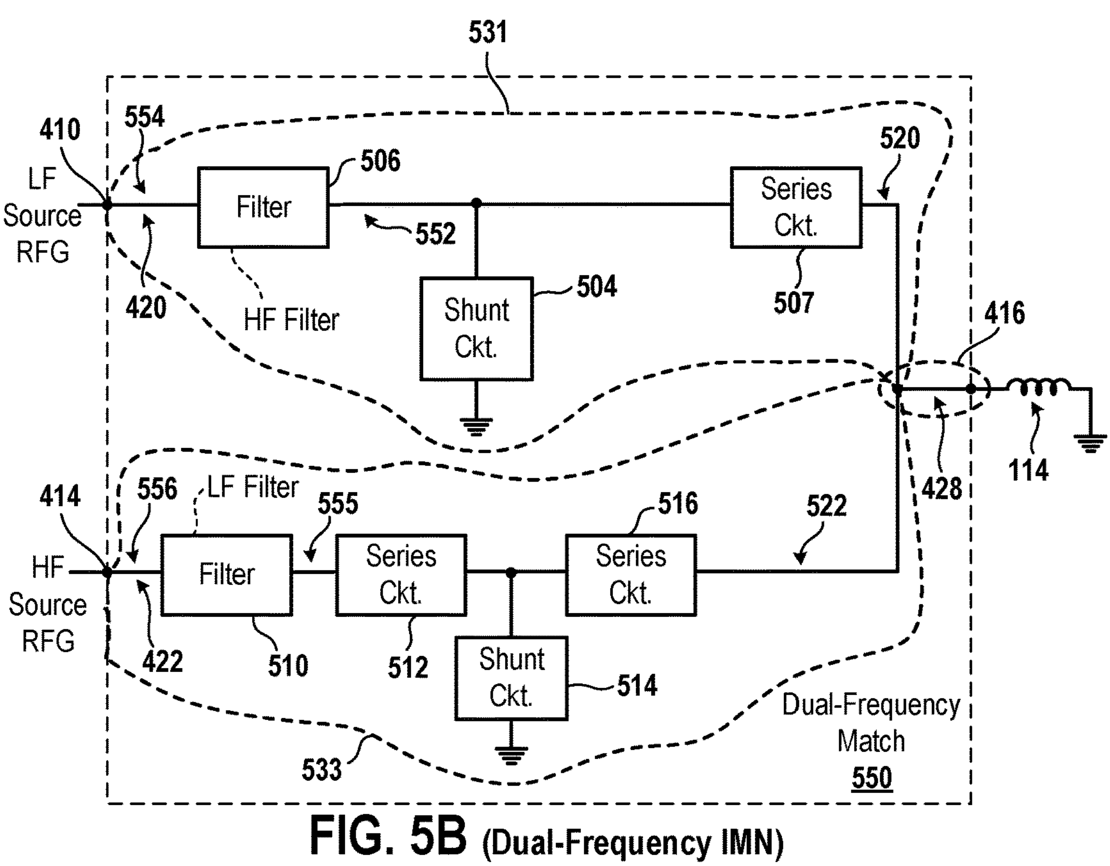
FIG. 5B (Dual-Frequency IMN)
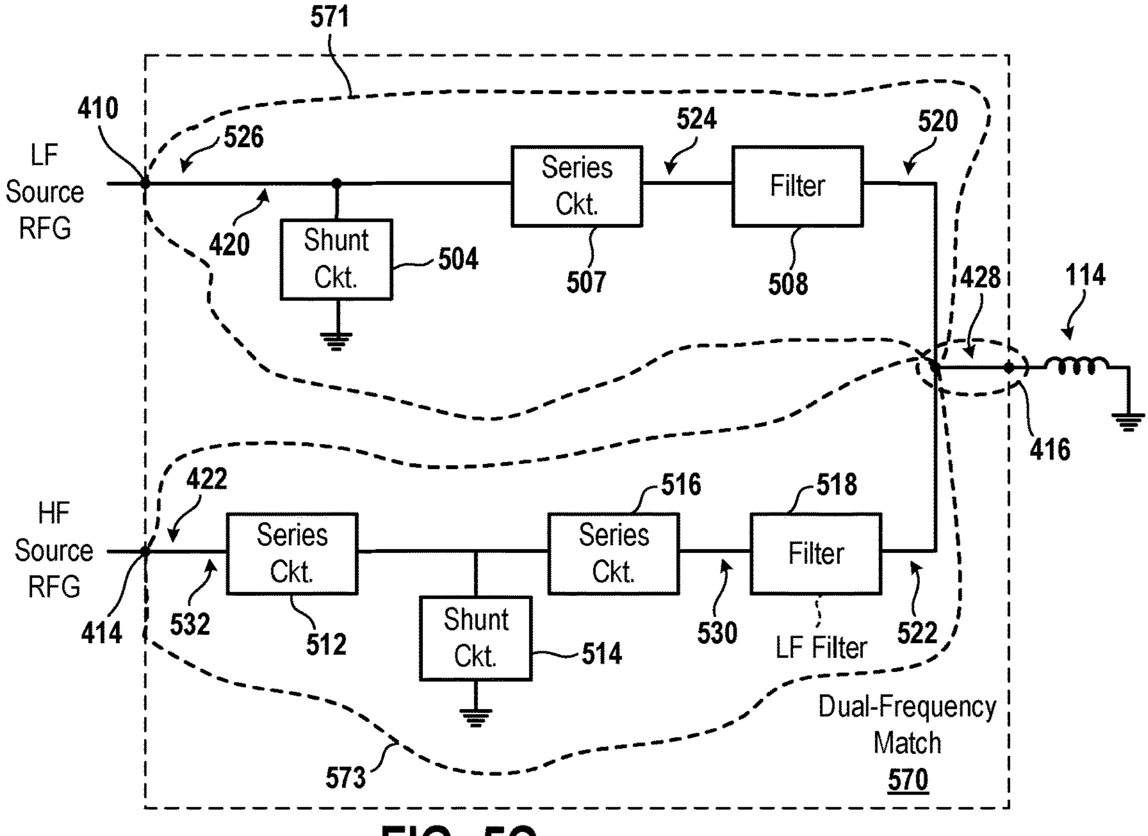
FIG. 5C (Dual-Frequency IMN)

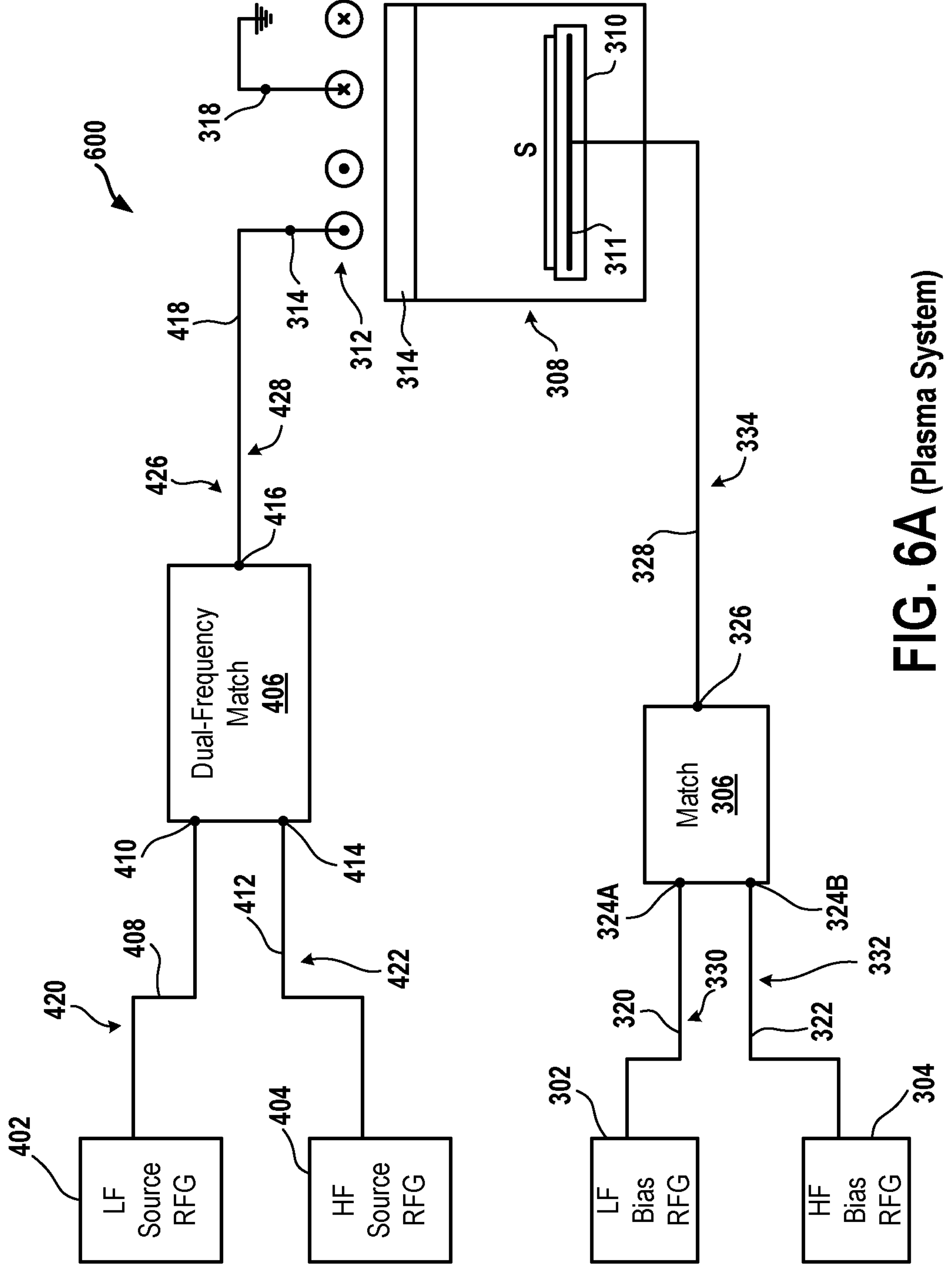
FIG. 6A (Plasma System)

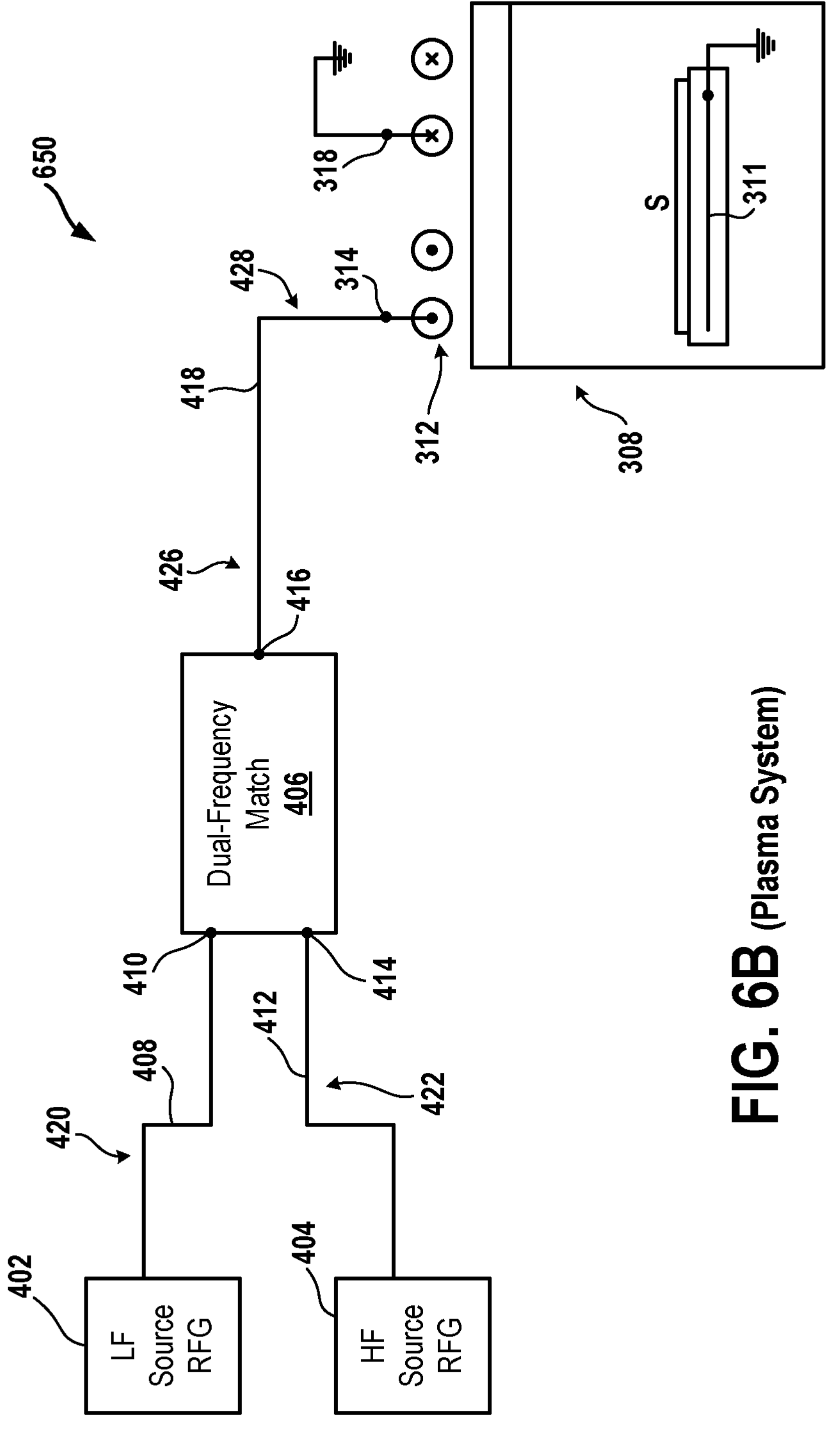
FIG. 6B (Plasma System)

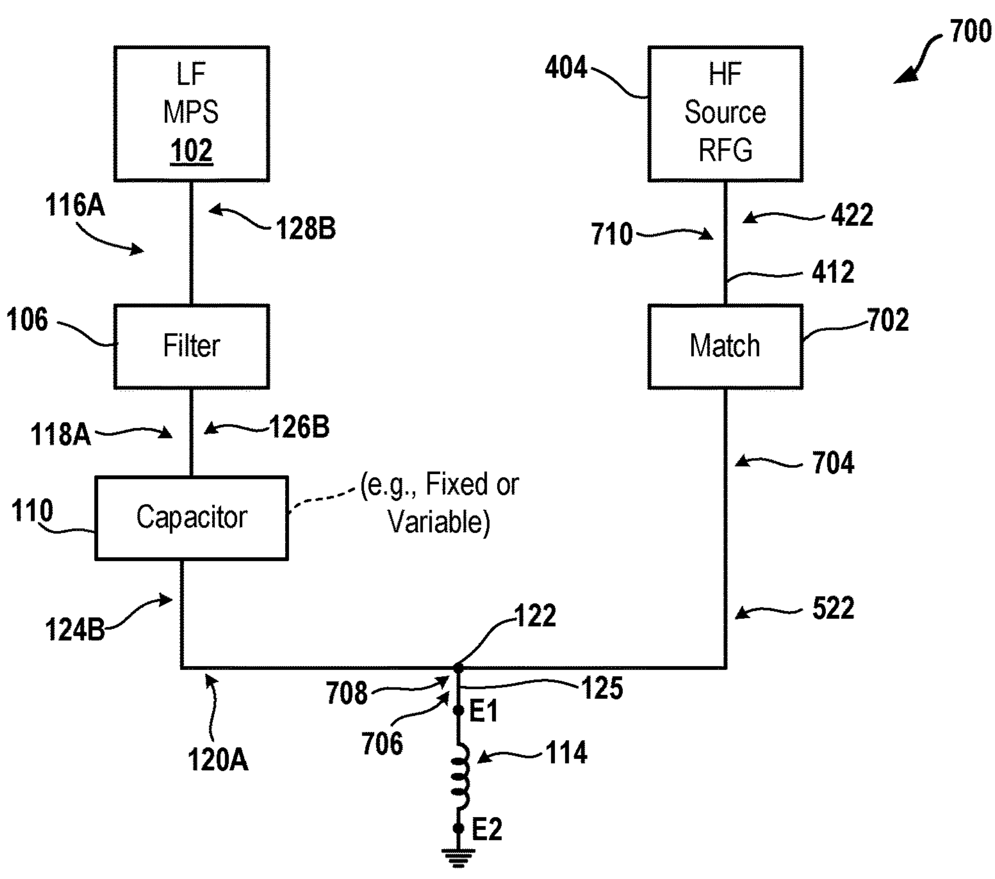
FIG. 7A (MPS & RFG)
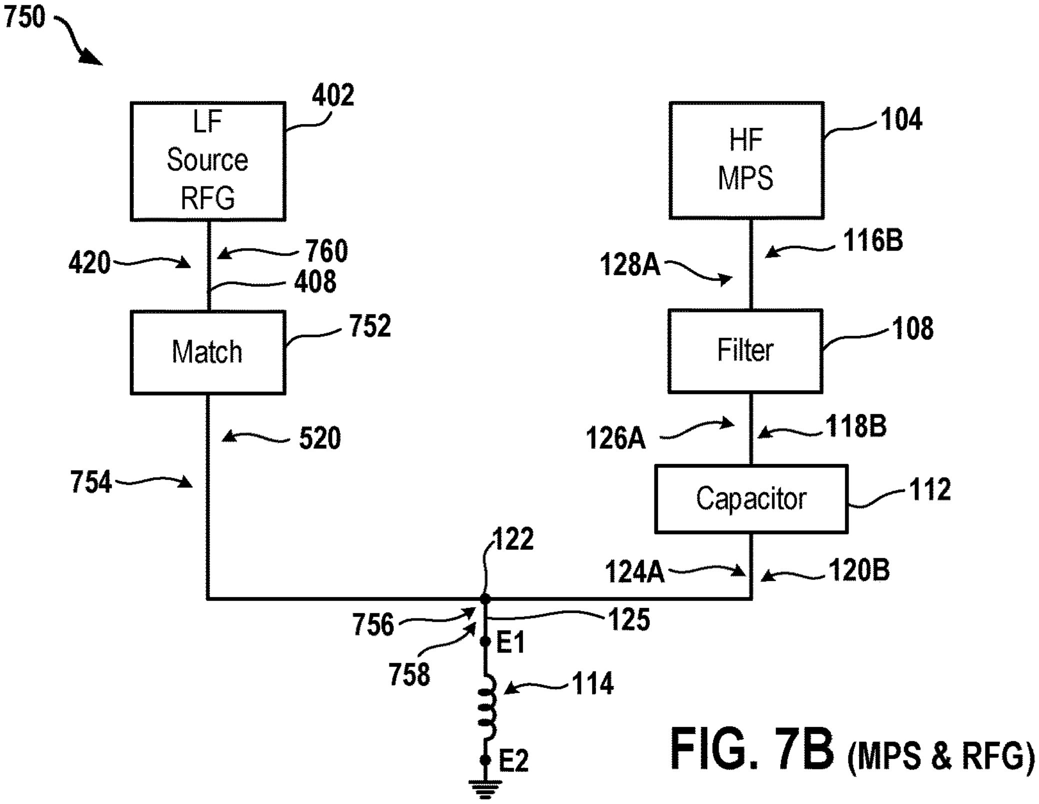
FIG. 7B (MPS & RFG)

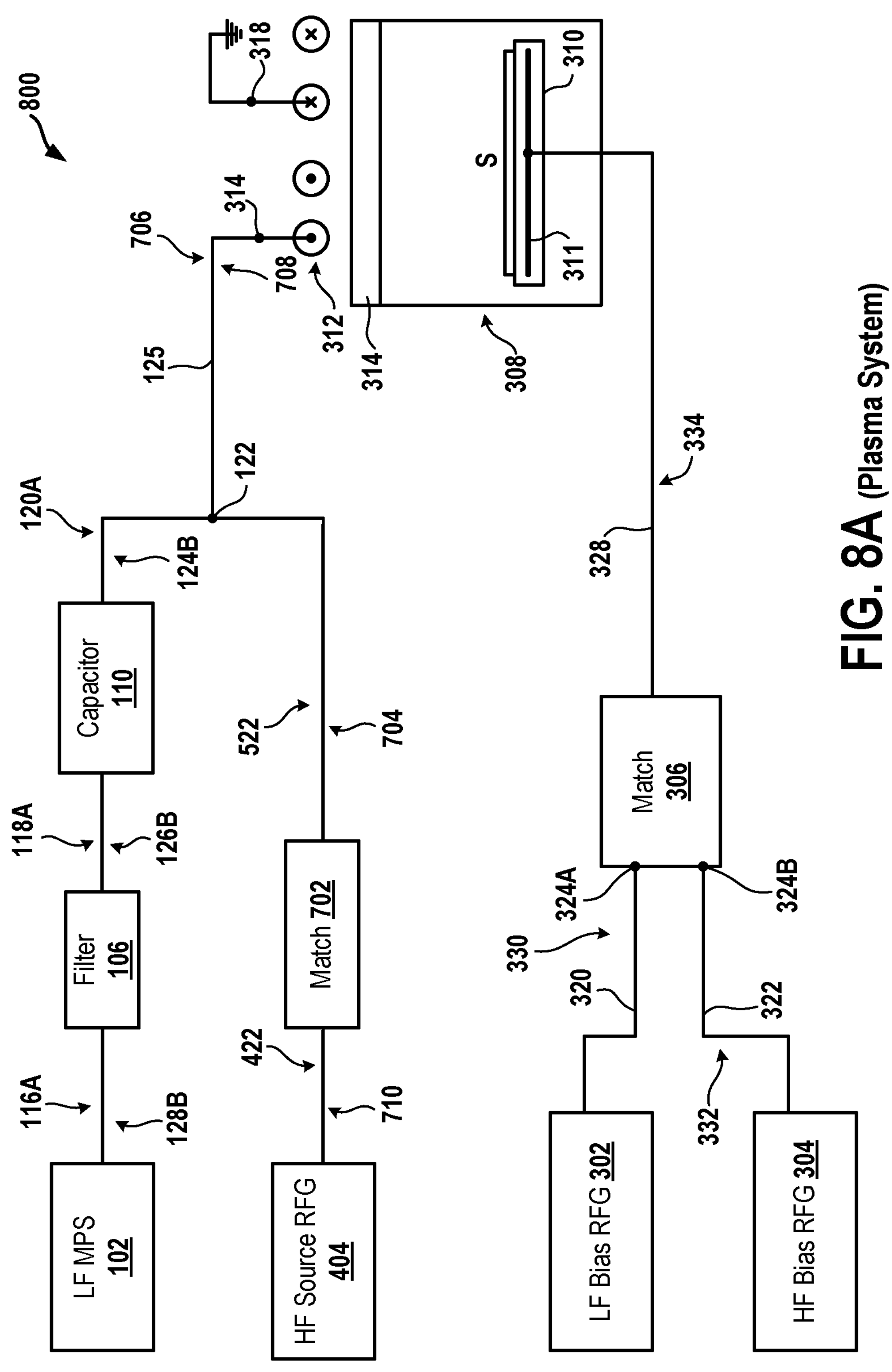
FIG. 8A (Plasma System)

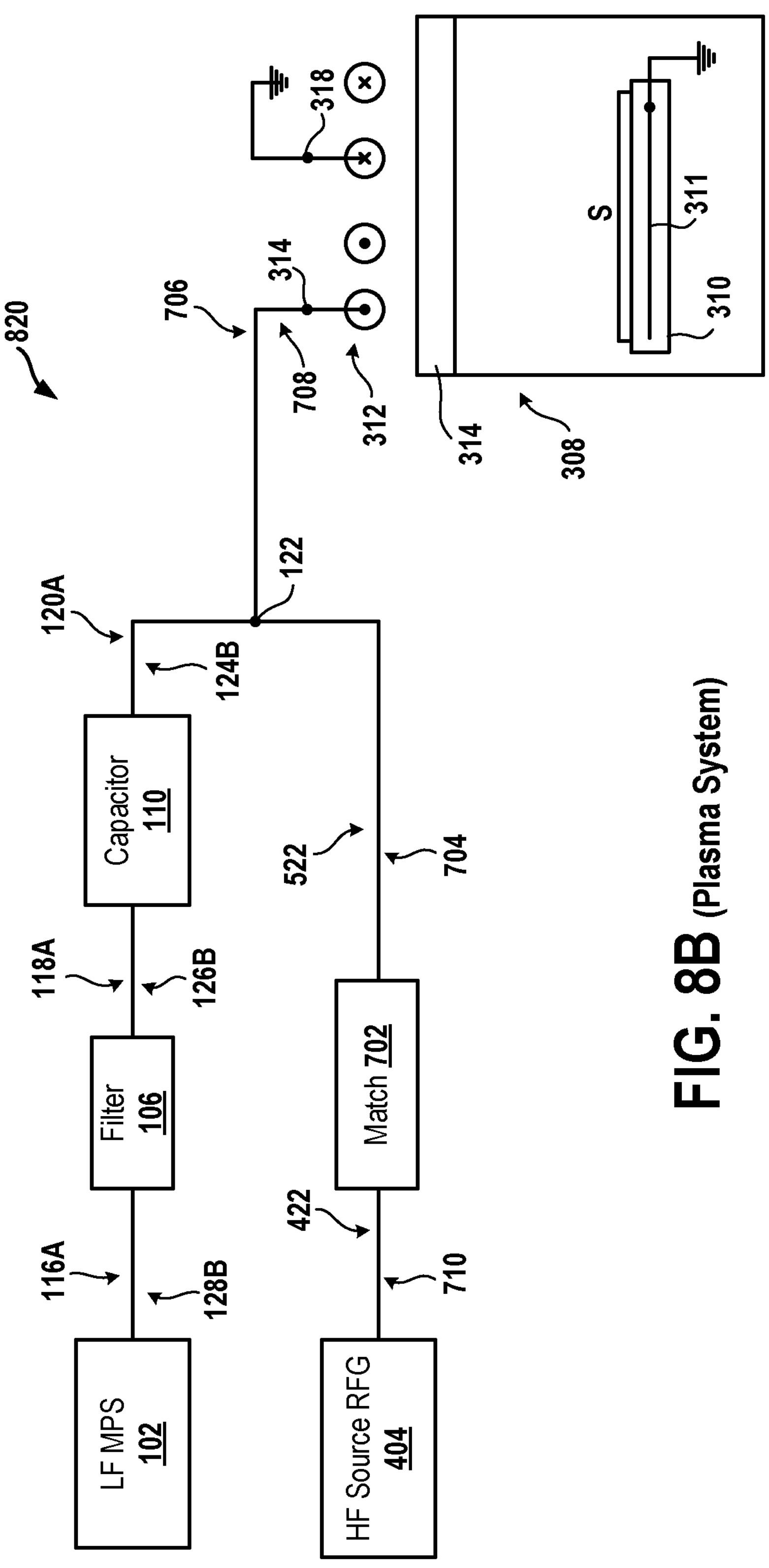
FIG. 8B (Plasma System)

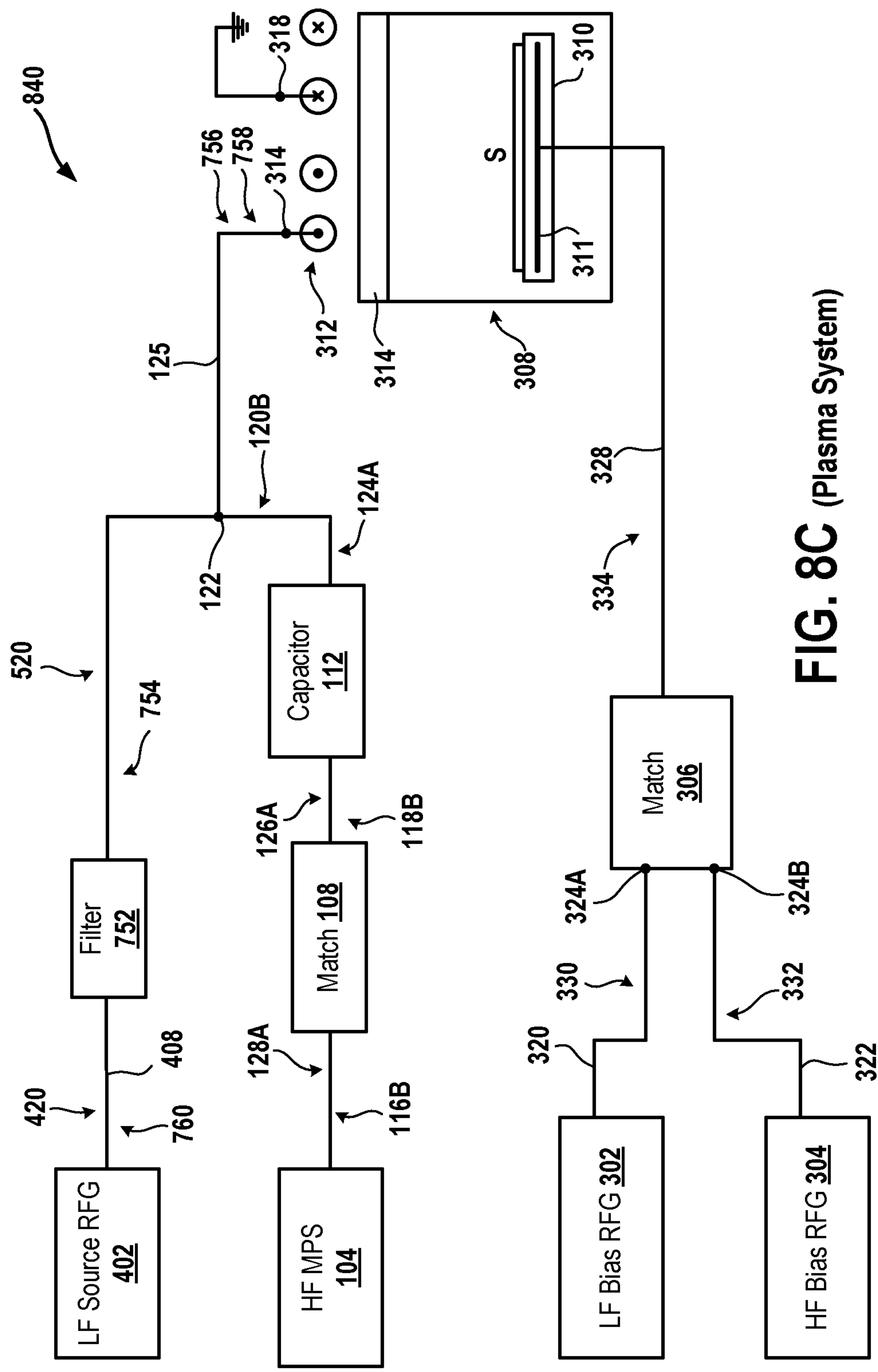
FIG. 8C (Plasma System)

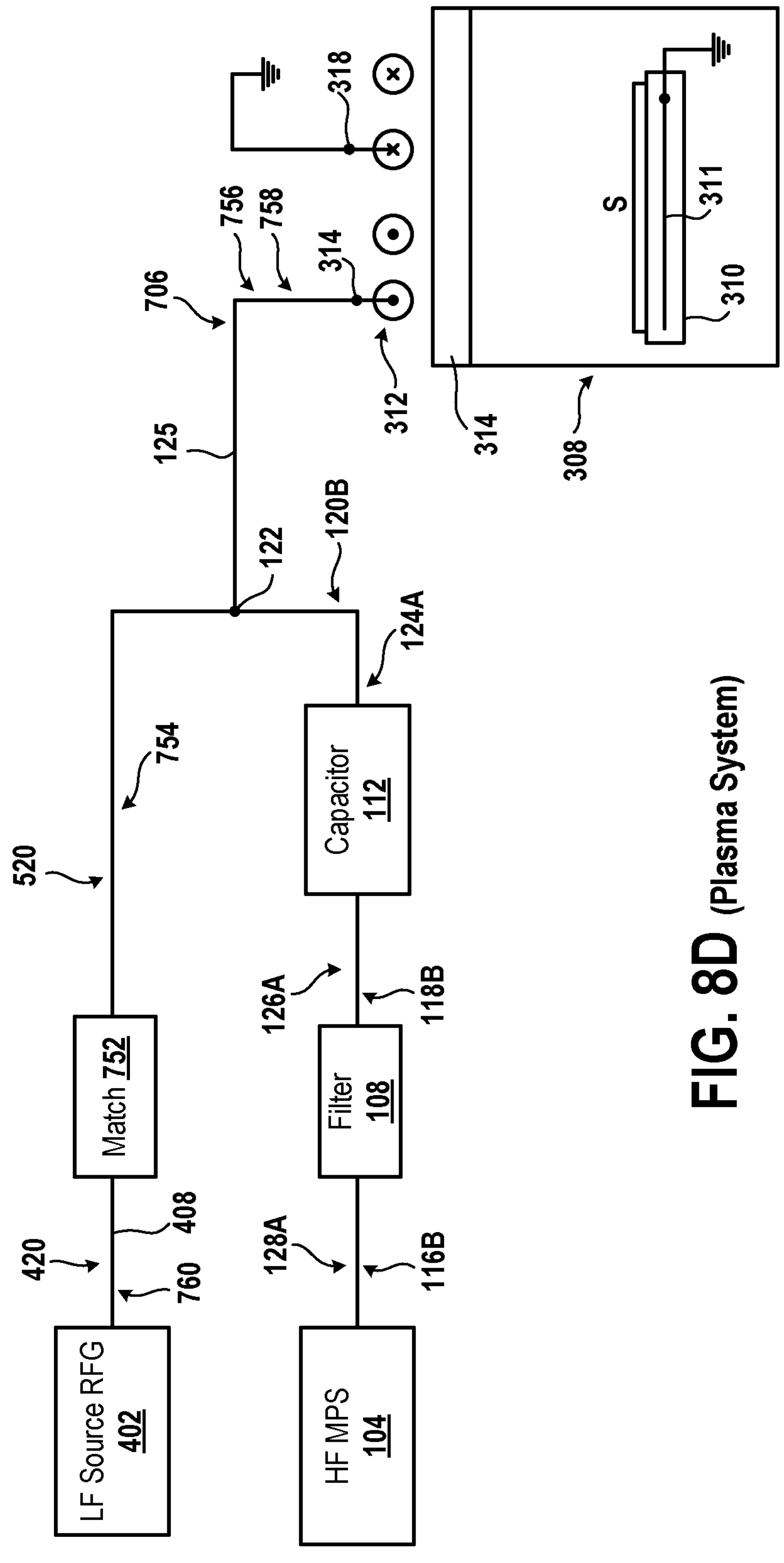
FIG. 8D (Plasma System)

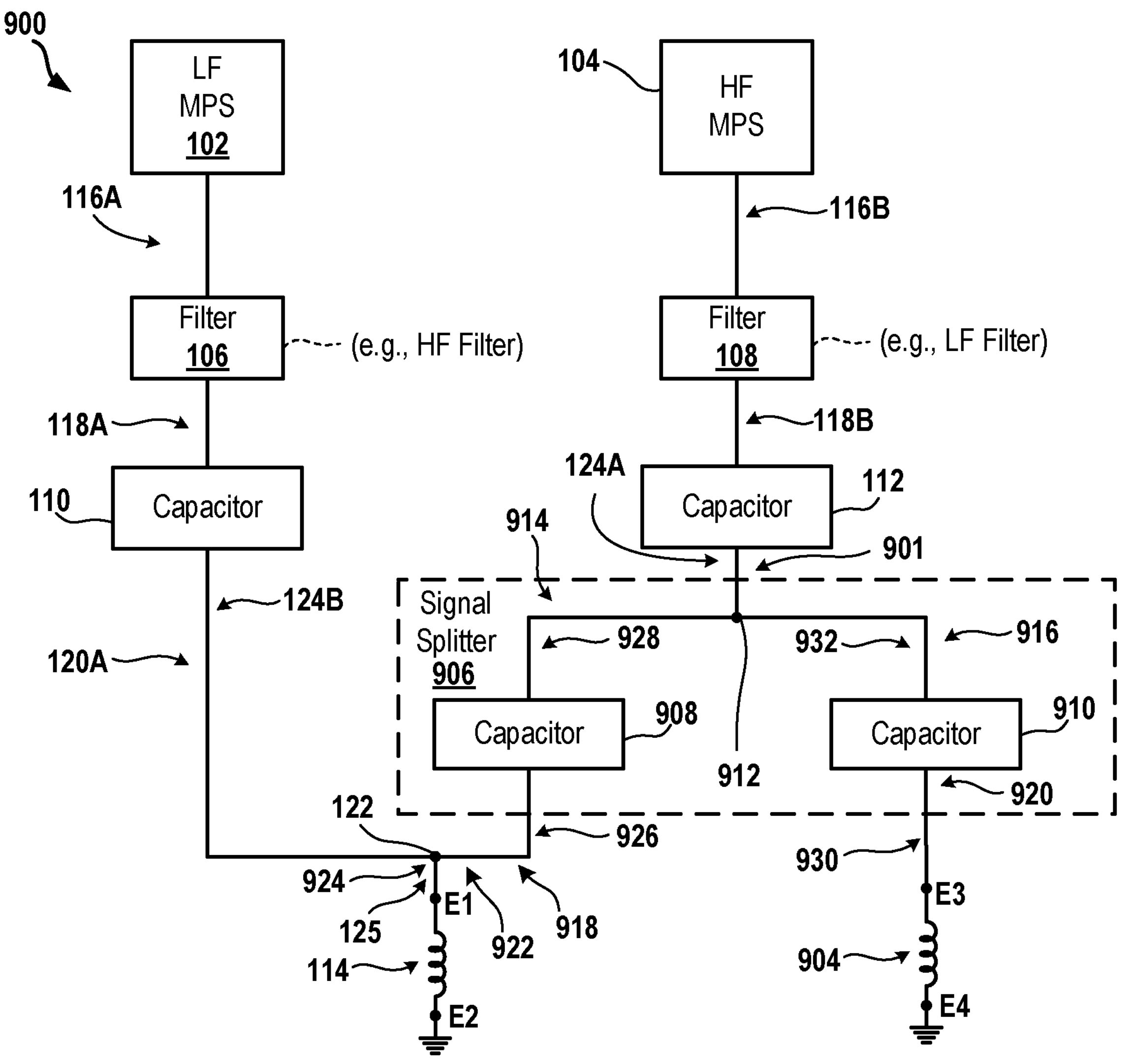
FIG. 9A (Dual Frequency MPS w. Signal Splitter)

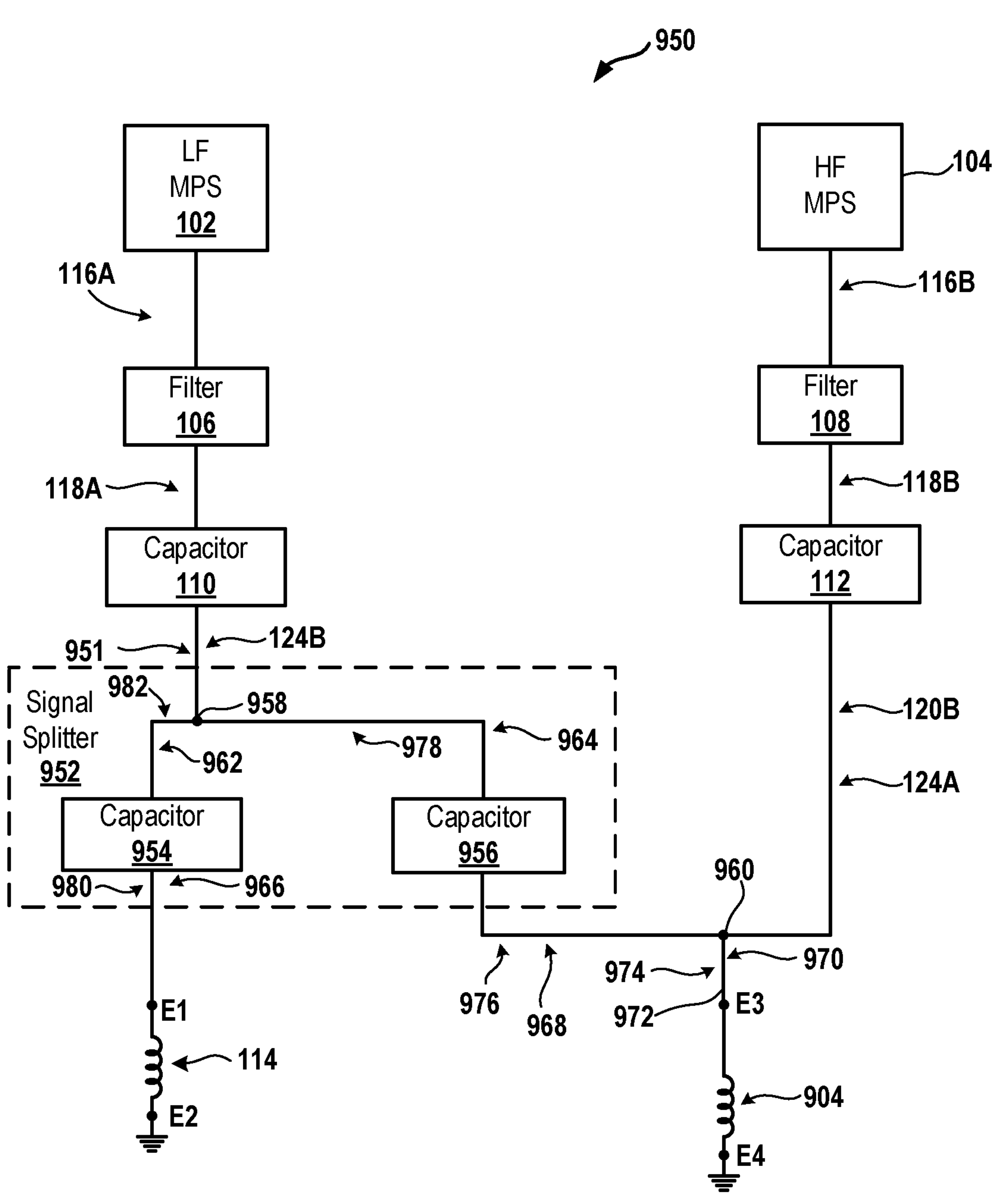
FIG. 9B (Dual Frequency MPS w. Signal Splitter)

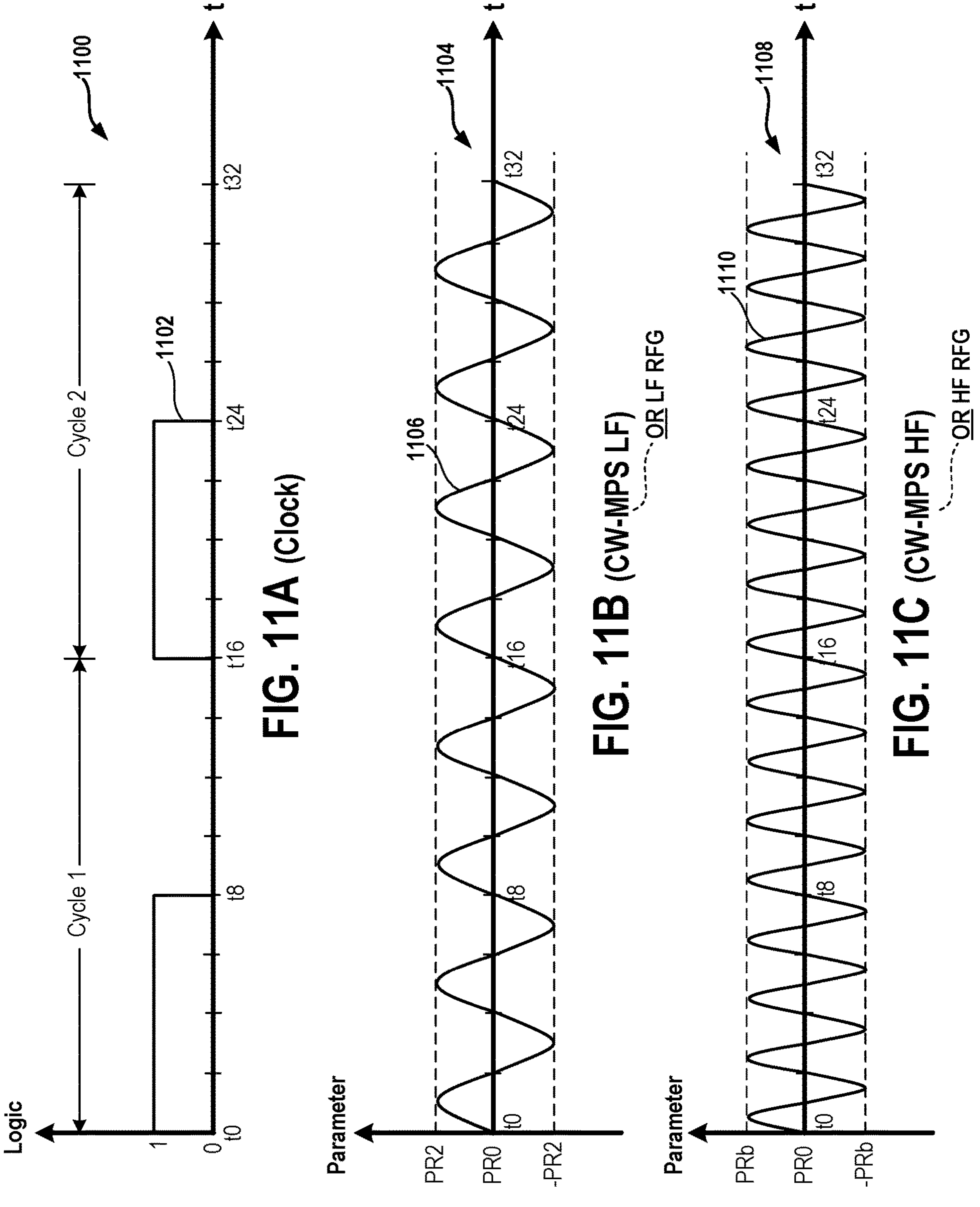
FIG. 11A (Clock)
FIG. 11B (CW-MPS LF)
FIG. 11C (CW-MPS HF)

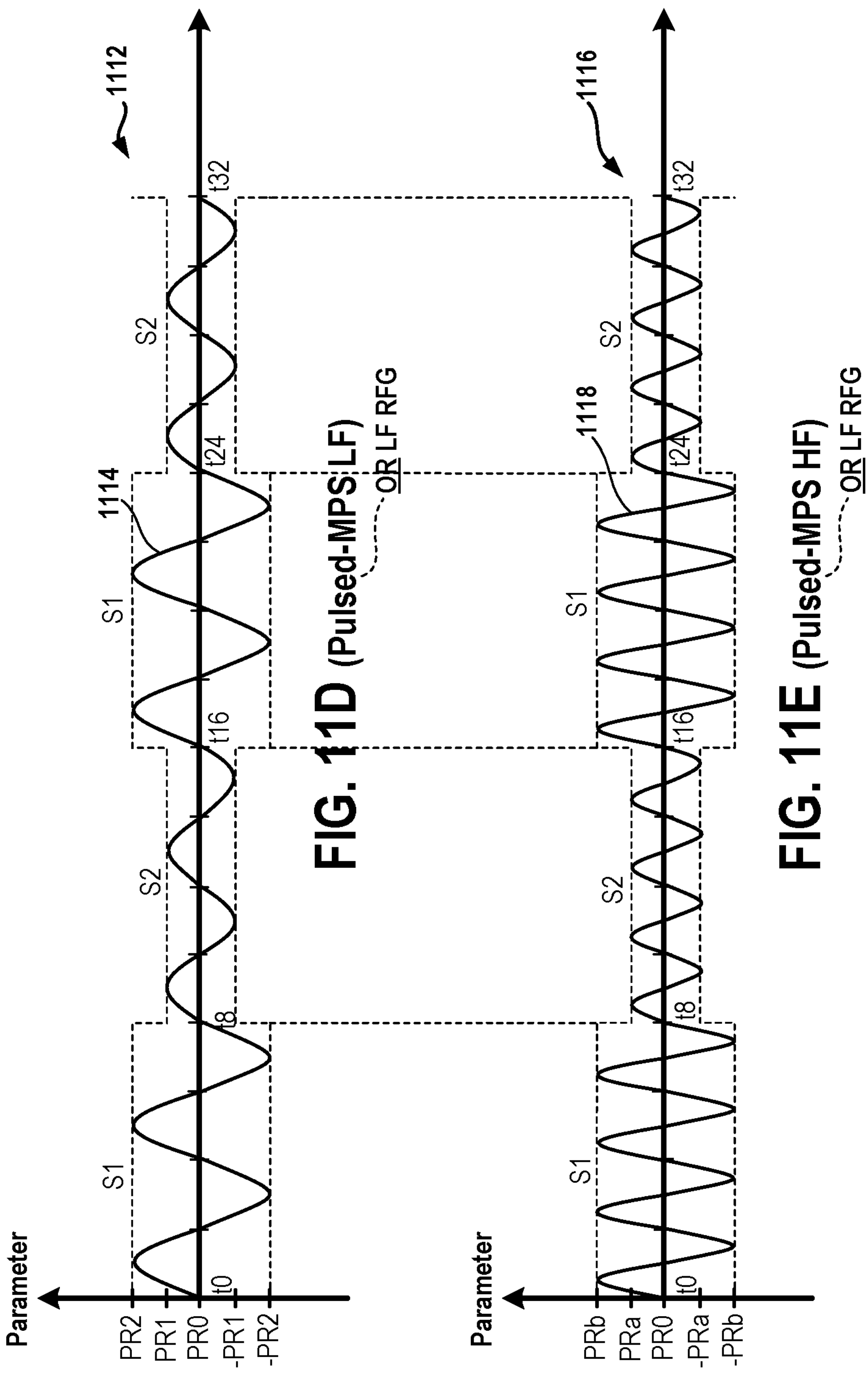
Parameter
PR2
PR1
PR0
-PR1
-PR2
t0
t8
t16
t24
t32
t
S1
S2
1112
1114
FIG. 11D (Pulsed-MPS LF)
OR LF RFG
Parameter
PRb
PRa
PR0
-PRa
-PRb
1116
1118
FIG. 11E (Pulsed-MPS HF)

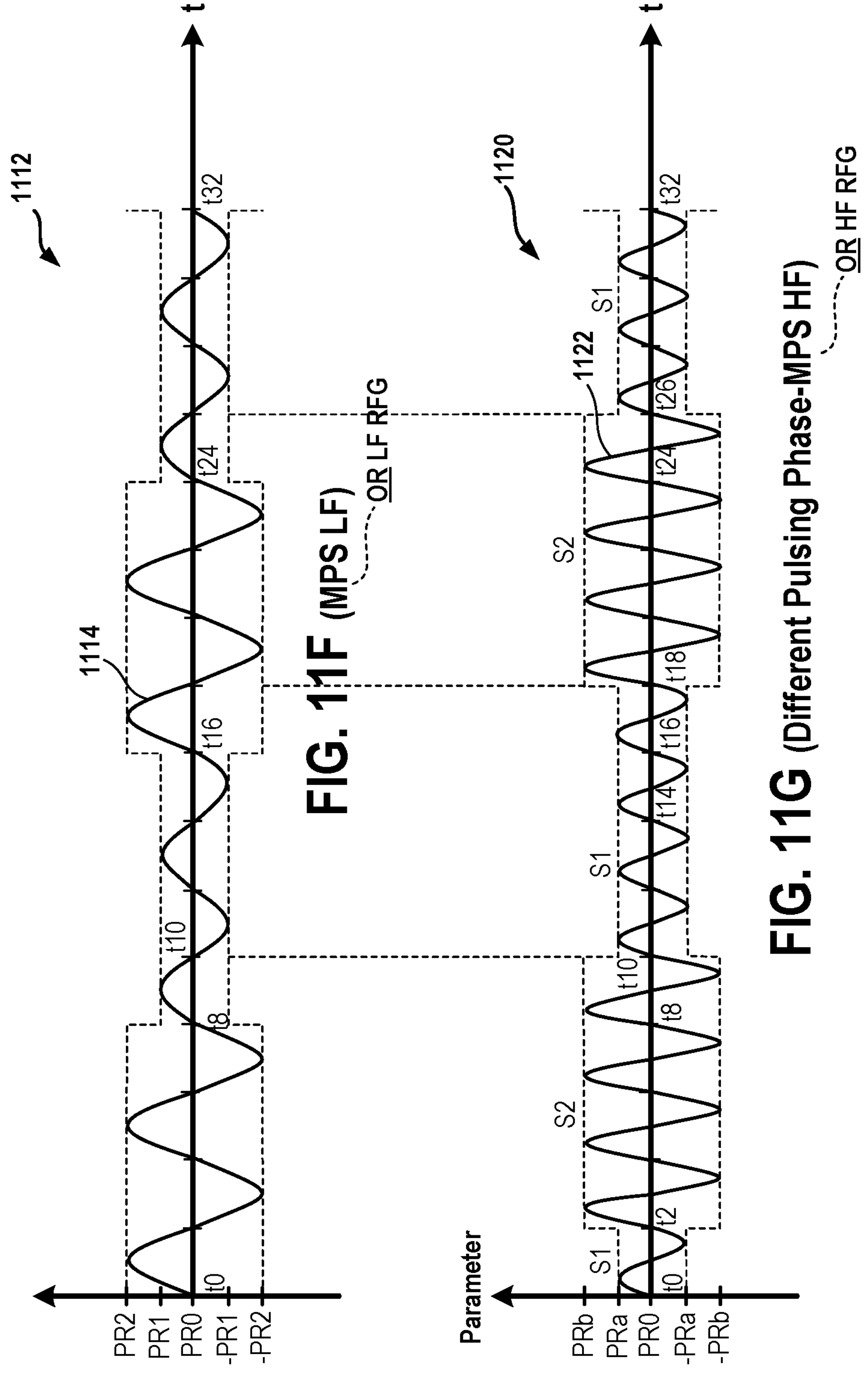
FIG. 11F (MPS LF)
FIG. 11G (Different Pulsing Phase-MPS HF)

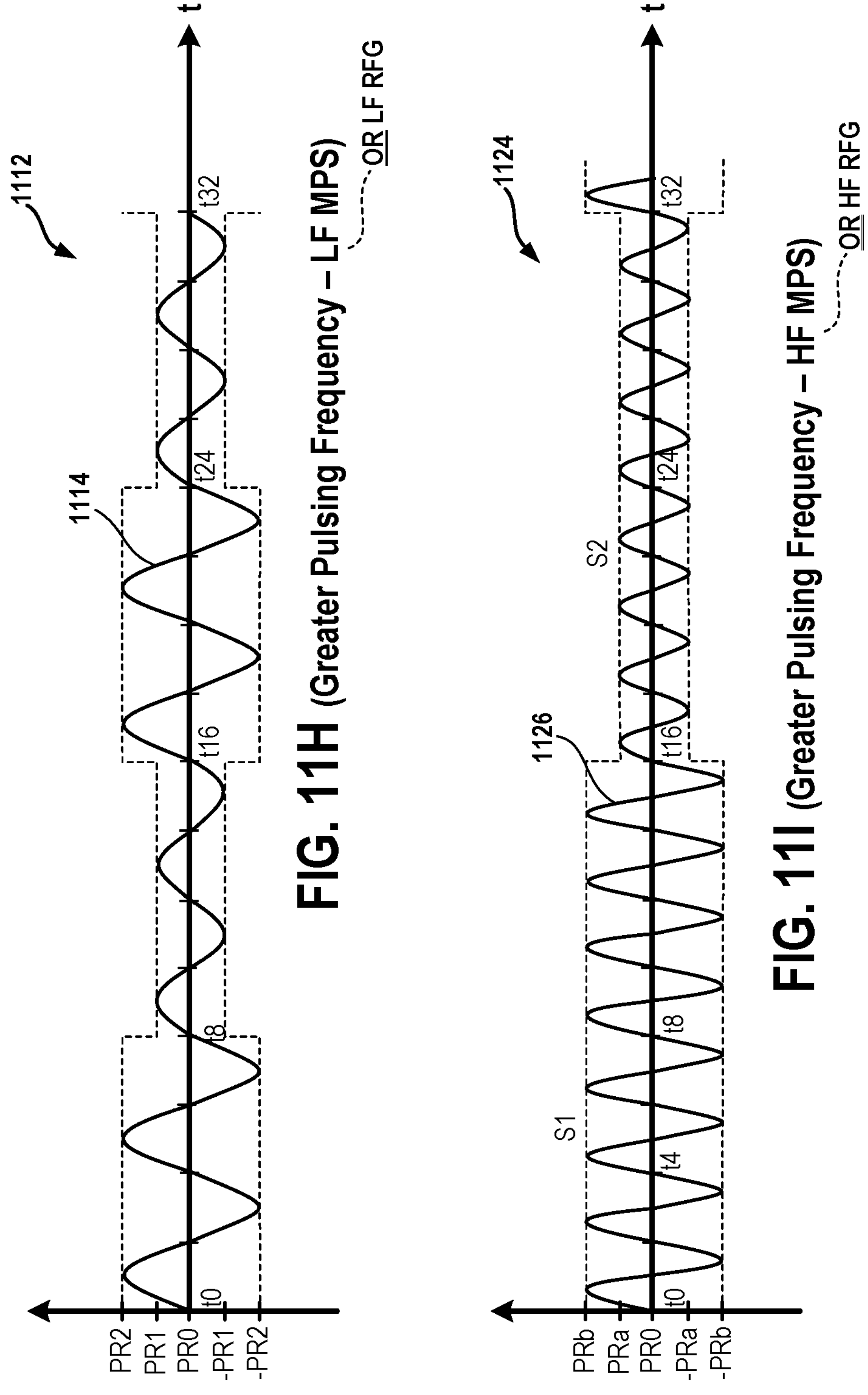
FIG. 11H (Greater Pulsing Frequency – LF MPS)
FIG. 11I (Greater Pulsing Frequency – HF MPS)

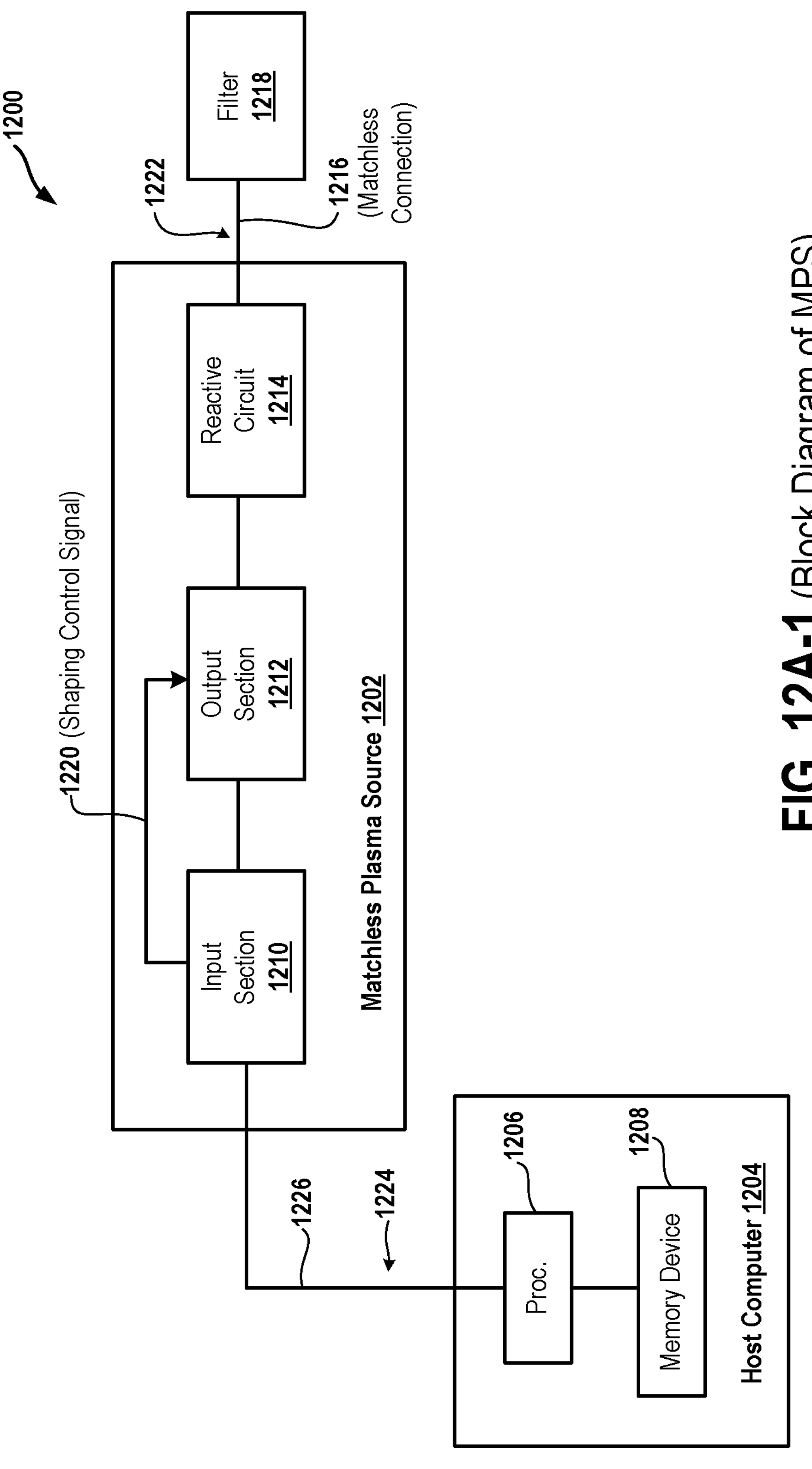
FIG. 12A-1 (Block Diagram of MPS)

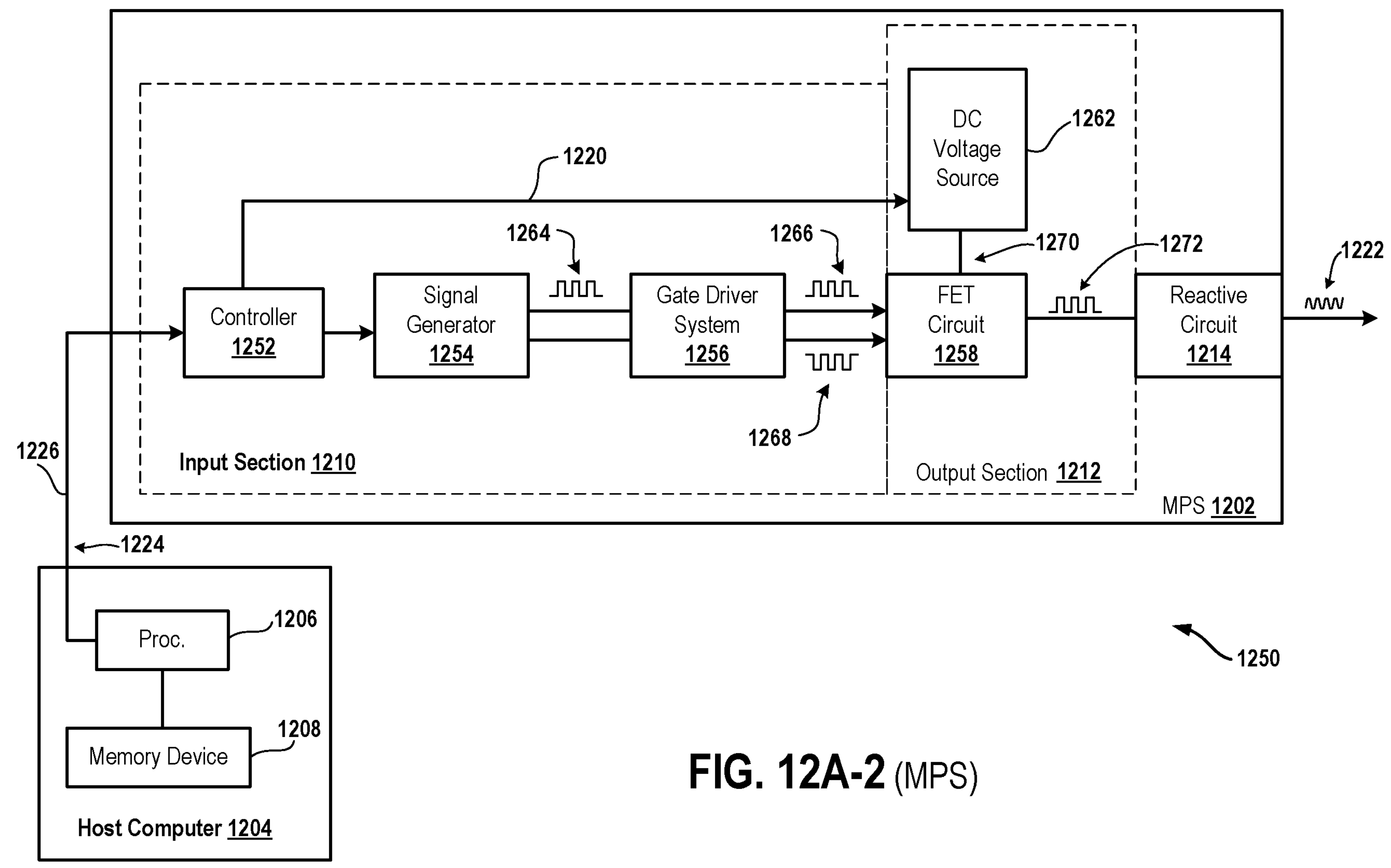
FIG. 12A-2 (MPS)

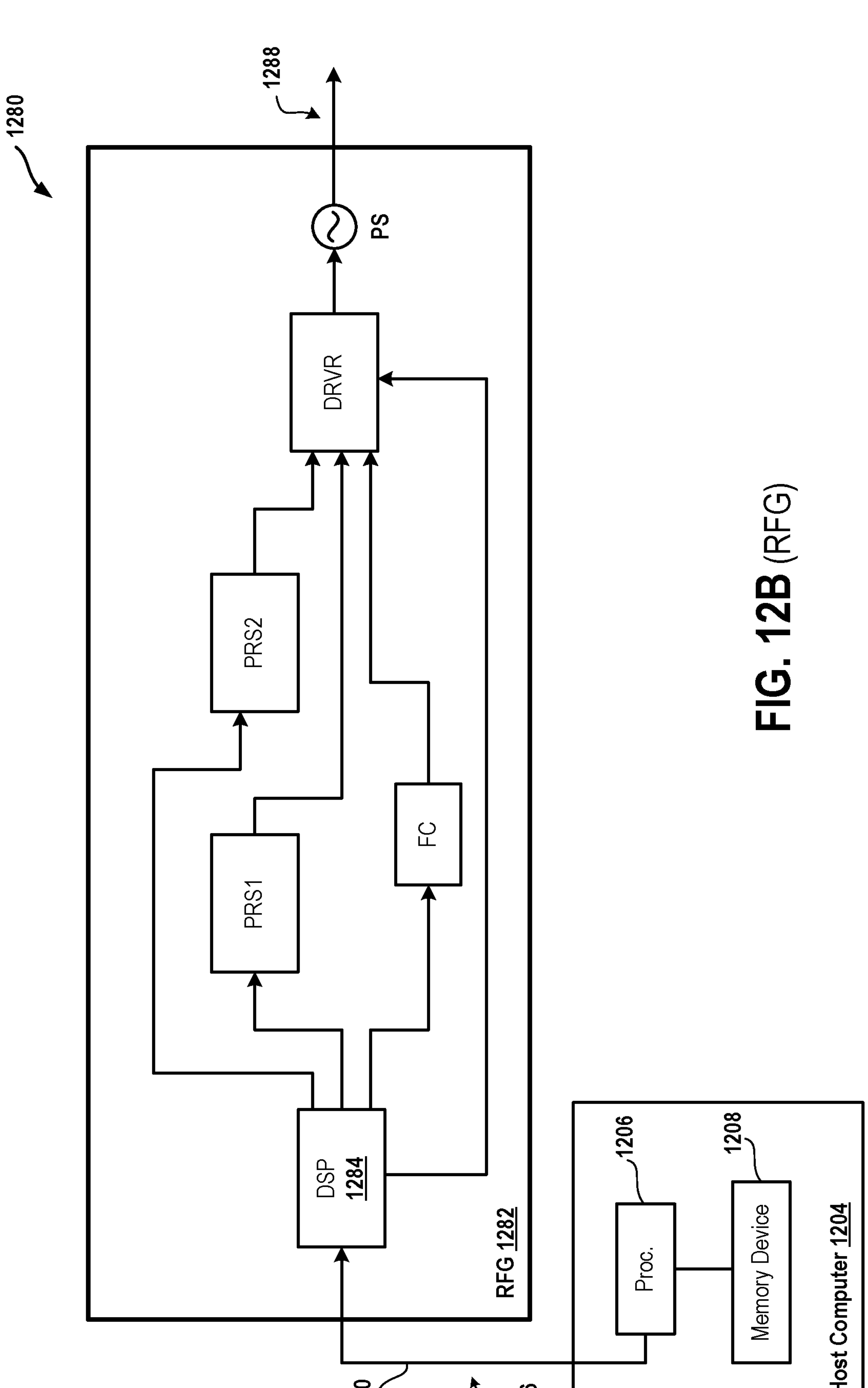
FIG. 12B (RFG)

1300

1306

Motor 1304

Driver 1302

Processor 1206

1208

Memory Device

Host Computer 1204

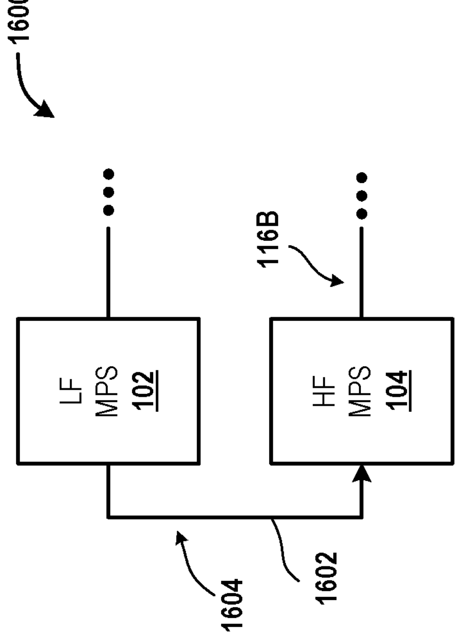
FIG. 16A (Master – Slave Configuration)
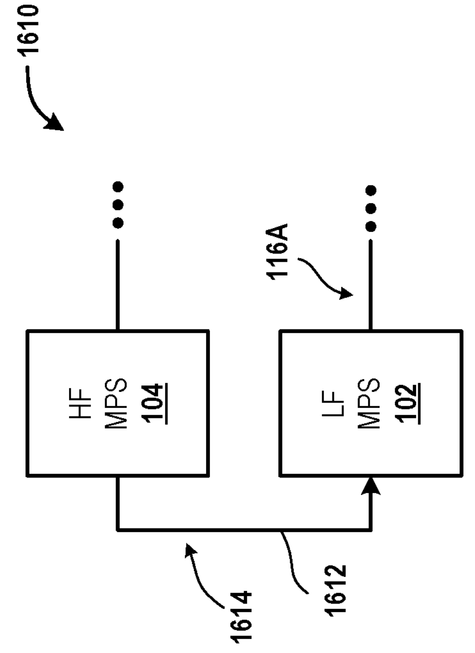
FIG. 16B (Master – Slave Configuration)
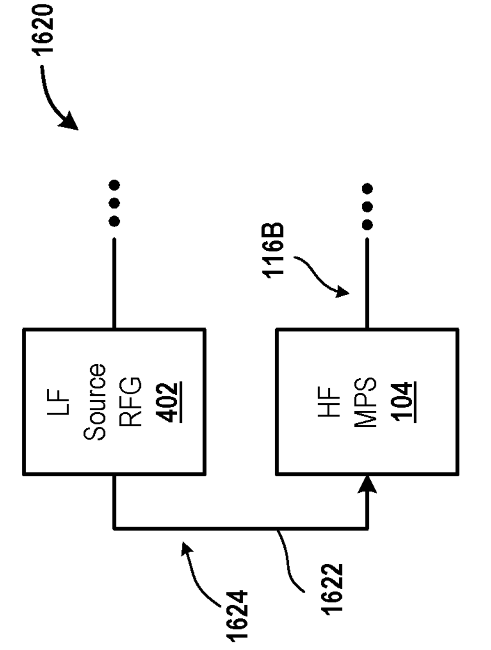
FIG. 16C (Master – Slave Configuration)
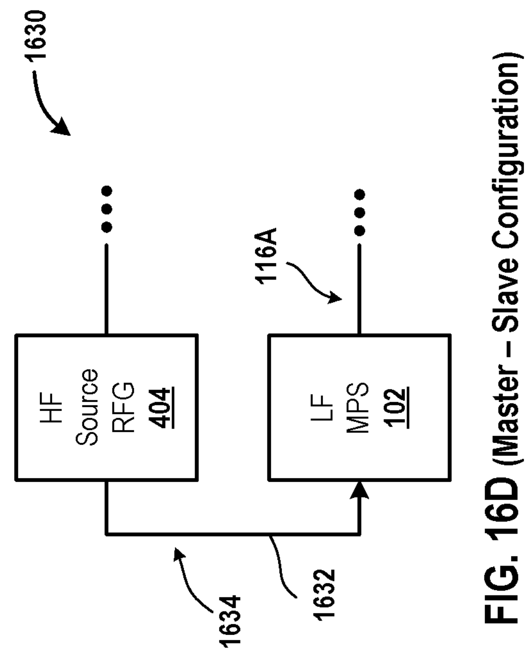
FIG. 16D (Master – Slave Configuration)

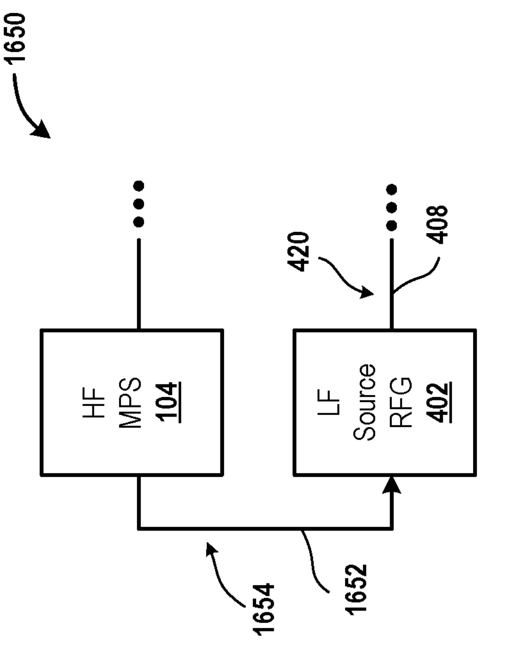
FIG. 16F (Master – Slave Configuration)
1640
LF
MPS
102
HF
Source
RFG
404
422
412
1644
1642
FIG. 16E (Master – Slave Configuration)

HYBRID FREQUENCY PLASMA SOURCE

CLAIM OF PRIORITY

This application is a national stage filing of and claims priority, under 35 U.S.C. § 371, to PCT/US2022/042271, filed on Aug. 31, 2022 and titled "HYBRID FREQUENCY PLASMA SOURCE", which claims the benefit of and priority, under 35 U.S.C. § 119 (e), to U.S. Provisional Patent Application No. 63,241,967, filed on Sep. 8, 2021, and titled "HYBRID FREQUENCY PLASMA SOURCE", all of which are incorporated by reference herein in their entirety.

FIELD

The present embodiments relate to a hybrid frequency plasma source.

BACKGROUND

A plasma system is used to perform a variety of operations on wafers. The plasma system includes a radio frequency (RF) generator, an RF match, and a plasma chamber. The RF generator is coupled to the RF match via an RF cable and the RF match is coupled to the plasma chamber. An RF power is provided via the RF cable and the RF match to the plasma chamber in which a wafer is processed. Also, one or more gases are supplied to the plasma chamber and upon reception of the RF power, plasma is generated or maintained within the plasma chamber. When the RF power is provided, sometimes plasma is not stricken within the plasma chamber or arcing occurs within the plasma chamber.

It is in this context that embodiments described in the present disclosure arise.

SUMMARY

Embodiments of the disclosure provide systems, apparatus, methods and computer programs for providing a hybrid frequency plasma source. It should be appreciated that the present embodiments can be implemented in numerous ways, e.g., a process, or an apparatus, or a system, or a piece of hardware, or a method, or a computer-readable medium. Several embodiments are described below.

Each inductively coupled plasma (ICP) coil of a plasma chamber is driven by one radio frequency (RF) generator at one RF frequency at any instant. A choice of the RF frequency is limited by multiple factors. Coil voltage at the ICP coil increases with an increasing RF frequency, which can cause arcing on the ICP coil or sputtering on a dielectric window of the plasma chamber. The arcing or sputtering is caused by ions accelerated by capacitively coupled RF power from the coil. On the other hand, with lower radio frequencies, the coupling becomes less effective especially at lower plasma densities. It is also more difficult for the RF generator to breakdown neutral gas and strike plasma with a lower voltage at the ICP coil.

In one embodiment, a dual-frequency ICP source operating at two radio frequencies is presented. For example, two independent RF sources, such as RF generators or matchless plasma sources (MPSs), tuned at two significantly separated RF frequencies are used to simultaneously power the ICP coil through a single feed. To illustrate, two MPSs, such as a low frequency MPS and a high frequency MPS, are used to drive the same ICP coil. The two MPSs operate at two separated frequencies, a low frequency and a high frequency. As an example, the low frequency is in a range of 1.8 megahertz (MHz) to 2.2 MHz and the high frequency is in the range of 12.35 MHz and 13.65 MHz. As another example, the low frequency is in the range of 400 kilohertz (kHz) to 2 MHz and the high frequency is in the range of 12 MHz to 27 MHz. A corresponding output of each of the MPSs is attached to a filter circuit for isolation. Also, each filter circuit is coupled to a corresponding capacitor to cancel any remaining reactance from the ICP coil and the filter circuit, such that series resonances at the low and high frequencies are presented to the low frequency MPS and the high frequency MPS respectively. Each capacitor can be either a fixed value or a variable value capacitor. For example, a network between each of the MPSs and ICP coil includes fixed elements, such as fixed capacitors and fixed inductors, without including any variable elements, so that active control of the network is not needed during operation.

In an embodiment, a low pass filter and a high pass filter can be coupled to an output of the low frequency MPS and the high frequency MPS respectively.

In one embodiment, a band pass filter can be coupled to an output of any of the two MPSs. For example, a series resonance circuit including a series circuit of a capacitor and an inductor can be used as the band pass filter to provide adequate isolation from the low frequency or the high frequency, In an embodiment, a first band pass filter is coupled to an output of the low frequency MPS and a second band pass filter is coupled to an output of the high frequency MPS.

In an embodiment, two 50-ohm RF generators operate at separate RF frequencies to power the same ICP coil. The two RF generators employed are capable of outputting tuned RF in a low frequency band from 400 kHz to 2 MHz and in a high frequency band from 12 MHz to 27 MHz respectively. The two RF generators provide input to a dual-frequency impedance matching network, which transforms an impedance of the ICP coil at its output port to 50 ohms to present to the two RF generators.

In one embodiment, the dual-frequency impedance matching network includes one or more isolation filter circuits. The dual-frequency impedance match network includes two sub-networks, one for a transfer of the low frequency and another one for a transfer of the high frequency. An isolation filter circuit can be placed either on an input side or an output side, or both the input and output sides, of each of the two sub-networks. Each of the two sub-networks transforms a load impedance to 50 ohms for each of a corresponding one of the low and high frequencies. For example, an isolation filter circuit is placed at the output side to minimize changes seen by one sub-network when varying circuit elements on the other sub-network. Examples of each sub-network include an L-type network and a T-type network.

In an embodiment, an MPS and a 50 ohm RF generator are used to power the same ICP coil. The MPS operates at a different frequency than the 50 ohm RF generator.

In one embodiment, the low and high frequencies are independent of each other, and therefore, various pulsing operations can be achieved. For example, one frequency can pulse while the other outputs a continuous wave (cw). In another example, the low and high frequencies can both pulse at different pulsing frequencies and duty cycles.

In one embodiment, a current splitting circuit is provided for use with a dual-coil plasma system, such as one having two transformer coupled plasma (TCP) coils. The current splitting circuit is added to an output of a first MPS of one frequency, such as the low frequency or the high frequency, so that the same MPS is driving both the TCP coils. In this embodiment, a second MPS can be added to a first one of the TCP coils. Additional filters can be added such that the frequency of the second MPS is blocked to a second one of the TCP coils.

In one embodiment, a hybrid frequency plasma system is provided. The hybrid frequency plasma system includes a first matchless plasma source that generates a first sinusoidal waveform. The first sinusoidal waveform is generated based on a first square waveform and has a first frequency. The hybrid frequency plasma system includes a first filter coupled to the first matchless plasma source. The first filter filters a second frequency from interfering with the first sinusoidal waveform. The hybrid frequency plasma system further includes a first capacitive circuit coupled to the first filter. The first capacitive circuit balances a reactance of the first filter with a reactance of an RF coil of a plasma chamber to output a first RF signal. The first capacitive circuit provides the first RF signal to a point that is coupled to the RF coil. The hybrid frequency plasma system includes a second matchless plasma source that generates a second sinusoidal waveform. The second sinusoidal waveform is generated based on a second square waveform and has the second frequency. The hybrid frequency plasma system includes a second filter coupled to the second matchless plasma source. The second filter filters the first frequency from interfering with the second sinusoidal waveform. The hybrid frequency plasma system includes a second capacitive circuit coupled to the second filter. The second capacitive circuit balances a reactance of the second filter with the reactance of the RF coil to output a second RF signal. The second capacitive circuit provides the second RF signal to the point.

In an embodiment, a hybrid frequency plasma system is provided. The hybrid frequency plasma system includes a matchless plasma source that generates a sinusoidal waveform. The sinusoidal waveform is generated based on a square waveform and has a first frequency. The hybrid frequency plasma system further includes a first filter coupled to the matchless plasma source. The first filter filters a second frequency from interfering within the sinusoidal waveform. The hybrid frequency plasma system includes a capacitive circuit coupled to the first filter. The capacitive circuit balances a reactance of the first filter with a reactance of an RF coil of a plasma chamber to output a first RF signal. The capacitive circuit provides the first RF signal to a point coupled to the RF coil. The hybrid frequency plasma system includes a source RF generator that generates a second RF signal having the second frequency. The hybrid frequency plasma system includes an impedance matching network coupled to the source RF generator. The impedance matching network receives the second RF signal and modifies an impedance of the second RF signal to output a modified RF signal. The impedance matching network includes a second filter, which filters the first frequency from interfering with the second RF signal. The impedance matching network provides the modified RF signal to the point.

In an embodiment, a hybrid frequency plasma system is provided. The hybrid frequency plasma system includes a first matchless plasma source that generates a first sinusoidal waveform. The first sinusoidal waveform is generated based on a first square waveform and has a first frequency. The hybrid frequency plasma system further includes a first filter coupled to the first matchless plasma source. The first filter filters a second frequency from interfering with the first sinusoidal waveform. The hybrid frequency plasma system includes a first capacitive circuit coupled to the first filter. The first capacitive circuit balances a reactance of the first filter with a reactance of a first RF coil of a plasma chamber to output a first RF signal. The first capacitive circuit provides the first RF signal to a point. The hybrid frequency plasma system includes a second matchless plasma source that generates a second sinusoidal waveform. The second sinusoidal waveform is generated based on a second square waveform and has the second frequency. The hybrid frequency plasma system has a second filter coupled to the second matchless plasma source. The second filter filters the first frequency from interfering with the second sinusoidal waveform. The hybrid frequency plasma system includes a second capacitive circuit coupled to the second filter. The second capacitive circuit balances a reactance of the second filter with a reactance of the first RF coil and a reactance of a second RF coil of the plasma chamber to output a second RF signal. The hybrid frequency plasma system includes a signal splitter coupled to the second capacitive circuit. The signal splitter splits the second RF signal into a third RF signal and a fourth RF signal. Also, the signal splitter includes a third capacitive circuit and a fourth capacitive circuit. The third capacitive circuit receives the third RF signal and balances the reactance of the first RF coil of the plasma chamber with the reactance of the second filter to provide a fifth RF signal to the point. The fourth capacitive circuit receives the fourth RF signal and balance the reactance of the second RF coil with the reactance of the second filter to provide a sixth RF signal to the second RF coil.

Some advantages of the herein described systems and methods include an increase in an amount of plasma stability. Plasma instability occurs in different regions of an operating space with a single frequency, such as the low frequency or the high frequency, running on the ICP coil. By having two RF frequencies available on the same ICP coil, a stability window increases to at least a combination of individual stability windows of the two frequencies. As such, an unstable radio frequency can be avoided if the other radio frequency is stable. In addition, stable windows can be created by simultaneous application of the two frequencies.

Additional advantages of the herein described systems and methods include a lower coil voltage and reduced window sputtering. In general, a voltage at the ICP coil voltage is lower when the low frequency is applied. While maintaining the same plasma density, by substituting some power of high frequency with that of low frequency, the voltage at the ICP coil can be lowered to below a sputtering threshold of the dielectric window, thus increasing a lifetime of the dielectric window.

Further advantages of the herein described systems and methods include a quick plasma ignition. A higher coil voltage is applied to strike the plasma than an amount of voltage used to maintain the plasma. By applying the high frequency, the quick plasma ignition is achieved. The high frequency can be used to strike the plasma at initial turn on, and then power can be switched over, partially or completely, to the low frequency to maintain the plasma.

Additional advantages of the herein described systems and methods include an increase in control of uniformity in processing a substrate and an increase in control of an amount of tilt at which plasma ions are incident on the substrate. For many process conditions, plasma density profiles are different when the two frequencies are applied to the same ICP coil. Having the two frequencies available can provide an additional tuning knob for etch and tilt uniformity.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 1 is a diagram of an embodiment of a system to illustrate a hybrid matchless plasma source (MPS).

FIG. 2A is a diagram of an embodiment of a low-pass filter.

FIG. 2B is a diagram of an embodiment of a high-pass filter.

FIG. 2C is a diagram of an embodiment of a band-pass filter.

FIG. 2D is a diagram of an embodiment of a band-pass filter.

FIG. 3A is a diagram of an embodiment of a plasma system to illustrate use of a low frequency (LF) MPS and a high frequency (MPS) within a plasma system.

FIG. 3B is a diagram of an embodiment of a plasma system to illustrate use of the LF MPS and the HF MPS when a lower electrode is coupled to a ground potential.

FIG. 4 is a diagram of an embodiment of a system to illustrate use of an LF source radio frequency generator (RFG) and an HF source RFG to supply RF power to an RF coil.

FIG. 5A is a diagram of an embodiment of a dual-frequency match.

FIG. 5B is a diagram of an embodiment of another dual frequency match.

FIG. 5C is a diagram of an embodiment of yet another dual frequency match.

FIG. 6A is a diagram of an embodiment of a plasma system to illustrate use of the LF source RFG and the HF source RFG with an LF bias RFG and an HF bias RFG.

FIG. 6B is a diagram of an embodiment of a system to illustrate use of the LF source RFG and the HF source RFG with a plasma chamber in which the lower electrode is coupled to the ground potential.

FIG. 7A is a diagram of an embodiment of a system to illustrate use of the LF MPS with the HF source RFG.

FIG. 7B is a diagram of an embodiment of a system to illustrate use of the LF source RFG with the HF MPS.

FIG. 8A is a diagram of an embodiment of a system to illustrate use of the LF MPS and the HF source RFG with the LF bias RFG and the HF bias RFG.

FIG. 8B is a diagram of an embodiment of a system to illustrate use of the LF MPS and the HF source RFG when the lower electrode is coupled to the ground potential.

FIG. 8C is a diagram of an embodiment of a system to illustrate use of the LF source RFG and the HF MPS with the LF bias RFG and the HF bias RFG.

FIG. 8D is a diagram of an embodiment of a system to illustrate use of the LF source RFG and the HF MPS when the lower electrode is coupled to the ground potential.

FIG. 9A is a diagram of an embodiment of a system to illustrate a method for providing the high frequency to multiple RF coils and for providing the low frequency and the high frequency to an RF coil.

FIG. 9B is a diagram of an embodiment of a system to illustrate a method for providing the low frequency to multiple RF coils and for providing the low frequency and the high frequency to an RF coil.

FIG. 11A is an embodiment of a graph to illustrate a clock signal.

FIG. 11B is an embodiment of a graph to illustrate a parameter of an RF signal that is generated by the LF MPS or the LF bias RFG or the LF source RFG.

FIG. 11C is an embodiment of a graph to illustrate the parameter of an RF signal that is generated by the HF MPS or the HF bias RFG or the HF source RFG.

FIG. 11D is an embodiment of a graph to illustrate a low frequency RF signal.

FIG. 11E is an embodiment of a graph to illustrate a high frequency RF signal FIG. 11F is an embodiment of the graph of the RF signal of FIG. 11D.

FIG. 11G is an embodiment of a graph to illustrate pulsing of an RF signal to be out of phase with pulsing of the RF signal of FIG. 11F.

FIG. 11H is an embodiment of the graph of the RF signal of FIG. 11D.

FIG. 11I is an embodiment of a graph to illustrate that a pulsing frequency of the parameter of the RF signal of FIG. 11F is different from a pulsing frequency of the parameter of an RF signal.

FIG. 12A-1 is a diagram of an embodiment of a system to illustrate details of an MPS.

FIG. 12A-2 is a diagram of an embodiment of a system to illustrate further details of an input section and an output section of the MPS of FIG. 12A-1.

FIG. 12B is a diagram of an embodiment of a system to illustrate details of an RF generator.

FIG. 16A is a diagram of an embodiment of a system to illustrate a master slave configuration in which the LF MPS is a master and the HF MPS is a slave.

FIG. 16B is a diagram of an embodiment of a system to illustrate a master slave configuration in which the HF MPS is a master and the LF MPS is a slave.

FIG. 16C is a diagram of an embodiment of a system to illustrate a master slave configuration in which the LF source RFG is a master and the HF MPS is a slave.

FIG. 16D is a diagram of an embodiment of a system to illustrate a master slave configuration in which the HF source RFG is a master and the LF MPS is a slave.

FIG. 16E is a diagram of an embodiment of a system to illustrate a master slave configuration in which the LF MPS is a master and the HF source RFG is a slave.

FIG. 16F is a diagram of an embodiment of a system to illustrate a master slave configuration in which the HF MPS is a master and the LF source RFG is a slave.

DETAILED DESCRIPTION

Figure 9C:
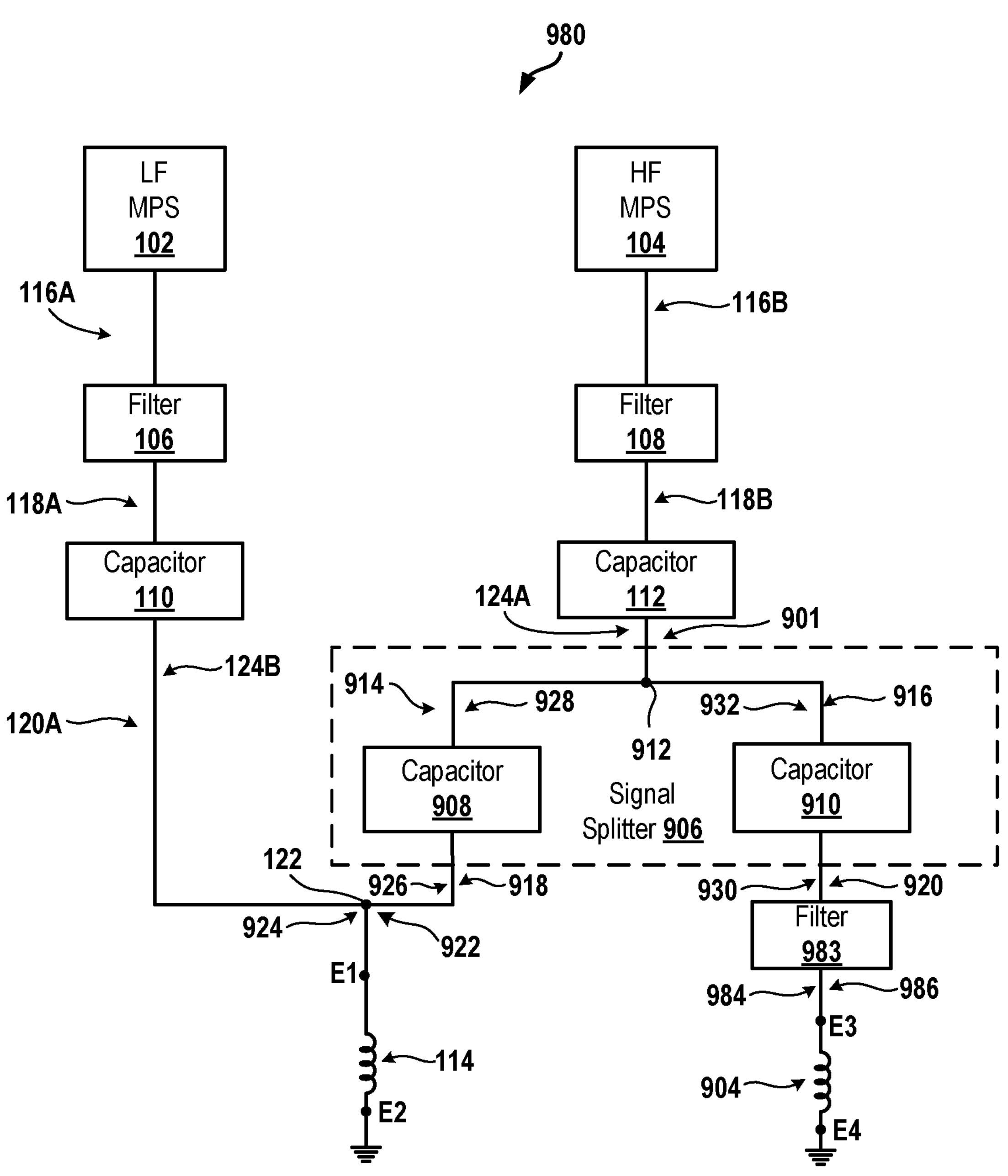
FIG. 9C is a diagram of an embodiment of a plasma system to illustrate a method for filtering the low frequency from being applied to an RF coil.

The following embodiments describe systems and methods for providing a hybrid frequency plasma source. It will be apparent that the present embodiments may be practiced without some or all of these specific details. In other instances, well known operations have not been described in detail in order not to unnecessarily obscure the present embodiments.

FIG. 1 is a diagram of an embodiment of a system 100 to illustrate a hybrid matchless plasma source (MPS). The hybrid MPS is a dual-frequency MPS. The system 100 includes a low frequency (LF) MPS 102 and a high frequency (HF) MPS 104. A combination of the LF MPS 102 and the HF MPS 104 is the hybrid MPS. The system 100 further includes a first filter 106 and a second filter 108. The system 100 includes a first capacitor 110 and a second capacitor 112. The first capacitor 110 is sometimes referred to herein as a capacitive circuit and the second capacitor is sometimes referred to herein as a capacitive circuit. As an example, each capacitor described herein as a fixed capacitor or a variable capacitor. Also, the system 100 includes a radio frequency (RF) coil 114. An RF coil, as used herein, is sometimes referred to as an inductively coupled plasma (ICP) coil or a transformer coupled plasma (TCP) coil. The RF coil 114 is an example of a top electrode of a plasma chamber and has one or more turns or windings.

An example of a low frequency MPS is a matchless plasma source that operates at a low frequency, such as a frequency ranging from and including 400 kilohertz (kHz) to 2 megahertz (MHz), to generate an RF signal having the low frequency. To illustrate, the low frequency MPS has an operating frequency of 400 kHz or 2 MHz. An example of a high frequency MPS is a matchless plasma source that operates at a high frequency, such as a frequency ranging from and including 12 MHz to 60 MHz, to generate an RF signal having the high frequency. To illustrate, the high frequency MPS has an operating frequency of 13.56 MHz or 27 MHz or 60 MHz. An example of a capacitor, as used herein, is a fixed capacitor or a variable capacitor. As an example, the high frequency is greater than and exclusive from the low frequency. For example, no value of the high frequency coincides with a value of the low frequency. An example of the first filter 106 is a low pass or a band pass filter, and an example of the second filter 108 is a high pass or a band pass filter.

The LF MPS 102 is coupled to the first filter 106, which is coupled to the first capacitor 110. Similarly, the HF MPS 104 is coupled to the second filter 108, which is coupled to the second capacitor 112. The capacitors 110 and 112 are coupled to each other at a point 122. An example of the point 122 is a connection, such as a connector, among a first RF connection, a second RF connection, and a third RF connection. The first RF connection is between the first capacitor 110 and the point 122, the second RF connection is between the second capacitor 112 and the point 122, and the third RF connection is between the point 122 and the RF coil 114. To illustrate, the point 122 is a solder among first, second, and third RF straps. The first RF strap is an example of the first RF connection, the second RF strap is an example of the second RF connection, and the third RF strap is an example of the third RF connection. As another illustration, the point 122 is a bolt that connects the first, second, and third RF straps. The point 122 is coupled to an end E1 of the RF coil 114 via an RF connection 125. Examples of an RF connection, as used herein, include an RF cable, an RF strap, an RF cylinder, an RF transmission line, and a combination of two or more thereof. To illustrate, the RF strap is elongated and flat. To further illustrate, the RF strap is rectangular in shape. As an illustration, the RF cable has an RF sheath and an RF conductor. An opposite end E2 of the RF coil 114 is coupled to a ground potential.

The LF MPS 102 generates an RF signal 116A and supplies the RF signal 116A to the first filter 106. The RF signal 116A is a sinusoidal waveform. For example, the RF signal 116A has the shape of a sinusoidal signal. The first filter 106 allows passage of the low frequency of the RF signal 116A to output a filtered signal 118A. For example, the low frequency of the filtered signal 118A is the same as the low frequency of the RF signal 116A.

The first filter 106 provides the filtered signal 118A to the first capacitor 110. The first capacitor 110 receives the filtered signal 118A to provide an output RF signal 120A. For example, the first capacitor 110 has a capacitance that balances a reactance of the first filter 106 against a reactance of the RF coil 114. To illustrate, the first capacitor 110 has a capacitance to achieve a first reactance of the first filter 106 and a second reactance of the RF coil 114. In the illustration, the first reactance has an amplitude that is within a predetermined range from an amplitude of the second reactance and opposite in direction to a direction of the second reactance. In the illustration, due to the capacitance of the first capacitor 110, the low frequency of the LF MPS 102 is a low resonance frequency. As another illustration, the first capacitor 110 has a capacitance that cancels a reactance of the first filter 106 against a reactance of the RF coil 114. To illustrate, the first capacitor 110 has a capacitance to achieve a first reactance of the first filter 106 and a second reactance of the RF coil 114. In the illustration, the first reactance is equal in amplitude and opposite in direction to the second reactance. In the illustration, due to the capacitance of the first capacitor 110, the low frequency of the LF MPS 102 is a low resonance frequency. The output RF signal 120A is provided from the capacitor 110 to the point 122.

It should be noted that as an example, a first reactance, as described herein, has a first sign, such as a positive sign or a negative sign, and a second reactance, as described herein, has a second sign, such as a negative sign or a positive sign. In the example, the second sign is opposite to the first sign. To illustrate, when the first reactance is positive, the second reactance is negative and vice versa. As another illustration, when the first reactance is a positive value, the second reactance is of a negative value and when the first reactance is a negative value, the second reactance is a positive value.

Similarly, the HF MPS 104 generates an RF signal 116B and supplies the RF signal 116B to the second filter 108. The RF signal 116B is a sinusoidal waveform. For example, the RF signal 116B has the shape of a sinusoidal signal. The second filter 108 allows passage of the high frequency of the RF signal 116B to output a filtered signal 118B. For example, the high frequency of the filtered signal 118B is the same as the high frequency of the RF signal 116B.

The second filter 108 provides the filtered signal 118B to the second capacitor 112. The second capacitor 112 receives the filtered signal 118B to provide an output RF signal 120B. For example, the second capacitor 112 has a capacitance that balances a reactance of the second filter 108 against a reactance of the RF coil 114. To illustrate, the second capacitor 112 has a capacitance to achieve a first reactance of the second filter 108 and a second reactance of the RF coil 114. In the illustration, the first reactance has an amplitude that is within a pre-determined range from an amplitude of the second reactance and opposite in direction to a direction of the second reactance. In the illustration, due to the capacitance of the second capacitor 112, the high frequency of the HF MPS 104 is a high resonance frequency. As another illustration, the second capacitor 112 has a capacitance that cancels a reactance of the second filter 108 against a reactance of the RF coil 114. To further illustrate, the second capacitor 112 has a capacitance to achieve a first reactance of the second filter 108 and the second reactance of the RF coil 114. In the illustration, the first reactance is equal in amplitude and opposite in direction to the second reactance. In the illustration, due to the capacitance of the second capacitor 112, the high frequency of the HF MPS 104 is a high resonance frequency. The second capacitor 112 provides the output RF signal 120B to the point 122. The output RF signals 120A and 120B are combined at the point 122 to generate a combined RF signal 123, which is supplied to the end E1.

When one or more process gases are supplied to the plasma chamber in addition to the output RF signals 120A and 120B, plasma is generated or maintained or maintained within the plasma chamber. Examples of the one or more process gases include an oxygen-containing gas, a nitrogen-containing gas, a fluorine-containing gas, and a combination of two or more thereof.

RF power from the plasma is reflected in the form of a reflected RF signal 115. The reflected RF signal 115 is received by the point 122 from the plasma within the plasma chamber and split into a reflected RF signal 124A and a reflected RF signal 124B. RF power of the reflected RF signal 115 is reflected from the plasma chamber via the RF coil 114 towards the point 122. The reflected RF signal 124A is provided from the point 122 to the second capacitor 112. The reflected RF signal 115 and the reflected RF signal 124A have a combination of the low frequency and the high frequency. The second capacitor 112 modifies an impedance of the reflected RF signal 124A to provide an output RF signal 126A to the filter 108. For example, the second capacitor 112 balances the reactances of the RF coil 114 and the second filter 108 in the same manner as that described above to provide the output RF signal 126A. To illustrate, the second capacitor 112 reduces an impedance of the reflected RF signal 124A to a minimum amount, such as zero or close to zero, to provide the output RF signal 126A to the second filter 108. The second filter 108 filters out the low frequency of the output RF signal 126A to output a filtered signal 128A. An example of filtering out a frequency includes removing the frequency. An example of filtering out a frequency includes reducing the frequency. The filtered signal 128A has a low amount of the low frequency or has zero amount of the low frequency to protect the HF MPS 104 from being damaged from the low frequency.

Similarly, the reflected RF signal 124B is reflected from the point 122 to the first capacitor 110. The reflected RF signal 124B has a combination of the low frequency and the high frequency. The first capacitor 110 modifies an impedance of the reflected RF signal 124B to provide an output RF signal 126B to the first filter 106. For example, the first capacitor 110 balances the reactances of the RF coil 114 and the first filter 106 in the same manner as that described above to output to provide the output RF signal 126B. To illustrate, the first capacitor 110 reduces an impedance of the reflected RF signal 124B to a minimum amount, such as zero or close to zero, to provide the output RF signal 126B to the first filter 106. The first filter 106 filters out, such as reduces or removes, the high frequency of the output RF signal 126B to output a filtered signal 128B. The filtered signal 128B has a low amount of the high frequency or has zero amount of the high frequency to protect the LF MPS 102 from being damaged from the high frequency.

It should be noted that the first filter 106 filters out the high frequency, which includes a range of frequencies. For example, the first filter 106 filters out frequencies within a predetermined range from the high frequency. To illustrate, the first filter 106 removes frequencies ranging from 26.7 MHz to 27.3 MHz to filter out the high frequency of 27 MHz of the output RF signal 126B. Similarly, it should be noted that the second filter 108 filters out the low frequency, which includes a range of frequencies. For example, the second filter 108 filters out frequencies within a predetermined range from the low frequency. To illustrate, the second filter 108 filters out frequencies ranging from 380 kHz to 430 kHz to filter out the low frequency of 400 kHz of the output RF signal 126A.

It should further be noted that there is no match, such as an impedance matching network or an impedance matching circuit or an impedance match system or an impedance match circuitry or an impedance match, between the LF MPS 102 and the RF coil 114. For example, there is no physical housing, such as an enclosure or a physical container, of the match between the LF MPS 102 and the RF coil 114. Similarly, there is no match between the HF MPS 104 and the RF coil 114. For example, there is no physical housing, such as an enclosure or a physical container, of the match between the HF MPS 104 and the RF coil 114.

In one embodiment, instead of the RF coil 114, a substrate support, such as a chuck, is used. The chuck includes a lower electrode that is fabricated from a metal, such as aluminum or an alloy of aluminum.

In an embodiment, the system 100 excludes the first filter 106. In the embodiment, the LF MPS 102 is coupled to the first capacitor 110 without being coupled to the first filter 106.

In one embodiment, the system 100 excludes the second filter 108. In the embodiment, the HF MPS 104 is coupled to the second capacitor 112 without being coupled to the second filter 108.

In one embodiment, the LF MPS 102 is coupled to the first filter 106 via an RF connection, the first filter 106 is coupled to the first capacitor 110 via an RF connection, and the first capacitor 110 is coupled to the point 122 via an RF connection. Similarly, the HF MPS 104 is coupled to the second filter 108 via an RF connection, the second filter 108 is coupled to the second capacitor 112 via an RF connection, and the second capacitor 112 is coupled to the point 122 via an RF connection. In the embodiment, the RF signals 116A and 128B are transferred between the LF MPS 102 and the first filter 106 via the RF connection between the LF MPS 102 and the first filter 106. Also, the RF signals 118A and 126B are transferred between the first filter 106 and the first capacitor 110 via the RF connection between the first filter 106 and the first capacitor 110. Moreover, the RF signals 120A and 124B are transferred between the first capacitor 110 and the point 122 via the RF connection between the first capacitor 110 and the point 122. Furthermore, the RF signals 116B and 128A are transferred between the HF MPS

104 and the second filter 108 via the RF connection between the HF MPS 104 and the second filter 108. Also, the RF signals 118B and 126A are transferred between the second filter 108 and the second capacitor 112 via the RF connection between the second filter 108 and the second capacitor 112. Moreover, the RF signals 120B and 124A are transferred between the second capacitor 112 and the point 122 via the RF connection between the second capacitor 112 and the point 122.

In an embodiment, instead of the RF coil 114, a lower electrode, such as a plate or a ring, within a substrate support is used. For example, the point 122 is coupled to the lower electrode. Examples of the lower electrode and the substrate support are provided below.

In one embodiment, the HF MPS 104 is turned on to generate the RF signal 116B for a predetermined amount of time and the LF MPS 102 remains off. Once plasma is ignited or stricken within the plasma chamber within the pre-determined amount of time, the LF MPS 102 is turned on to generate the RF signal 116A. Once the LF MPS 102 is turned on, the HF MPS 104 is either turned off or remains on.

In one embodiment, the LF MPS 102 is turned on to generate the RF signal 116A for a predetermined amount of time and the HF MPS 104 is turned on to generate the RF signal 116B for the predetermined amount of time. Once plasma is ignited or stricken within the plasma chamber within the pre-determined amount of time, HF MPS 104 is either turned off or remains on.

In an embodiment, instead of the HF MPS 104, an LF MPS is used. The LF MPS has the same frequency of operation as that of the LF MPS 102.

In one embodiment, instead of the LF MPS 102, an HF MPS is used. The HF MPS has the same frequency of operation as that of the HF MPS 104.

In an embodiment, the end E2 of the RF coil 114 is coupled via a terminating capacitor to the ground potential. For example, the end E2 of the RF coil 114 is coupled to a first end of the terminating capacitor and a second end of the terminating capacitor is coupled to the ground potential.

FIG. 2A is a diagram of an embodiment of a low-pass filter 200. The filter 200 is an example of the first filter 106 of FIG. 1. The filter 200 includes an inductor 202, another inductor 204, a capacitor 206, and another capacitor 208.

An input In of the filter 200 is coupled to the LF MPS 102 and an output Out of the filter 200 is coupled to the first capacitor 110 (FIG. 1). The input In of the filter 200 is coupled to the inductor 202, which is coupled to the inductor 204 and to a first end of the capacitor 206. The inductor 204 is coupled to the output Out of the filter 200 and to a first end of the capacitor 208. The first end of the capacitor 208 is coupled to the output Out of the filter 200. A second end of the capacitor 208 is coupled to the ground potential and a second end of the capacitor 206 is coupled to the ground potential.

The filter 200 receives the RF signal 116A and allows passage of the low frequency the RF signal 116A to output the filtered RF signal 118A. Also, the filter 200 receives the output RF signal 126B at the output Out of the filter 200 and filters out the high frequency of the output RF signal 126B to provide the filtered signal 128B at the input In of the filter 200.

FIG. 2B is a diagram of an embodiment of a high-pass filter 230. The filter 230 is an example of the second filter 108 of FIG. 1. The filter 230 includes a capacitor 232, a capacitor 234, an inductor 236, and an inductor 238.

An input In of the filter 230 is coupled to the HF MPS 104 and an output Out of the filter 230 is coupled to the second capacitor 112 (FIG. 1). The input In of the filter 230 is coupled to the capacitor 232, which is coupled to a first end of the inductor 236 and is coupled to the capacitor 234. The capacitor 234 is coupled to the output Out of the filter 230 and to a first end of the inductor 238. A second end of the inductor 236 is coupled to the ground potential and a second end of the inductor 238 is coupled to the ground potential.

The filter 230 receives the RF signal 116B and allows passage of the high frequency the RF signal 116B to output the filtered RF signal 118B. Also, the filter 230 receives the output RF signal 126A at the output Out of the filter 230 and filters out the low frequency of the output RF signal 126A to provide the filtered signal 128A at the input In of the filter 230.

FIG. 2C is a diagram of an embodiment of a band-pass filter 250, such as a low-pass filter or a high-pass filter. The filter 250 is an example of the first filter 106 or the second filter 108 of FIG. 1. The filter 250 includes an inductor 252, another inductor 254, an inductor 256, a capacitor 258, a capacitor 260, and a capacitor 262.

When the filter 250 is used as the first filter 106, such as a low-pass filter, an input In of the filter 250 is coupled to the LF MPS 102 and an output Out of the filter 250 is coupled to the first capacitor 110 (FIG. 1). Also, when the filter 250 is used as the second filter 108, such as a high-pass filter, an input In of the filter 250 is coupled to the HF MPS 104 and an output Out of the filter 250 is coupled to the second capacitor 112 (FIG. 1).

The input In of the filter 250 is coupled to the inductor 252, which is coupled in series with the capacitor 258. The capacitor 258 is coupled to a first end of the capacitor 260, a first end of the inductor 256, and to the inductor 254. The first end of the capacitor 260 is coupled to the first end of the inductor 256 and to the inductor 254. The inductor 254 is coupled in series with the capacitor 262, which is coupled to the output Out of the filter 250. A second end of the capacitor 260 is coupled to the ground potential and a second end of the inductor 256 is coupled to the ground potential.

When the filter 250 is used as the first filter 106, the filter 250 receives the RF signal 116A and allows passage of the low frequency the RF signal 116A to output the filtered RF signal 118A. Also, the filter 250 receives the output RF signal 126B at the output Out of the filter 250 and filters out the high frequency of the output RF signal 126B to provide the filtered signal 128B at the input In of the filter 250.

When the filter 250 is used as the second filter 108, the filter 250 receives the RF signal 116B and allows passage of the high frequency the RF signal 116B to output the filtered RF signal 118B. In this case, the filter 250 receives the output RF signal 126A at the output Out of the filter 250 and filters out the low frequency of the output RF signal 126A to provide the filtered signal 128A at the input In of the filter 250.

FIG. 2D is a diagram of an embodiment of a band-pass filter 270, such as a low-pass filter or a high-pass filter. The band-pass filter 270 is a series resonance circuit. The filter 270 is an example of the first filter 106 or 108 of FIG. 1. The filter 270 includes an inductor 272 and a capacitor 274 that are coupled in series with each other.

When the filter 270 is used as the low-pass first filter 106, an input In of the filter 270 is coupled to the LF MPS 102 and an output Out of the filter 270 is coupled to the first capacitor 110 (FIG. 1). Also, when the filter 270 is used as the high-pass second filter 108, an input In of the filter 270 is coupled to the HF MPS 104 and an output Out of the filter 270 is coupled to the second capacitor 112 (FIG. 1).

The input In of the filter 270 is coupled to the inductor 272, which is coupled in series with the capacitor 274. The capacitor 274 is coupled to the output Out of the filter 270.

When the filter 270 is used as the first filter 106, the filter 270 receives the RF signal 116A and allows passage of the low frequency the RF signal 116A to output the filtered RF signal 118A. Also, the filter 270 receives the output RF signal 126B at the output Out of the filter 270 and filters out the high frequency of the output RF signal 126B to provide the filtered signal 128B at the input In of the filter 270.

When the filter 270 is used as the second filter 108, the filter 270 receives the RF signal 116B and allows passage of the high frequency the RF signal 116B to output the filtered RF signal 118B. In this case, the filter 270 receives the output RF signal 126A at the output Out of the filter 270 and filters out the low frequency of the output RF signal 126A to provide the filtered signal 128A at the input In of the filter 270.

FIG. 3A is a diagram of an embodiment of a plasma system 300 to illustrate use of the LF MPS 102 and the HF MPS 104 within the plasma system 300. The plasma system 300 includes the LF MPS 102, the HF MPS 104, the first filter 106, the second filter 108, the first capacitor 110, the second capacitor 112, an LF bias RF generator (RFG) 302, an HF bias RFG 304, a match 306, and a plasma chamber 308.

An example of an LF bias RFG is an RF generator that operates at the low frequency to generate an RF signal having the low frequency. To illustrate, a frequency of operation of the LF bias RFG 302 is different from a frequency of operation of the LF MPS 102. To further illustrate, a frequency of operation of the LF bias RFG 302 is 2 MHz and a frequency of operation of the LF MPS 102 is 400 kHz. As another illustration, a frequency of the RF signal generated by the LF bias RFG 302 is the same as, such as equal to, a frequency of the RF signal 116A generated by the LF MPS 102. Similarly, an example of an HF bias RFG 304 is an RF generator that operates at the high frequency to generate an RF signal having the high frequency. To illustrate, a frequency of operation of the HF bias RFG 304 is different from a frequency of operation of the HF MPS 104. To further illustrate, a frequency of operation of the HF bias RFG 304 is 60 MHz and a frequency of operation of the HF MPS 104 is 27 MHz. As another illustration, a frequency of operation of the HF bias RFG 304 is the same as a frequency of operation of the HF MPS 104.

A match, as described herein, includes one or more branch circuits. As an example, the match has a housing or an enclosure. Examples of the match include an impedance matching network and an impedance matching circuit. To illustrate, each branch circuit of the match includes one or more electrical circuit components, such as inductors, resistors, and capacitors. To further illustrate, each branch circuit includes a series circuit, or a shunt circuit, or a combination thereof. The shunt circuit is coupled to the series circuit at one end and to a ground potential at an opposite end. As an example, the series circuit includes two or more electrical circuit components coupled to each other in series and the shunt circuit includes two or more electrical circuit components coupled to each other in series. As another example, the series circuit includes at least one electrical component and the shunt circuit includes at least one electrical circuit component.

The match 306 includes a first branch circuit that is coupled between an input 324A of the match 306 and an output 326 of the match 306. Also, the match 306 includes a second branch circuit that is coupled between another input 324B of the match 306 and the output 326.

The plasma chamber 308 includes a substrate support 310 and an RF coil 312. A substrate S, such as a semiconductor wafer, is placed on a top surface of the substrate support 310. The RF coil 312 has two turns and is an example of the RF coil 114 (FIG. 1). An example of the substrate support 310 is a chuck, such as an electrostatic chuck (ESC). The substrate support 310 includes a lower electrode 311, which is fabricated from a metal, such as aluminum or an alloy of aluminum. The plasma chamber 308 has a dielectric window 314. For example, the dielectric window 314 forms a top wall of the plasma chamber 308. The RF coil 312 is situated above the dielectric window 314.

The point 122 is coupled to an end 316 of the RF coil 312 via the RF connection 125. An opposite end 318 of the RF coil 312 is coupled to the ground potential.

The LF bias RFG 302 is coupled to the input 324A of the match 306 via an RF cable 320 and the HF bias RFG 304 is coupled to the input 324B of the match 306 via an RF cable 322. The output 326 of the match 306 is coupled via an RF transmission line 328 to the lower electrode 311 of the substrate 310. An example of an RF transmission line, as used herein, includes an RF rod that is surrounded by an RF sheath. There is an insulating material between the RF rod and the RF sheath. Another example of an RF transmission line is a combination of an RF rod and one or more RF straps. To illustrate, the RF rod is surrounded by the RF sheath, is coupled to the lower electrode 311, and is coupled to the output 326 via an RF strap.

The combined RF signal 123 is sent from the point 122 via the RF connection 125 to the end 316. The LF bias RFG 302 generates an RF signal 330 and sends the RF signal 330 to the input 324A. Similarly, the HF bias RFG 304 generates an RF signal 332 and sends the RF signal 332 via the RF cable 322 to the input 324B. The match 306 receives the RF signals 330 and 332 and modifies impedances of the RF signals 330 and 332 to match an impedance of a load coupled to the output 326 with that of a source coupled to the inputs 324A and 324B. An example of the load coupled to the output 326 includes the RF transmission line 328 and the plasma chamber 308. An example of the source coupled to the inputs 324A and 324B includes the RF cables 320 and 322 and the bias RF generators 302 and 304. The impedance of the RF signal 330 is modified by the first branch circuit of the match 306 to output a first modified RF signal and the impedance of the RF signal 332 is modified by the second branch circuit of the match 306 to output a second modified RF signal. The first and second modified RF signals are combined, such as summed, at the output 326 to provide a modified RF signal 334 at the output 326. The modified RF signal 334 is sent from the output 326 via the RF transmission line 328 to the lower electrode 311.

When the one or more process gases are supplied to the plasma chamber 308 in addition to the combined RF signals 123 and 334, plasma is generated or maintained within the plasma chamber 308. When the plasma is generated or maintained within the plasma chamber 308, the substrate S is processed and the reflected RF signal 115 is reflected from the plasma chamber 308 via the RF connection 125 towards the point 122. For example, the reflected RF signal 115 is reflected from the plasma chamber 308 via the RF connection 125 towards the point 122. Examples of processing the substrate S include depositing a metal or an oxide on top of the substrate S, etching the substrate S, cleaning the substrate S, and sputtering the substrate S.

In one embodiment, the Rf coil 312 is has a different number of turns than that illustrated in FIG. 3A.

In an embodiment, each turn of the RF coil 312 lies in a different plane.

FIG. 3B is a diagram of an embodiment of a plasma system 350 to illustrate use of the LF MPS 102 and the HF MPS 104 when the lower electrode 311 is coupled to the ground potential. The plasma system 350 includes the LF MPS 102, the HF MPS 104, the first filter 106, the second filter 108, the first capacitor 110, the second capacitor 112, and the plasma chamber 308. The combined RF signal 123 is generated in the same manner as that described above and supplied to the RF coil 312 while the lower electrode 311 is coupled to the ground potential.

When the one or more process gases are provided to the plasma chamber 308 in addition to the combined RF signal 123, plasma is generated or maintained within the plasma chamber 308. When the plasma is generated or maintained, the reflected RF signal 115 is reflected from the plasma chamber 308 towards the point 122.

FIG. 4 is a diagram of an embodiment of a system 400 to illustrate use of an LF source RFG 402 and an HF source RFG 404 to supply RF power to the RF coil 114. The system 400 includes the LF source RFG 402 and the HF RFG 404. The system 400 further includes a dual frequency match 406 and the RF coil 114.

An example of an LF source RFG is an RF generator that operates at the low frequency to generate an RF signal having the low frequency. To illustrate, a frequency of operation of the LF source RFG 402 is different from a frequency of operation of the LF MPS 102 (FIG. 1). To further illustrate, a frequency of operation of the LF source RFG is 2 MHz and a frequency of operation of the LF MPS 102 is 400 kHz. As another illustration, a frequency of an RF signal 420 generated by the LF source RFG 402 is different from a frequency of the RF signal 116A generated by the LF MPS 102. As yet another illustration, a frequency of the RF signal 420 generated by the LF source RFG 402 is the same as, such as equal to, a frequency of operation of the LF MPS 102.

Similarly, an example of an HF source RFG 404 is an RF generator that operates at the high frequency to generate an RF signal having the high frequency. To illustrate, a frequency of operation of the HF source RFG 404 is different from a frequency of operation of the HF MPS 104. To further illustrate, a frequency of operation of the HF source RFG 404 is 60 MHz and a frequency of operation of the HF MPS 104 is 27 MHz. As another illustration, a frequency of operation of the HF source RFG 404 is the same as a frequency of operation of the HF MPS 104.

The LF source RFG 402 is coupled via an RF cable 408 to an input 410 of the dual frequency match 406 and the HF source RFG coupled via another RF cable 412 to another input 414 of the dual frequency match 406. An output 416 of the dual frequency match 406 is coupled to the end E1 of the RF coil 114 via an RF connection 418.

The LF source RFG 402 generates an RF signal 420 and supplies the RF signal 420 via the RF cable 408 to the input 410. The RF signal 420 has the low frequency. Moreover, the HF source RFG 404 generates an RF signal 422 and supplies the RF signal 422 via the RF cable 412 to the input 414. The RF signal 422 has the high frequency. The dual frequency match 406 receives the RF signals 420 and 422 and modifies impedances of the RF signals 420 and 422 to match an impedance of a load coupled to the output 416 with that of a source coupled to the inputs 410 and 414. An example of the load coupled to the output 416 includes the RF connection 418 and the plasma chamber, which includes the RF coil 114. An example of the source coupled to the inputs 410 and 414 includes the RF cables 408 and 412 and the source RF generators 402 and 404. The impedance of the RF signal 420 is modified by a first branch circuit of the dual frequency match 406 to output a first modified RF signal and the impedance of the RF signal 422 is modified by the second branch circuit of the dual frequency match 406 to output a second modified RF signal. The first and second modified RF signals are combined, such as summed, at the output 416 to provide a modified RF signal 426 at the output 416. The modified RF signal 426 is sent from the output 416 via the RF connection 418 to the RF coil 114.

When the one or more process gases are supplied to the plasma chamber, which includes the RF coil 114, in addition to the modified RF signal 426, plasma is generated or maintained within the plasma chamber. When the plasma is generated or maintained, RF power is reflected towards the dual frequency match 406 in the form of a reflected RF signal 428.

In one embodiment, the HF source RFG 404 is turned on to generate the RF signal 422 for a predetermined amount of time and the LF source RFG 402 remains off. Once plasma is ignited or stricken within the plasma chamber within the pre-determined amount of time, the LF source RFG 402 is turned on to generate the RF signal 420. Once the LF source RFG 402 is turned on, the HF source RFG 404 is either turned off or remains on.

In one embodiment, the LF source RFG 402 is turned on to generate the RF signal 420 for a predetermined amount of time and the HF source RFG 404 is turned on to generate the RF signal 422 for the predetermined amount of time. Once plasma is ignited or stricken within the plasma chamber within the pre-determined amount of time, the HF source RFG 404 is either turned off or remains on.

FIG. 5A is a diagram of an embodiment of a dual-frequency match 500, which is an example of the dual frequency match 406. The dual frequency match 500 includes a branch circuit 501, which includes a filter 506, a shunt circuit 504, a series circuit 507, and another filter 508. The dual frequency match 500 includes another branch circuit 503, which includes a filter 510, a series circuit 512, a shunt circuit 514, another series circuit 516, and a filter 518. An example of the filter 506 is the first filter 106 (FIG. 1) and an example of the filter 508 is the first filter 106. Also, an example of the filter 510 is the second filter 108 (FIG. 1) and an example of the filter 518 is the second filter 108. An example of a shunt circuit is a variable capacitor or a fixed capacitor, and an example of a series circuit is a variable capacitor or fixed capacitor.

The filter 506 is coupled to the input 410 and to an end of the shunt circuit 504. An opposite end of the shunt circuit 504 is coupled to the ground potential. The filter 506 is coupled to the series circuit 507, which is coupled to the filter 508. The filter 508 is coupled to the output 416.

Similarly, the filter 510 is coupled to the input 414 and to the series circuit 512. The series circuit 512 is coupled to an end of the shunt circuit 514. An opposite end of the shunt circuit 514 is coupled to the ground potential. The shunt circuit 514 and the series circuit 512 are coupled to the series circuit 516. The series circuit 516 is coupled to the filter 518, which is coupled to the output 416.

The filter 506 receives the RF signal 420 at its input and allows passage of the low frequency of the RF signal 420 to output a filtered RF signal 505 at its output. The shunt circuit 504 and the series circuit 507 modify an impedance of the filtered RF signal 505 to provide a modified RF signal 509 at an output of the series circuit 507. The filter 508 allows passage of the low frequency of the modified RF signal 509 to output a filtered signal 511 at its output.

Similarly, the filter 510 receives the RF signal 422 at its input and allows passage of the high frequency of the RF signal 422 to output a filtered RF signal 513 at its output. The series circuit 512, the shunt circuit 514, and the series circuit 516 modify an impedance of the filtered RF signal 513 to provide a modified RF signal 515 at an output of the series circuit 516. The filter 518 allows passage of the high frequency of the modified RF signal 515 to output a filtered signal 517 at its output. The filtered signal 511 is combined, such as summed, with the filtered signal 517 to generate the modified RF signal 426, which is sent to the RF coil 114 via the output 416.

The reflected RF signal 428 is split into a reflected RF signal 520 and another reflected RF signal 522 at the output 416. The reflected RF signal 520 is sent from the output 416 to the filter 508 and the reflected RF signal 522 is sent from the output 416 to the filter 518.

The reflected RF signal 520 has the high frequency and the high frequency is filtered by the filter 508 to provide a filtered signal 524 at an input of the filter 508. An impedance of the filtered signal 524 is modified by the series circuit 507 and the shunt circuit 504 to output a modified RF signal 526. The filter 506 filters out the high frequency of the modified RF signal 526 to provide a filtered signal 528 at an input of the filter 506. As an example, the filtered signal 528 has the low frequency and excludes the high frequency. As another example, the filtered signal 528 has a minimal amount of the high frequency and a maximum amount of the low frequency. The filtered signal 528 has a minimal amount or has no amount of the high frequency to interfere with the low frequency of the RF signal 420. The filtered signal 528, when received by the LF source RFG 402 via the RF cable 408 does not damage the LF source RFG 402 or causes minimal damage to the LF source RFG 402.

Similarly, the reflected RF signal 522 has the low frequency and the low frequency is filtered by the filter 518 to provide a filtered signal 530 at an input of the filter 518. An impedance of the filtered signal 530 is modified by the series circuit 516, the shunt circuit 514, and the series circuit 512 to output a modified RF signal 532. The filter 510 filters out the low frequency of the modified RF signal 532 to provide a filtered signal 534 at an input of the filter 510. As an example, the filtered signal 534 has the high frequency and excludes the low frequency. As another example, the filtered signal 534 has a minimal amount of the low frequency and a maximum amount of the high frequency. The filtered signal 524 has a minimal amount or has no amount of the low frequency to interfere with the high frequency of the RF signal 422. The filtered signal 534, when received by the HF source RFG 404 via the RF cable 412 does not damage the HF source RFG 404 or causes minimal damage to the HF source RFG 404.

FIG. 5B is a diagram of an embodiment of a dual frequency match 550, which is another example of the dual frequency match 406 of FIG. 4. The dual frequency match 550 is the same, in structure and function, as that of the dual frequency match 500 and FIG. 5A, except that the dual frequency match 550 excludes the filters 508 and 518. Instead, the series circuit 507 is coupled to the output 416 and the series circuit 516 is coupled to the output 416. For example, the dual frequency match 550 includes a branch circuit 531, which includes the filter 506, the shunt circuit 504, and the series circuit 507. Also, in the example the low frequency match 550 includes a branch circuit 533, which includes the filter 510, the series circuit 512, the shunt circuit 514, and the series circuit 516.

An impedance of the reflected RF signal 520 is modified by the series circuit 507 and the shunt circuit 504 to provide a modified RF signal 552 to the filter 506. The filter 506 filters, such as removes or reduces, the high frequency of the modified RF signal 552 to provide a filtered signal 554 at an input of the filter 506. As an example, the filtered signal 554 has the low frequency and excludes the high frequency. As another example, the filtered signal 554 has a minimal amount of the high frequency and a maximum amount of the low frequency. The filtered signal 554 has a minimal amount or has no amount of the high frequency to interfere with the low frequency of the RF signal 420. The filtered signal 554, when received by the LF source RFG 402 via the RF cable 408 does not damage the LF source RFG 402 or causes a negligible amount of damage to the LF source RFG 402.

Similarly, an impedance of the reflected RF signal 522 is modified by the series circuit 516, the shunt circuit 514, and the series circuit 512 to provide a modified RF signal 555 to the filter 510. The filter 510 filters, such as removes or reduces, the low frequency of the modified RF signal 555 to provide a filtered signal 556 at an input of the filter 510. As an example, the filtered signal 556 has the high frequency and excludes the low frequency. As another example, the filtered signal 556 has a minimal amount of the low frequency and a maximum amount of the high frequency. The filtered signal 556 has a minimal amount or has no amount of the low frequency to interfere with the high frequency of the RF signal 422. The filtered signal 556, when received by the HF source RFG 404 via the RF cable 412 does not damage the HF source RFG 404 or causes a negligible amount of damage to the HF source RFG 404.

FIG. 5C is a diagram of an embodiment of a dual frequency match 570, which is yet another example of the dual frequency match 406 of FIG. 4. The dual frequency match 570 is the same, in structure and function, as that of the dual frequency match 500 and FIG. 5A, except that the dual frequency match 570 excludes the filters 506 and 510. Instead, the shunt circuit 504 and the series circuit 507 are coupled to the input 410. Also, the series circuit 512 is coupled to the input 414. For example, the dual frequency match 570 includes a branch circuit 571, which includes the shunt circuit 504, the series circuit 507, and the filter 508. Also, in the example, the dual frequency match 570 includes a branch circuit 573, which includes the series circuit 512, the shunt circuit 514, the series circuit 516, and the filter 518.

The modified RF signal 526 is reflected towards the LF source RFG 402 (FIG. 4) via the RF cable 408. The modified RF signal 526 is generated based on the filtered signal 524. As such, as an example, the modified RF signal 526 has the low frequency and excludes the high frequency. As another example, the modified RF signal 526 has a minimal amount of the high frequency and a maximum amount of the low frequency. The modified RF signal 526 has a minimal amount or has no amount of the high frequency to interfere with the low frequency of the RF signal 420. The modified RF signal 526, when received by the LF source RFG 402 via the RF cable 408 does not damage the LF source RFG 402 or causes a negligible amount of damage to the LF source RFG 402.

Similarly, the modified RF signal 532 is reflected towards the HF source RFG 404 (FIG. 4) via the RF cable 412. The modified RF signal 532 is generated based on the filtered signal 530. As such, as an example, the modified RF signal 532 has the high frequency and excludes the low frequency. As another example, the modified RF signal 532 has a minimal amount of the low frequency and a maximum amount of the high frequency. The modified RF signal 532 has a minimal amount or has no amount of the low frequency to interfere with the high frequency of the RF signal 422. The modified RF signal 532, when received by the HF source RFG 405 via the RF cable 412 does not damage the HF source RFG 404 or causes a negligible amount of damage to the HF source RFG 404.

FIG. 6A is a diagram of an embodiment of a plasma system 600 to illustrate use of the LF source RFG 402 and the HF source RFG 404 with the LF bias RFG 302 and the HF bias RFG 304. The plasma system 600 includes the LF source RFG 402, the HF source RFG 404, the dual frequency match 406, the plasma chamber 308, the LF bias RFG 302, the HF bias RFG 304, and the match 306.

The output 416 of the dual frequency match 406 is coupled via the RF connection 418 to the RF coil 312 of the plasma chamber 308. The modified RF signal 426 is sent from the output 416 via the RF connection 418 to the RF coil 312 and the modified RF signal 334 is sent from the output 326 via the RF transmission line 328 to the lower electrode 311. When the one or more process gases are supplied to the plasma chamber 308 in addition to the modified RF signals 326 and 334, plasma is generated or maintained within the plasma chamber 308. When the plasma is generated or maintained, RF power embedded within the reflected RF signal 428 is reflected towards the dual frequency match 406.

FIG. 6B is a diagram of an embodiment of a system 650 to illustrate use of the LF source RFG 402 and the HF source RFG 404 with the plasma chamber 308 in which the lower electrode 311 is coupled to the ground potential. The system 650 includes the LF source RFG 402, the HF source RFG 404, the dual frequency match 406, and the plasma chamber 308. When the modified RF signal 426 is supplied to the plasma chamber 308 and the one or more process gases are supplied to the plasma chamber 308, plasma is generated or maintained within the plasma chamber 308. RF power is reflected in the form of the reflected RF signal 428 from the plasma chamber 308 in a direction towards the LF source RFG 402 and the HF source RFG 404.

FIG. 7A is a diagram of an embodiment of a system 700 to illustrate use of the LF MPS 102 with the HF source RFG 404. The system 700 includes the LF MPS 102, the HF source RFG 404, the first filter 106, the first capacitor 110, a match 702, and the RF coil 114. As an example, with reference to FIG. 5A, the match 702 includes the branch circuit 503 without including the branch circuit 501. As another example, with reference to FIG. 5B, the match 702 includes the branch circuit 533 without including the branch circuit 531. As yet another example, with reference to FIG. 5C, the match 702 includes the branch circuit 573 without including the branch circuit 571.

The HF source RFG 404 is coupled to the match 702, which is coupled to the point 122. Upon receiving the RF signal 422 at its input, the match 702 modifies an impedance of the RF signal 422 to output a modified RF signal 704. For example, upon receiving the RF signal 422 at its input, the match 702 matches an impedance of a load coupled to an output of the match 702 with an impedance of a source coupled to the input of the match 702 to output the modified RF signal 704. An example of the load coupled to the output of the match 702 includes the plasma chamber having the RF coil 114. Another example of the load coupled to the output of the match 702 includes an RF connection between the output and the point 122, another RF connection between the point 122 and the RF coil 114, and the plasma chamber including the RF coil 114. An example of the source coupled to the input of the match 702 includes the HF source RFG 404, and the RF cable 412. The output RF signal 120A and the modified RF signal 704 are combined, such as summed at the point 122 to generate a combined RF signal 706, which is provided via the RF connection 125 to the RF coil 114.

When one or more process gases are supplied to the plasma chamber 308 (FIG. 3A) in addition to the combined RF signal 706, plasma is generated or maintained within the plasma chamber. When the plasma is generated or maintained, the RF power is reflected from the plasma in the form of a reflected RF signal 708. The reflected RF signal 708 transfers via the RF connection 125 and is split into the reflected RF signal 124B and the reflected RF signal 522 at the point 122. The reflected RF signal 124B is processed in the same manner by the first capacitor 110 and the first filter 106 as described above with reference to FIG. 1 and the reflected RF signal 522 is processed in the same manner as described above by the branch circuit 503 (FIG. 5A), or 533 (FIG. 5B), or 573 (FIG. 5C) to output a modified RF signal 710. The modified RF signal 710 is an example of any of the RF signals 534 (FIG. 5A), 556 (FIG. 5B), and 532 (FIG. 5C).

In one embodiment, the HF source RFG 404 is turned on to generate the RF signal 422 for a predetermined amount of time and the LF MPS 102 remains off. Once plasma is ignited or stricken within the plasma chamber within the pre-determined amount of time, the LF MPS 102 is turned on to generate the RF signal 116A. Once the LF MPS 102 is turned on, the HF source RFG 404 is either turned off or remains on.

In one embodiment, the LF MPS 102 is turned on to generate the RF signal 116A for a predetermined amount of time and the HF source RFG 404 is turned on to generate the RF signal 422 for the predetermined amount of time. Once plasma is ignited or stricken within the plasma chamber within the pre-determined amount of time, the HF source RFG 404 is either turned off or remains on.

In one embodiment, the match 702 is coupled to the point 122 via an RF connection.

FIG. 7B is a diagram of an embodiment of a system 750 to illustrate use of the LF source RFG 402 with the HF MPS 104. The system 750 includes the LF source RFG 402, a match 752, the HF MPS 104, the second filter 108, the second capacitor 112, and the RF coil 114. As an example, with reference to FIG. 5A, the match 752 includes the branch circuit 501 without including the branch circuit 503. As another example, with reference to FIG. 5B, the match 752 includes the branch circuit 531 without including the branch circuit 533. As yet another example, with reference to FIG. 5C, the match 752 includes the branch circuit 571 without including the branch circuit 573.

The LF source RFG 402 is coupled to the match 752, which is coupled to the point 122. Upon receiving the RF signal 420 at its input, the match 752 modifies an impedance of the RF signal 420 to output a modified RF signal 754. For example, the match 752 matches an impedance of a load coupled to an output of the match 752 with an impedance of a source coupled to the input of the match 752 to output the modified RF signal 754. An example of the load coupled to the output of the match 752 includes the plasma chamber having the RF coil 114. Another example of the load coupled to the output of the match 752 includes an RF connection between the output and the point 122, another RF connection between the point 122 and the RF coil 114, and the plasma chamber including the RF coil 114. An example of the source coupled to the input of the match 752 includes the LF source RFG 402, and the RF cable 408. The modified RF signal 754 and the output RF signal 120B are combined, such as summed at the point 122 to generate a combined RF signal 756, which is provided via the RF connection 125 to the RF coil 114.

When one or more process gases are supplied to the plasma chamber in addition to the combined RF signal 756, plasma is generated or maintained within the plasma chamber. When the plasma is generated or maintained, the RF power is reflected from the plasma in the form of a reflected RF signal 758. The reflected RF signal 758 transfers via the RF connection 125 and is split into the reflected RF signal 124A and the reflected RF signal 520 at the point 122. The reflected RF signal 124A is processed in the same manner by the second capacitor 112 and the second filter 108 as described above with reference to FIG. 1 and the reflected RF signal 520 is processed in the same manner as described above by the branch circuit 501 (FIG. 5A), or 531 (FIG. 5B), or 571 (FIG. 5C) to output a modified RF signal 760. The modified RF signal 760 is an example of any of the RF signals 528 (FIG. 5A), 554 (FIG. 5B), and 526 (FIG. 5C).

In one embodiment, the HF MPS 104 is turned on to generate the RF signal 116B for a predetermined amount of time and the LF source RFG 402 remains off. Once plasma is ignited or stricken within the plasma chamber within the pre-determined amount of time, the LF source RFG 402 is turned on to generate the RF signal 420. Once the LF source RFG 402 is turned on, the HF MPS 104 is either turned off or remains on.

In one embodiment, the LF source RFG 402 is turned on to generate the RF signal 420 for a predetermined amount of time and the HF MPS 104 is turned on to generate the RF signal 116B for the predetermined amount of time. Once plasma is ignited or stricken within the plasma chamber within the pre-determined amount of time, the HF MPS 104 is either turned off or remains on.

In an embodiment, the match 752 is coupled to the point 122 via an RF connection.

FIG. 8A is a diagram of an embodiment of a system 800 to illustrate use of the LF MPS 102 and the HF source RFG 404 with the LF bias RFG 302 and the HF bias RFG 304. The system 800 includes the LF MPS 102, the HF source RFG 404, the filter 106, the first capacitor 110, the match 702, the plasma chamber 308, the LF bias RFG 302, the HF bias RFG 304, and the match 306. The point 122 is coupled to the end 314 of the RF coil 312 via the RF connection 125.

The combined RF signal 706 is supplied from the point 122 via the RF connection 125 to the RF coil 312. When the modified RF signal 334 is also supplied to the lower electrode 311 and the one or more process gases are supplied to the plasma chamber 308, plasma is generated or maintained within the plasma chamber 308. When the plasma is generated or maintained, the reflected RF signal 708 is reflected back from the RF coil 312 via the RF connection 125 towards the point 122.

FIG. 8B is a diagram of an embodiment of a system 820 to illustrate use of the LF MPS 102 and the HF source RFG 404 when the lower electrode 311 is coupled to the ground potential. The system 820 includes the LF MPS 102, the first filter 106, the first capacitor 110, the HF source RFG 404, the match 702, and the plasma chamber 308. When the combined RF signal 706 is supplied to the RF coil 312, the lower electrode is coupled to the ground potential, and the one or more process gases are supplied to the plasma chamber 308, plasma is generated or maintained within the plasma chamber 308. When the plasma is generated or maintained, the reflected RF signal 708 is reflected back from the RF coil 312 via the RF connection 125 towards the point 122.

FIG. 8C is a diagram of an embodiment of a system 840 to illustrate use of the LF source RFG 402 and the HF MPS 104 with the LF bias RFG 302 and the HF bias RFG 304. The system 840 includes the LF source RFG 402, the match 752, the HF MPS 104, the second filter 108, the second capacitor 112, the plasma chamber 308, the LF bias RFG 302, the HF bias RFG 304, and the match 306. The point 122 is coupled via the RF connection 125 to the RF coil 312.

When the combined RF signal 756 is supplied via the RF connection 125 to the plasma chamber 308 in addition to the modified RF signal 334 and the one or more process gases, plasma is generated or maintained within the plasma chamber 308. When the plasma is generated or maintained, the reflected RF signal 758 is generated and transferred via the RF connection 125 to the point 122.

FIG. 8D is a diagram of an embodiment of a system 860 to illustrate use of the LF source RFG 402 and the HF MPS 104 when the lower electrode 311 is coupled to the ground potential. The system 860 includes the LF source RFG 402, the HF MPS 104, the match 752, the second filter 108, the second capacitor 112, and the plasma chamber 308.

When the combined RF signal 756 is supplied via the RF connection 125 to the plasma chamber 308 in addition to the one or more process gases, and the lower electrode 311 is coupled to the ground potential, plasma is generated or maintained within the plasma chamber 308. When the plasma is generated or maintained, RF power of the reflected RF signal 758 is reflected via the RF connection 125 towards the point 122.

FIG. 9A is a diagram of an embodiment of a system 900 to illustrate a method for providing the high frequency to multiple RF coils 114 and 902 and for providing the low frequency and the high frequency to the RF coil 114. The system 900 includes the LF MPS 102, the first filter 106, the first capacitor 110, the HF MPS 104, the second filter 108, the second capacitor 112, a signal splitter 906, and the RF coils 114 and 902. The signal splitter 906 includes a third capacitor 908 and a fourth capacitor 910. Both the RF coils 114 and 902 are of the same plasma chamber, which is described below.

The second capacitor 112 is coupled to the capacitors 908 and 910 via a split point 912. As an example, second capacitor 112 is coupled to the capacitors 908 and 910 via a split RF connection, such as a single RF strap that is split into two RF straps. In the example, the single RF strap is split at the split point 912. The third capacitor 908 is coupled to the point 122 and the fourth capacitor 910 is coupled to an end E3 of the RF coil 904. For example, the third capacitor 908 is coupled to the point 122 via an RF connection and the fourth capacitor 910 is coupled to the end E3 via an RF connection. An opposite end E4 of the RF coil 904 is coupled to the ground potential.

The second capacitor 112 receives the filtered signal 118B from the second filter 108 and balances a reactance of the second filter 108 against a combined reactance of the RF coils 114 and 904 to provide an output RF signal 901. To illustrate, the second capacitor 112 has a capacitance to achieve a first reactance of the second filter 108 and a second reactance, which is the combined reactance of the RF coils 114 and 904. In the illustration, the first reactance has an amplitude that is within a pre-determined range from an amplitude of the second reactance and opposite in direction to a direction of the second reactance. In the illustration, due to the capacitance of the second capacitor 112, the high frequency of the HF MPS 104 is a high resonance frequency.

As another illustration, the second capacitor 112 has a capacitance that cancels a reactance of the second filter 108 against the combined reactance of the RF coils 114 and 904. In the illustration, the second capacitor 112 has a capacitance to achieve a first reactance of the second filter 108 and a second reactance, which is the combined reactance of the RF coils 114 and 904. In the illustration, the first reactance is equal in amplitude and opposite in direction to the second reactance. In the illustration, due to the capacitance of the second capacitor 112, the high frequency of the HF MPS 104 is a high resonance frequency. As an example, the combined reactance of the RF coils 114 and 904 is a total or a sum of a reactance of the RF coil 114 and a reactance of the RF coil 904. The output RF signal 901 is provided from the second capacitor 112 to the split point 912.

The output RF signal 901 is split at the split point 912 into an output RF signal 914 and an output RF signal 916. For example, RF power of the output RF signal 902 is divided into RF power of the output RF signal 914 and RF power of the output RF signal 916. The third capacitor 908 modifies an impedance of the output RF signal 914 to provide an output RF signal 918. For example, the third capacitor 908 balances a reactance of the second filter 108 against the reactance of the RF coil 114 to provide the output RF signal 918. To illustrate, the third capacitor 908 has a capacitance to achieve a first reactance of the second filter 108 and a second reactance of the RF coil 114. In the illustration, the first reactance has an amplitude that is within a pre-determined range from an amplitude of the second reactance and opposite in direction to a direction of the second reactance. In the illustration, due to the capacitance of the third capacitor 908, the high frequency of the HF MPS 104 is a high resonance frequency. As another illustration, the third capacitor 908 has a capacitance that cancels a reactance of the second filter 108 against the reactance of the RF coil 114. In the illustration, the third capacitor 908 has a capacitance to achieve a first reactance of the second filter 108 and a second reactance of the RF coil 114. In the illustration, the first reactance is equal in amplitude and opposite in direction to the second reactance. In the illustration, due to the capacitance of the third capacitor 908, the high frequency of the HF MPS 104 is a high resonance frequency. The output RF signal 918 is provided from the third capacitor 908 to the point 122.

Also, the fourth capacitor 910 modifies an impedance of the output RF signal 916 to provide an output RF signal 920. For example, the fourth capacitor 910 balances a reactance of the second filter 108 against the reactance of the RF coil 904 to provide the output RF signal 920. To illustrate, the fourth capacitor 910 has a capacitance to achieve a first reactance of the second filter 108 and a second reactance of the RF coil 904. In the illustration, the first reactance has an amplitude that is within a pre-determined range from an amplitude of the second reactance and opposite in direction to a direction of the second reactance. In the illustration, due to the capacitance of the fourth capacitor 910, the high frequency of the HF MPS 104 is a high resonance frequency. As another illustration, the fourth capacitor 910 has a capacitance that cancels a reactance of the second filter 108 against a reactance of the RF coil 904. To illustrate, the fourth capacitor 910 has a capacitance to achieve a first reactance of the second filter 108 and a second reactance of the RF coil 904. In the illustration, the first reactance is equal in amplitude and opposite in direction to the second reactance. In the illustration, due to the capacitance of the fourth capacitor 910, the high frequency of the HF MPS 104 is a high resonance frequency. The output RF signal 920 is provided from the fourth capacitor 910 to the RF coil 904.

The output RF signals 914, 916, 918, and 920 have the high frequency. The output RF signal 120A has the low frequency.

The output RF signal 918 is combined with, such as summed with, the output RF signal 120A to generate a combined RF signal 922 at the point 122. The combined RF signal 922 has a combination of the high frequency of the output RF signal 918 and the low frequency of the output RF signal 120A. The combined RF signal 922 is transferred via the RF connection 125 to the end E1 of the RF coil 114. Also, the output RF signal 920 is transferred from the fourth capacitor 910 to the end E3 of the RF coil 904.

When the combined RF signal 922 is provided to the RF coil 114 and the output RF signal 920 is provided to the RF coil 904, plasma is generated or maintained within the plasma chamber. When the plasma is generated or maintained within the plasma chamber, RF power is reflected in the form of a reflected RF signal 924 from the plasma chamber. The reflected RF signal 924 is transferred via the RF coil 114, the end E1, and the RF connection 125 to the point 122. The reflected RF signal 124 is split into the reflected RF signal 124B and a reflected RF signal 926. The reflected RF signal 124B is provided from the point 122 to the first capacitor 110. The reflected RF signal 926 is provided from the point 122 to the third capacitor 908.

The third capacitor 908 modifies an impedance of the reflected RF signal 926 to provide an RF signal 928 to the capacitor 112. For example, the third capacitor 908 receives the RF signal 928 and balances the reactances of the second filter 108 and the RF coil 904 is the same manner as that described above to provide the RF signal 928. To illustrate, the third capacitor 908 reduces an impedance of the reflected RF signal 926 to a minimum amount, such as zero or close to zero, to provide the RF signal 928.

Also, when the plasma is generated or maintained within the plasma chamber, RF power is reflected in the form of a reflected RF signal 930 from the plasma chamber. The reflected RF signal 930 is transferred via the RF coil 904 and the end E3 to the fourth capacitor 910. The fourth capacitor 910 modifies an impedance of the reflected RF signal 930 to output an RF signal 932 at its input. For example, the fourth capacitor 910 reduces an impedance of the reflected RF signal 930 to a minimum amount, such as zero or close to zero, to provide the RF signal 932. The RF signals 928 and 932 are combined at the split point 912 to generate the reflected RF signal 124A. The reflected RF signal 124A is reflected from the split point 912 towards the second capacitor 112.

In one embodiment, the second capacitor 112 is coupled to the split point 912 via an RF connection and the split point 912 is coupled to the third capacitor 908 via another RF connection. Also, the split point 912 is coupled to the capacitor bank 910 via an RF connection. Moreover, the third capacitor 908 is coupled to the point 122 via an RF connection and the fourth capacitor 910 is coupled to the end E3 via an RF connection. In this embodiment, the RF signals 124A and 120B are transferred between the second capacitor 112 and the split point 912 via the RF connection between the second capacitor 112 and the split point 912. Also, the RF signals 914 and 928 are transferred between the split point 912 and the third capacitor 908 via the RF connection between the split point 912 and the third capacitor 908. Moreover, the RF signals 916 and 932 are transferred between the split point 912 and the fourth capacitor 910 via the RF connection between the split point 912 and the fourth capacitor 910. Also, the RF signals 918 and 926 are transferred between the third capacitor 908 and the point 122 via the RF connection between the third capacitor 908 and the point 122. Furthermore, the RF signals 920 and 930 are transferred between the fourth capacitor 910 and the end E3 via the RF connection between the fourth capacitor 910 and the end E3.

FIG. 9B is a diagram of an embodiment of a system 950 to illustrate a method for providing the low frequency to multiple RF coils 114 and 902 and for providing the low frequency and the high frequency to the RF coil 904. The system 950 includes the LF MPS 102, the first filter 106, the first capacitor 110, the HF MPS 104, the second filter 108, the second capacitor 112, a signal splitter 952, and the RF coils 114 and 902. The signal splitter 952 includes a third capacitor 954 and a fourth capacitor 956.

The first capacitor 110 is coupled to the capacitors 954 and 956 via a split point 958. As an example, first capacitor 110 is coupled to the capacitors 954 and 956 via a split RF connection, such as a single RF strap that is split into two RF straps. In the example, the single RF strap is split at the split point 958. The fourth capacitor 956 is coupled to a point 960 and the third capacitor 954 is coupled to the end E1 of the RF coil 114. For example, the fourth capacitor 956 is coupled to the point 960 via an RF connection and the third capacitor 954 is coupled to the end E1 via an RF connection. Also, the second capacitor 112 is coupled to the point 960. The point 960 is coupled to the end E3 of the RF coil 904 via an RF connection 972.

The first capacitor 110 receives the filtered signal 118A and balances a reactance of the first filter 106 with the combined reactance of the RF coils 114 and 904 to provide an output RF signal 951. To illustrate, the first capacitor 110 has a capacitance to achieve a first reactance of the first filter 106 and a second reactance, which is the combined reactance of the RF coils 114 and 904. In the illustration, the first reactance has an amplitude that is within a pre-determined range from an amplitude of the second reactance and opposite in direction to a direction of the second reactance. In the illustration, due to the capacitance of the first capacitor 110, the low frequency of the LF MPS 102 is a low resonance frequency. As another illustration, the first capacitor 110 has a capacitance that cancels a reactance of the first filter 106 against the combined reactance of the RF coils 114 and 904. To illustrate, the first capacitor 110 has a capacitance to achieve a first reactance of the first filter 106 and a second reactance, which is the combined reactance of the RF coils 114 and 904. In the illustration, the first reactance is equal in amplitude and opposite in direction to the second reactance. In the illustration, due to the capacitance of the first capacitor 110, the low frequency of the LF MPS 102 is a low resonance frequency. The output RF signal 951 is provided from the first capacitor 110 to the point 958.

The output RF signal 951 is split at the split point 958 into an output RF signal 962 and an output RF signal 964. The third capacitor 954 modifies an impedance of the output RF signal 962 to provide an output RF signal 966. For example, the third capacitor 954 balances a reactance of the first filter 106 against the reactance of the RF coil 114 to provide the output RF signal 966. To illustrate, the third capacitor 954 has a capacitance to achieve a first reactance of the first filter 106 and a second reactance of the RF coil 114. In the illustration, the first reactance has an amplitude that is within a pre-determined range from an amplitude of the second reactance and opposite in direction to a direction of the second reactance. In the illustration, due to the capacitance of the third capacitor 908, the low frequency of the LF MPS 102 is a low resonance frequency. As another illustration, the third capacitor 954 has a capacitance that cancels a reactance of the first filter 106 against the reactance of the RF coil 114. To illustrate, the third capacitor 954 has a capacitance to achieve a first reactance of the first filter 106 and a second reactance of the RF coil 114. In the illustration, the first reactance is equal in amplitude and opposite in direction to the second reactance. In the illustration, due to the capacitance of the third capacitor 954, the low frequency of the LF MPS 102 is a low resonance frequency. The output RF signal 966 is provided from the third capacitor 954 to the RF coil 114.

Also, the fourth capacitor 956 modifies an impedance of the output RF signal 964 to provide an output RF signal 968. For example, the fourth capacitor 956 balances a reactance of the first filter 106 against the reactance of the RF coil 114 to provide the output RF signal 968. To illustrate, the fourth capacitor 956 has a capacitance to achieve a first reactance of the first filter 106 and a second reactance of the RF coil 114. In the illustration, the first reactance has an amplitude that is within a pre-determined range from an amplitude of the second reactance and opposite in direction to a direction of the second reactance. In the illustration, due to the capacitance of the fourth capacitor 956, the low frequency of the LF MPS 102 is a low resonance frequency. As another illustration, the fourth capacitor 956 has a capacitance that cancels a reactance of the first filter 106 against a reactance of the RF coil 114. To illustrate, the fourth capacitor 956 has a capacitance to achieve a first reactance of the first filter 106 and a second reactance of the RF coil 114. In the illustration, the first reactance is equal in amplitude and opposite in direction to the second reactance. In the illustration, due to the capacitance of the fourth capacitor 956, the low frequency of the LF MPS 102 is a low resonance frequency. The output RF signal 968 is provided from the fourth capacitor 956 to the point 960.

The output RF signals 962, 964, 966, and 968 have the low frequency. The output RF signal 120B has the high frequency.

The output RF signal 968 is combined with, such as summed with, the output RF signal 120B to generate a combined RF signal 970 at the point 960. The combined RF signal 970 has a combination of the low frequency of the output RF signal 968 and the high frequency of the output RF signal 120B. The combined RF signal 970 is transferred via the RF connection 972 to the end E3 of the RF coil 904. Also, the output RF signal 966 is transferred from the third capacitor 954 to the end E1 of the RF coil 114.

When the combined RF signal 970 is provided to the RF coil 904 and the output RF signal 966 is provided to the RF coil 114, plasma is generated or maintained within the plasma chamber, which includes the RF coils 114 and 904. When the plasma is generated or maintained within the plasma chamber, RF power is reflected in the form of a reflected RF signal 974 from the plasma chamber. The reflected RF signal 974 is transferred via the RF coil 904, the end E3, and the RF connection 972 to the point 960. The reflected RF signal 974 is split, at the point 960, into the reflected RF signal 124A and a reflected RF signal 976. The reflected RF signal 124A is provided from the point 960 to the second capacitor 112. The reflected RF signal 976 is provided from the point 960 to the fourth capacitor 956. The fourth capacitor 956 modifies an impedance of the reflected RF signal 976 to provide an RF signal 978 at its input. For example, the fourth capacitor 956 balances the reactances of the first filter 106 and the RF coil 904 in the same manner as that described above to provide the RF signal 978 to the split point 958. To illustrate, the fourth capacitor 956 reduces an impedance of the reflected RF signal 976 to a minimum amount, such as zero or close to zero, to output the RF signal 978 to the split point 958.

Also, when the plasma is generated or maintained within the plasma chamber, RF power is reflected in the form of a reflected RF signal 980 from the plasma chamber. The reflected RF signal 980 is transferred via the RF coil 114 and the end E1 to the third capacitor 954. The third capacitor 954 modifies an impedance of the reflected RF signal 980 to output an RF signal 982 at its input. For example, the third capacitor 954 balances the reactances of the first filter 106 and the RF coil 114 in the same manner as that described above to provide the RF signal 982 to the split point 958. To illustrate, the third capacitor 954 reduces an impedance of the reflected RF signal 980 to a minimum amount, such as zero or close to zero, to output the RF signal 982 to the split point 958. The RF signals 982 and 978 are combined at the split point 958 to generate the reflected RF signal 124B. The reflected RF signal 124B is reflected from the split point 958 towards the first capacitor 110.

In an embodiment, the first capacitor 110 is coupled to the split point 958 via an RF connection. Also, the split point 958 is coupled to the third capacitor 954 via an RF connection and split point 958 is coupled to the fourth capacitor 956 via an RF connection. Moreover, the third capacitor 954 is coupled to the end E1 via an RF connection and the fourth capacitor 956 is coupled to the point 960 via an RF connection. Also, the second capacitor 112 is coupled to the point 960 via an RF connection. In this embodiment, the RF signals 951 and 124B are transferred between the first capacitor 110 and the split point 958 via the RF connection between the first capacitor 110 and the split point 958. Moreover, the RF signals 962 and 982 are transferred between the split point 958 and the third capacitor 954 via the RF connection between the split point 958 and the third capacitor 954. Furthermore, the RF signals 966 and 980 are transferred between the third capacitor 954 and the end E1 via the RF connection between the third capacitor 954 and the end E1. Also, the RF signals 964 and 978 are transferred between the split point 958 and the fourth capacitor 956 via the RF connection between the split point 958 and the fourth capacitor 956. Additionally, the RF signals 968 and 976 are transferred between the fourth capacitor 956 and the point 960 via the RF connection between the fourth capacitor 956 and the point 960. Also, the RF signals 120B and 124A are transferred between the point 960 and the second capacitor 112 via the RF connection between the point 960 and the second capacitor 112.

FIG. 9C is a diagram of an embodiment of a plasma system 980 to illustrate a method for filtering the low frequency from being applied to the RF coil 904. The plasma system 980 is the same in structure and function as the plasma system 900 (FIG. 9A) except that in the plasma system 980, a filter 983 is used. Examples of the filter 983 include the high-pass filter 230 (FIG. 2B), the band-pass filter 250 (FIG. 2C), and the band-pass filter 270 (FIG. 2D).

The filter 983 is coupled between the capacitor 910 and the RF coil 904. For example, one end of the filter 983 is coupled to the capacitor 910 and an opposite end of the filter 983 is coupled to the end E3 of the RF coil 904.

In an event that the output signal 920 includes the low frequency, the filter 983 receives the output RF signal 920 from the capacitor 910 and filters out the low frequency to output a filtered signal 984. As an example, the low frequency is embedded with the output signal 920 when received by the filter 983 from the LF MPS 102 via the filter 106, the capacitor 110, the point 122, the capacitor 908, the split point 912, and the capacitor 910. The filtered signal 984 is provided to the RF coil 904. In this manner, the RF coil 904 is not damaged by the low frequency.

When the combined RF signal 922 is supplied to the RF coil 114 and the filtered signal 984 is provided to the RF coil 904, plasma is generated within the plasma chamber, which includes the RF coils 114 and 904. When the plasma is generated, RF power from the plasma is reflected in the form of a reflected RF signal 986 towards the filter 983. The filter 983 allows passage of the high frequency of the reflected RF signal 986 and filters out the low frequency of the reflected RF signal 986 to output the reflected RF signal 930. The reflected RF signal 930 is sent from the filter 983 to the capacitor 910.

Figure 9D:
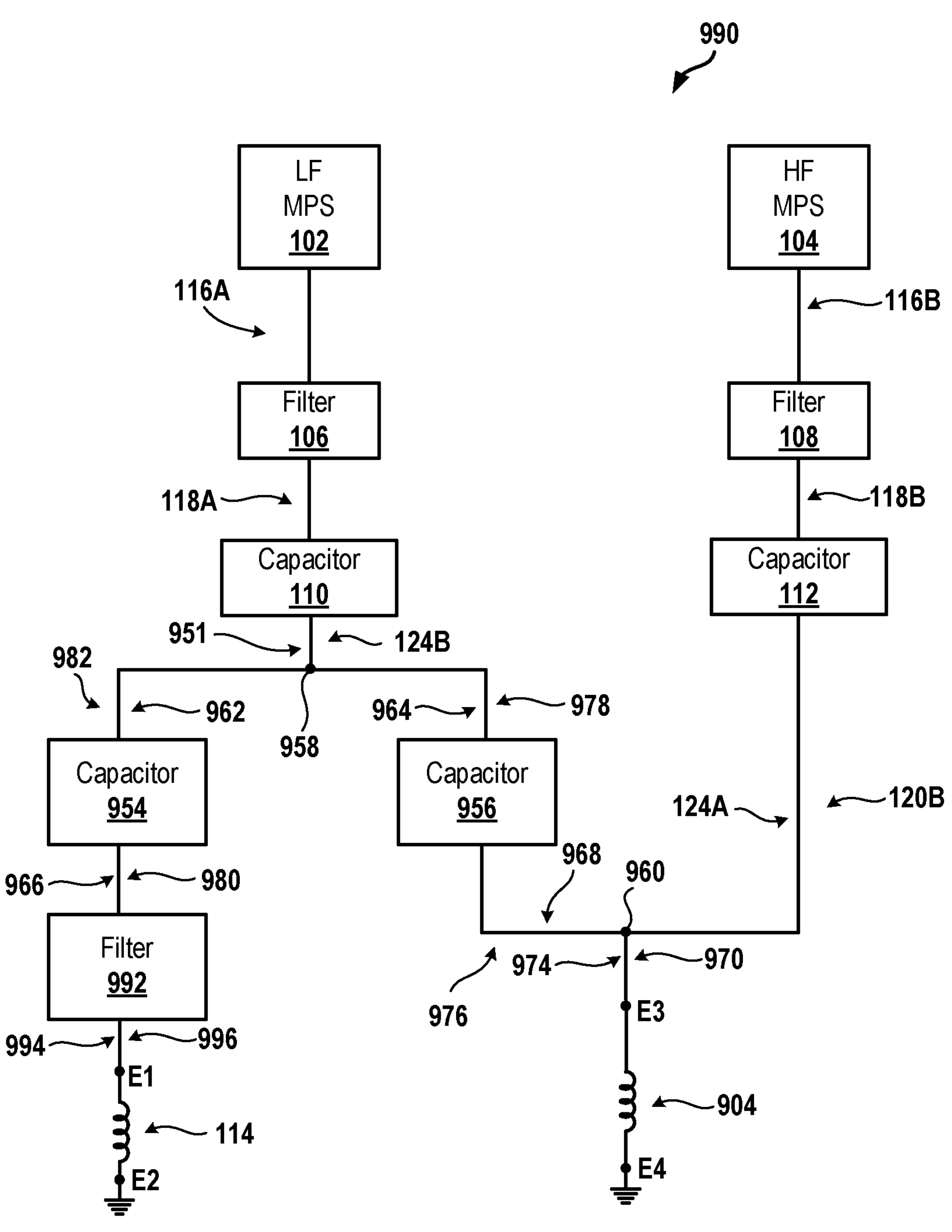
FIG. 9D is a diagram of an embodiment of a plasma system to illustrate a method for filtering the high frequency from being applied to an RF coil.

FIG. 9D is a diagram of an embodiment of a plasma system 990 to illustrate a method for filtering the high frequency from being applied to the RF coil 114. The plasma system 990 is the same in structure and function as the plasma system 950 (FIG. 9B) except that in the plasma system 990, a filter 992 is used. Examples of the filter 992 include the low-pass filter 200 (FIG. 2A), the band-pass filter 250 (FIG. 2C), and the band-pass filter 270 (FIG. 2D).

The filter 992 is coupled between the capacitor 954 and the RF coil 114. For example, one end of the filter 992 is coupled to the capacitor 954 and an opposite end of the filter 992 is coupled to the end E1 of the RF coil 114.

In an event that the output RF signal 966 includes the high frequency, the filter 992 receives the output RF signal 966 from the capacitor 954 and filters out the high frequency to output a filtered signal 994. As an example, the high frequency is embedded with the output RF signal 966 when received by the filter 992 from the HF MPS 104 via the second filter 108, the second capacitor 112, the point 960, the capacitor 956, the split point 958, and the capacitor 954. The filtered signal 994 is provided to the RF coil 114. In this manner, the RF coil 114 is not damaged by the high frequency.

When the combined RF signal 970 is supplied to the RF coil 904 and the filtered signal 994 is provided to the RF coil 114, plasma is generated within the plasma chamber, which includes the RF coils 114 and 904. When the plasma is generated, RF power from the plasma is reflected in the form of a reflected RF signal 996 towards the filter 992. The filter 992 allows passage of the low frequency of the reflected RF signal 996 and filters out the high frequency of the reflected RF signal 996 to output the reflected RF signal 980. The reflected RF signal 980 is sent from the filter 992 to the capacitor 954.

Figure 10A:
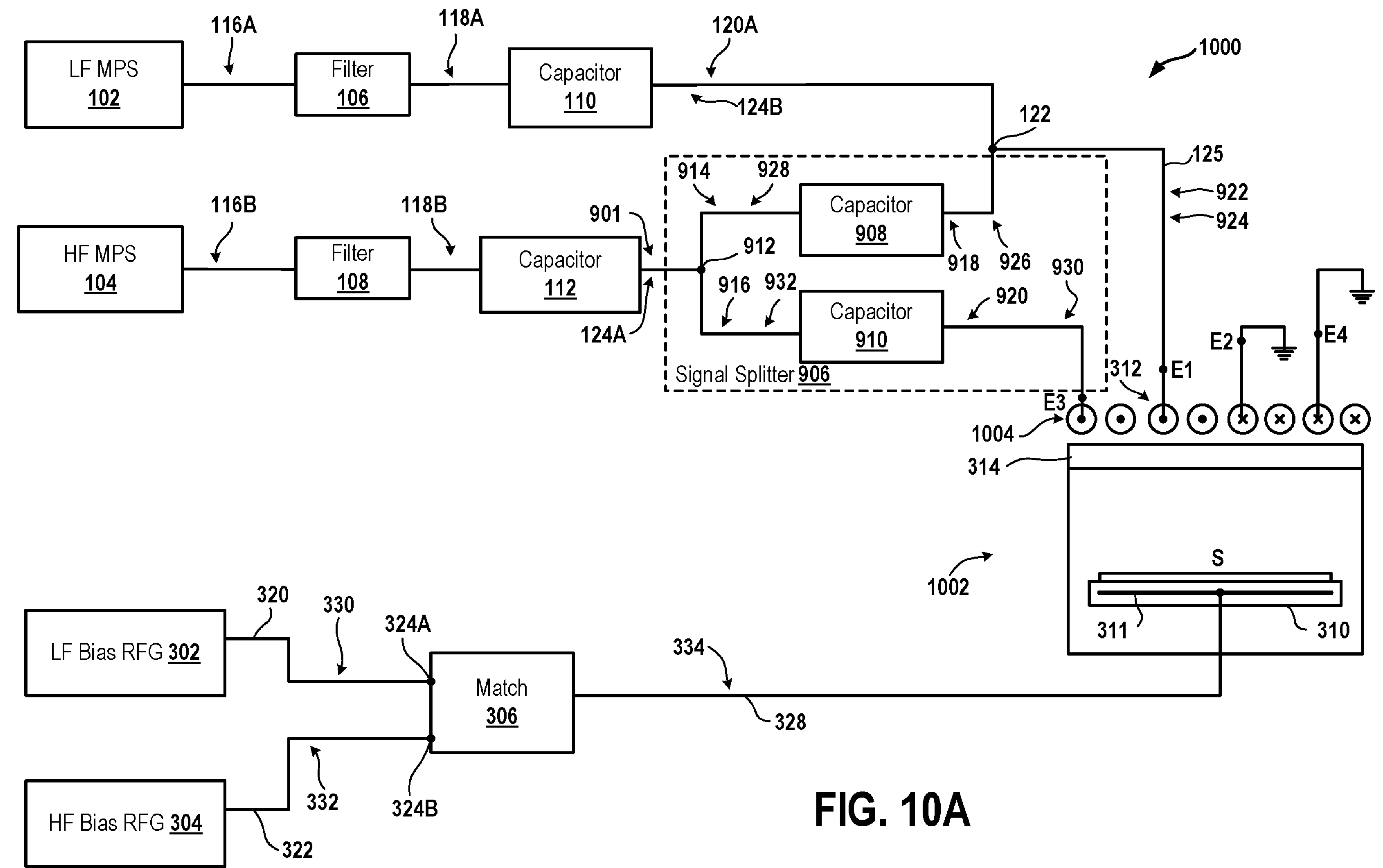
FIG. 10A is a diagram of an embodiment of a plasma system to illustrate use of a signal splitter within a plasma system.

FIG. 10A is a diagram of an embodiment of a plasma system 1000 to illustrate use of the signal splitter 906 within the plasma system 1000. The plasma system 1000 includes the LF MPS 102, the first filter 106, the first capacitor 110, the HF MPS 104, the second filter 108, the second capacitor 112, the signal splitter 906, the LF bias RFG 302, the HF bias RFG 304, the match 306, and a plasma chamber 1002. The plasma chamber 1002 is the same in structure of the plasma chamber 308 (FIG. 3A) except that the plasma chamber 1002 includes an RF coil 1004.

The RF coil 1004 is peripheral to the RF coil 312. For example, the RF coil 1004 surrounds the RF coil 312 and is located in the same horizontal plane as that of the RF coil 312. The RF coil 1004 is an example of the RF coil 904 (FIG. 9A). The capacitor 910 is coupled to the end E3 of the RF coil 1004.

When the combined RF signal 922 is supplied to the RF coil 312, the output RF signal 920 is supplied to the RF coil 1004, the modified RF signal 334 is supplied to the lower electrode 311, and the one or more processing gases are provided to the plasma chamber 1002, plasma is generated within the plasma chamber 1002. RF power of the plasma is reflected in the form of the reflected RF signals 930 and 924.

In one embodiment, the RF coil 1004 is located in a different horizontal plane than a horizontal plane in which the RF coil 302 is located.

Figure 10B:
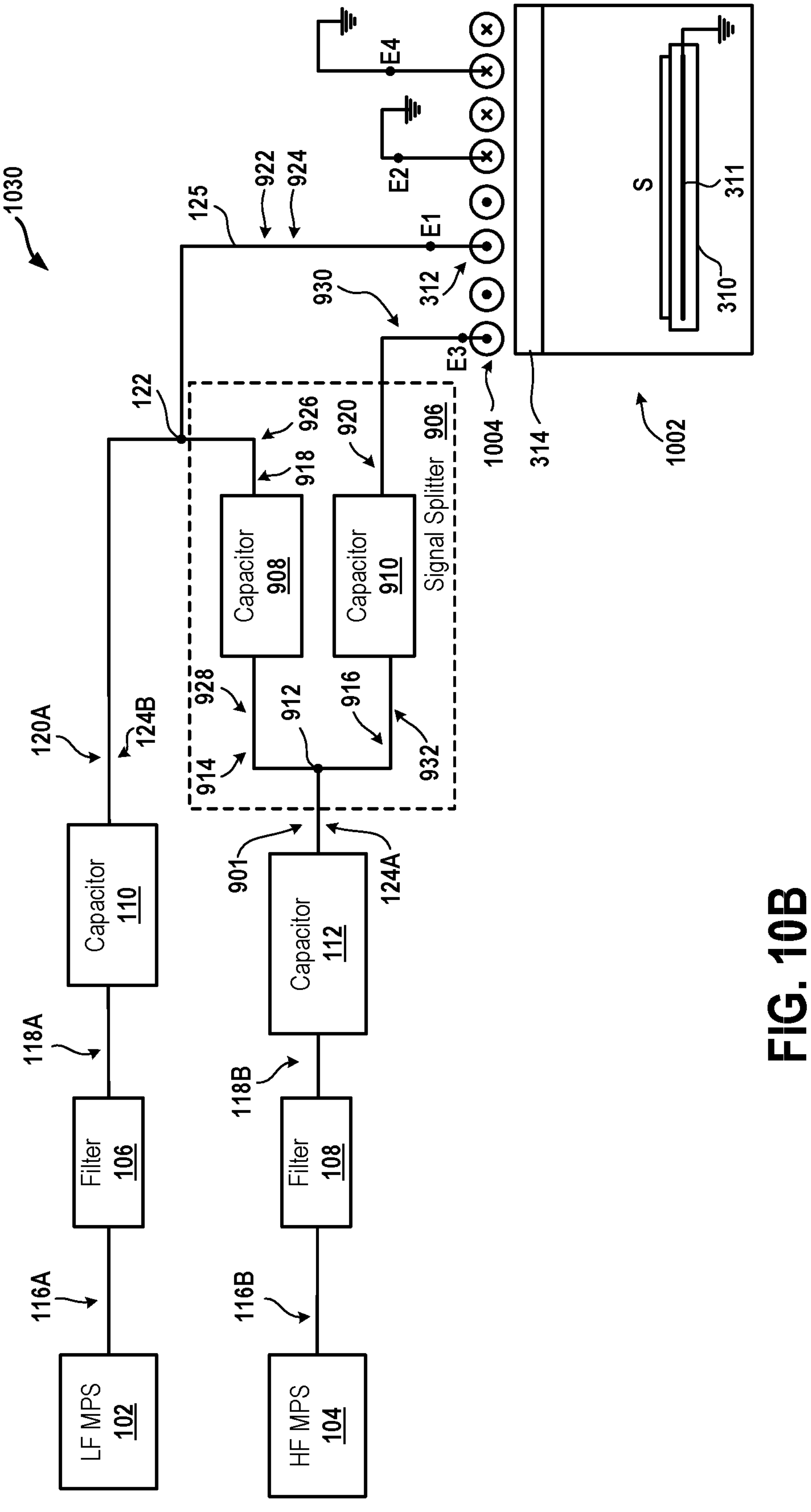
FIG. 10B is a diagram of an embodiment of a plasma system to illustrate use of the signal splitter of FIG. 10A with a plasma chamber in which the lower electrode is coupled to the ground potential.

FIG. 10B is a diagram of an embodiment of a plasma system 1020 to illustrate use of the signal splitter 906 with the plasma chamber 1002 in which the lower electrode 311 is coupled to the ground potential. The plasma system 1020 includes the LF MPS 102, the first filter 106, the first capacitor 110, the HF MPS 104, the second filter 108, the second capacitor 112, the signal splitter 906, and the plasma chamber 1002.

When the combined RF signal 922 is supplied to the RF coil 312, the output RF signal 920 is supplied to the RF coil 1004, the lower electrode 311 is coupled to the ground potential, and the one or more processing gases are provided to the plasma chamber 1002, plasma is generated within the plasma chamber 1002. RF power of the plasma is reflected in the form of the reflected RF signals 930 and 924.

Figure 10C:
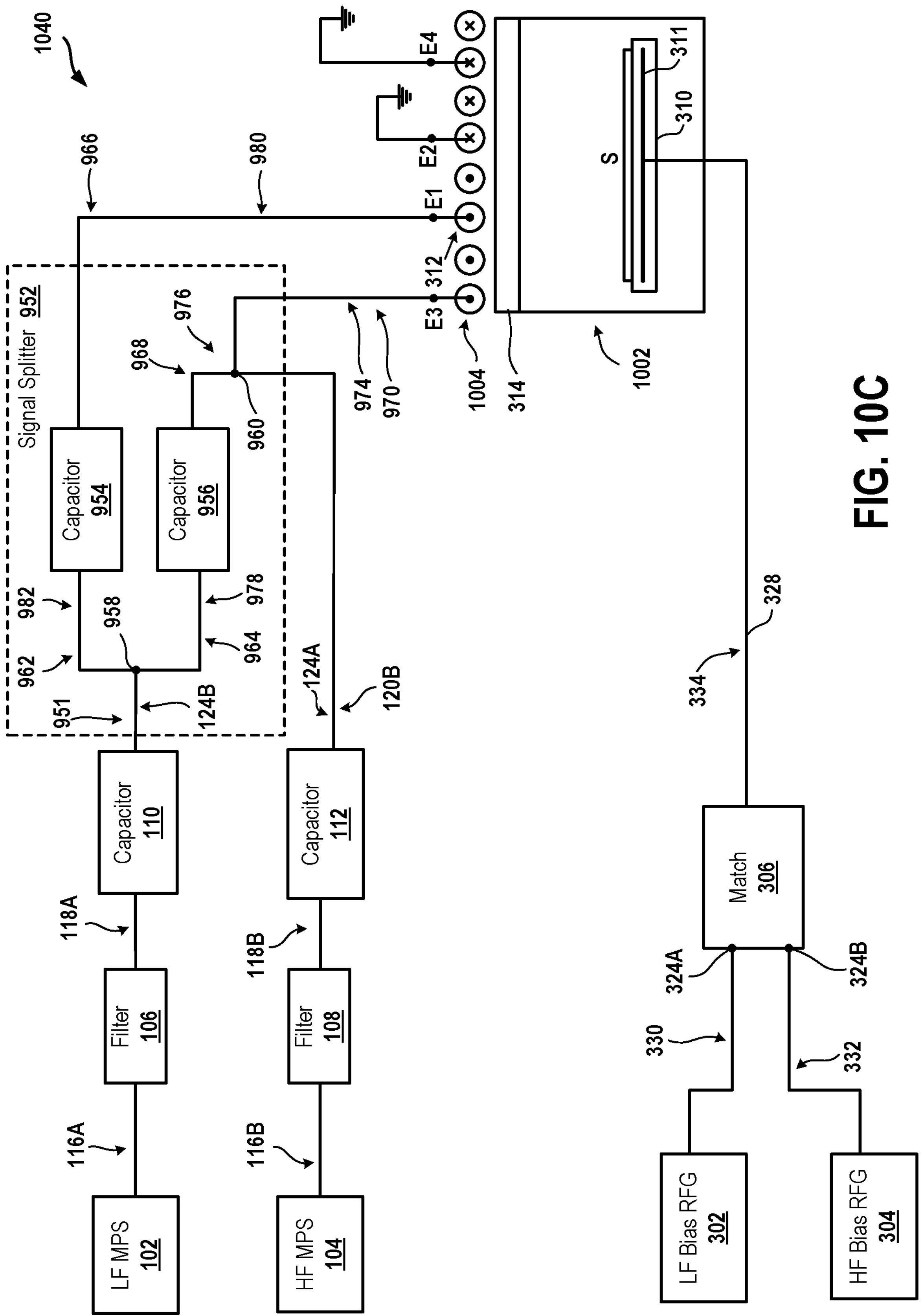
FIG. 10C is a diagram of an embodiment of a plasma system to illustrate use of another signal splitter.

FIG. 10C is a diagram of an embodiment of a plasma system 1040 to illustrate use of the signal splitter 952 in the plasma system 1040. The plasma system 1040 includes the LF MPS 102, the first filter 106, the first capacitor 110, the HF MPS 104, the second filter 108, the second capacitor 112, the signal splitter 952, the LF bias RFG 302, the HF bias RFG 304, the match 306, and the plasma chamber 1002. The point 960 is coupled to the end E3 of the RF coil 1004.

When the combined RF signal 970 is supplied to the RF coil 1004, the output RF signal 966 is supplied to the RF coil 312, the modified RF signal 334 is supplied to the lower electrode 311, and the one or more processing gases are provided to the plasma chamber 1002, plasma is generated within the plasma chamber 1002. RF power of the plasma is reflected in the form of the reflected RF signals 974 and 980.

Figure 10D:
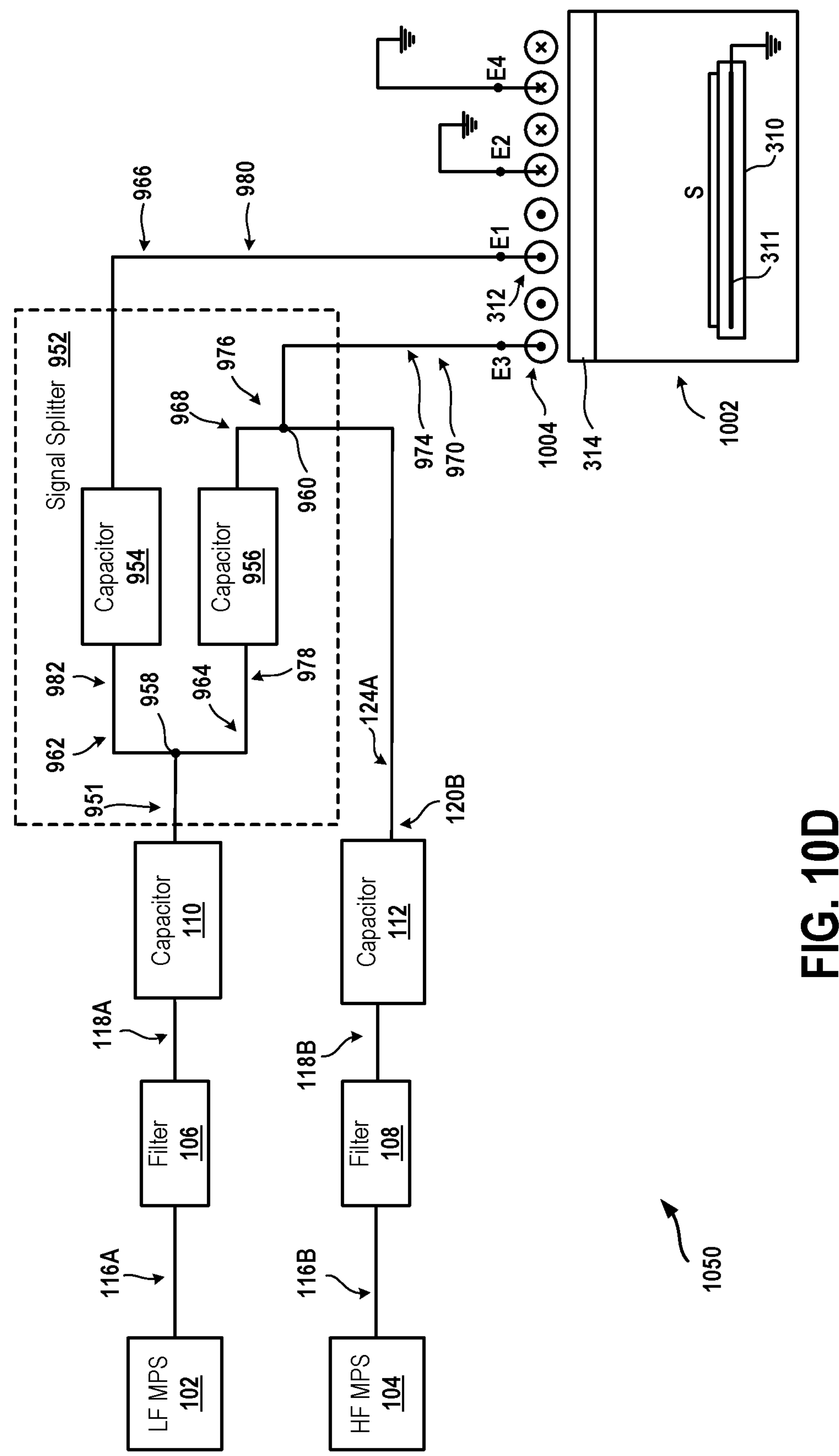
FIG. 10D is a diagram of an embodiment of a plasma system to illustrate use of the signal splitter of FIG. 10C with a plasma chamber in which the lower electrode is coupled to the ground potential.

FIG. 10D is a diagram of an embodiment of a plasma system 1050 to illustrate use of the signal splitter 952 with the plasma chamber 1002 in which the lower electrode 311 is coupled to the ground potential. The plasma system 1050 includes the LF MPS 102, the first filter 106, the first capacitor 110, the HF MPS 104, the second filter 108, the second capacitor 112, the signal splitter 952, and the plasma chamber 1002.

When the combined RF signal 970 is supplied to the RF coil 1004, the output RF signal 966 is supplied to the RF coil 312, the lower electrode 311 is coupled to the ground potential, and the one or more processing gases are provided to the plasma chamber 1002, plasma is generated within the plasma chamber 1002. RF power of the plasma is reflected in the form of the reflected RF signals 974 and 980.

FIG. 11A is an embodiment of a graph 1100 to illustrate a clock signal 1102. The graph 1100 plots a logic level of the clock signal 1102 versus time t. The clock signal 1102 transitions periodically between a logic level 1 and a logic level 0. For example, during a cycle 1 of the clock signal 1102, at a time to, the clock signal 1102 transitions from the logic level 0 to the logic level 1. During the cycle 1, the clock signal 1102 remains at the logic level 1 from the time t0 to a time t8. Further, during the cycle 1, at the time t8, the clock signal 1102 transitions from the logic level 1 to the logic level 0. The clock signal 1102 remains at the logic level 0 from the time t8 to a time t16. During a cycle 2 of the clock signal 1102, at a time t16, the clock signal 1102 transitions from the logic level 0 to the logic level 1. The cycle 2 is consecutive to the cycle 1. During the cycle 2, the clock signal 1102 remains at the logic level 1 from the time t16 to a time t24. Further, during the cycle 1, at the time t24, the clock signal 1102 transitions from the logic level 1 to the logic level 0. The clock signal 1102 remains at the logic level 0 from the time t24 to a time t32. In this manner, the logic levels 0 and 1 of the clock signal 1102 repeat periodically during additional cycles of the clock signal 1102.

FIG. 11B is an embodiment of a graph 1104 to illustrate a parameter, such as power or voltage, of an RF signal 1106 that is generated by the LF MPS 102 (FIG. 1) or the LF bias RFG 302 (FIG. 3A) or the LF source RFG 402 (FIG. 4). The RF signal 1106 is an example of the RF signal 116A (FIG. 1) or the RF signal 330 (FIG. 3A) or the RF signal 420 (FIG. 4). The RF signal 1106 is a continuous wave (CW) signal, such as a sinusoidal signal, which has a peak-to-peak parameter level of PR2 and −PR2 or a zero-to-peak amplitude of PR2. For example, the RF signal 1106 periodically oscillates between the parameter levels PR2 and −PR2 during each clock cycle of the clock signal 1102. The parameter level PR2 is greater than a parameter level PR0, which is greater than the parameter level −PR2.

FIG. 11C is an embodiment of a graph 1108 to illustrate the parameter of an RF signal 1110 that is generated by the HF MPS 104 (FIG. 1) or the HF bias RFG 304 (FIG. 3A) or the HF source RFG 404 (FIG. 4). The graph 1108 plots the parameter of the RF signal 1110 on a y-axis and the time t on an x-axis The RF signal 1110 is an example of the RF signal 116B (FIG. 1) or the RF signal 332 (FIG. 3A) or the RF signal 422 (FIG. 4). The RF signal 1110 is a continuous wave signal, which has a peak-to-peak parameter level of PRb and −PRb or a zero-to-peak amplitude of PRb. For example, the RF signal 1110 periodically oscillates between the parameter levels PRb and −PRb during each clock cycle of the clock signal 1102. The parameter level PRb is greater than a parameter level PR0, which is greater than the parameter level −PRb. As an example, the parameter level PRb is lower than the parameter level PR2 and the parameter level −PRb is higher than the parameter level −PR2. As another example, the parameter level PR2 is lower than the parameter level PRb and the parameter level −PR2 is higher than the parameter level −PRb.

It should be noted that a frequency of oscillation of the RF signal 1110 is greater than a frequency of oscillation of the RF signal 1106. As such, the RF signal 1110 has a greater frequency than the RF signal 1106.

FIG. 11D is an embodiment of a graph 1112 to illustrate an RF signal 1114, which is pulsed between the parameter levels PR2 and −PR2 and the parameter levels PR1 and −PR1. The graph 1112 plots the parameter of the RF signal 1114 on a y-axis and the time t on an x-axis. The parameter levels PR2 and −PR2 represent a state S1 of the parameter of the RF signal 1114. Also, the parameter levels PR1 and −PR1 represent a state S2 of the parameter of the RF signal 1114. The parameter level PR1 is lower than the parameter level PR2 and higher than the parameter level PR0. Similarly, the parameter level −PR1 is higher than the parameter level −PR2 and lower than the parameter level PR0. The RF signal 1114 is an example of the RF signal 116A (FIG. 1) or the RF signal 330 (FIG. 3A) or the RF signal 420 (FIG. 4).

During the cycle 1 of the clock signal 1102, at the time t0, the parameter of the RF signal 1114 pulses, such as transitions, from the parameter level PR1 to the parameter level PR2 and from the parameter level −PR1 to the parameter level −PR2. The RF signal 1114 oscillates between the parameter levels PR2 and −PR2 from the time t0 to the time t8. Also, a peak-to-peak parameter level of the RF signal 1114 from the time t0 to the time t8 is PR2 and −PR2.

Further, during the cycle 1 of the clock signal 1102, at the time t8, the parameter of the RF signal 1114 pulses from the parameter level PR2 to the parameter level PR1 and from the parameter level −PR2 to the parameter level −PR1. The RF signal 1114 oscillates between the parameter levels PR1 and −PR1 from the time t8 to the time t16. Also, a peak-to-peak parameter level parameter level of the RF signal 1114 from the time t8 to the time t16 is PR1 and −PR1. In a similar manner, the parameter levels PR2 and −PR2 and the parameter levels PR1 and −PR1 repeat during the cycle 2 of the clock signal 1102.

FIG. 11E is an embodiment of a graph 1116 to illustrate an RF signal 1118, which is pulsed between the parameter level PRb and a parameter level PRa and between the parameter level −PRb and a parameter level −PRa. The graph 1116 plots the parameter of the RF signal 1118 on a y-axis and the time t on an x-axis. The parameter levels PRb and −PRb represent a state S1 of the parameter of the RF signal 1118. Also, the parameter levels PRa and −PRa represent a state S2 of the parameter of the RF signal 1118. The parameter level PRa is lower than the parameter level PRb and higher than the parameter level PR0. Similarly, the parameter level −PRa is higher than the parameter level −PRb and lower than the parameter level PR0. The RF signal 1118 is an example of the RF signal 116B (FIG. 1) or the RF signal 332 (FIG. 3A) or the RF signal 422 (FIG. 4).

During the cycle 1 of the clock signal 1102, at the time to, the parameter of the RF signal 1118 pulses from the parameter level PRa to the parameter level PRb and from the parameter level −PRa to the parameter level −PRb. The RF signal 1118 oscillates between the parameter levels PRb and −PRb from the time t0 to the time t8.

Further, during the cycle 1 of the clock signal 1102, at the time t8, the parameter of the RF signal 1118 pulses from the parameter level PRb to the parameter level PRa and from the parameter level −PRb to the parameter level −PRa. The RF signal 1118 oscillates between the parameter levels PRa and −PRa from the time t8 to the time t16. Also, the peak-to-peak parameter level of the RF signal 1118 from the time t8 to the time t16 is PRa and −PRa. In a similar manner, the parameter levels PRb and −PRb and the parameter levels PRa and −PRa repeat during the cycle 2 of the clock signal 1102. It should be noted that a frequency of oscillation of the RF signal 1118 is greater than a frequency of oscillation of the RF signal 1114.

FIG. 11F is an embodiment of the graph 1112 of the RF signal 1114.

FIG. 11G is an embodiment of a graph 1120 to illustrate a pulsing of an RF signal 1122 to be out of phase with pulsing of the RF signal 1114 (FIG. 11F). The graph 1120 plots the parameter of the RF signal 1122 versus the time t. The RF signal 1122 is an example of the RF signal 116B (FIG. 1) or the RF signal 332 (FIG. 3A) or the RF signal 422 (FIG. 4).

During the cycle 1 of the clock signal 1102, from the time t0 to a time t2, the parameter of the RF signal 1122 pulses between the parameter levels PRa and −PRa. Further, during the cycle 1 of the clock signal 1102, at the time t2, the parameter of the RF signal 1122 pulses from the parameter level PRa to the parameter level PRb and from the parameter level −PRa to the parameter level −PRb. The parameter levels PRa and −PRa represent a state S1 of the parameter of the RF signal 1122. Also, the parameter levels PRb and −PRb represent a state S2 of the parameter of the RF signal 1122. The time t2 occurs after the time t0. During the cycle 1 of the clock signal 1102, from the time t2 to a time t10, the parameter of the RF signal 1122 pulses between the parameter levels PRb and −PRb. The time t10 occurs after the time t8.

Also, during the cycle 1 of the clock signal 1102, at the time t10, the parameter of the RF signal 1122 pulses from the parameter level PRb to the parameter level PRa and from the parameter level −PRb to the parameter level −PRa. The RF signal 1122 oscillates between the parameter levels PRa and −PRa from the time t10 to the time t16. In a similar manner, the parameter levels PRa and −PRa and the parameter levels PRb and −PRb repeat during the cycle 2 of the clock signal 1102. It should be noted that a frequency of oscillation of the RF signal 1122 is greater than a frequency of oscillation of the RF signal 1114.

The parameter levels PRb and PRa of the RF signal 1122 are pulsed out of phase with the pulsing of the parameter levels PR2 and PR1 of the RF signal 1114, and the parameter levels −PRb and −PRa of the RF signal 1122 are pulsed out of phase with the parameter levels −PR2 and −PR1 of the RF signal 1114. As an example, during the cycle 1 of the clock signal 1102 (FIG. 11A), instead of transitioning from the parameter level PRa to the parameter level PRb at the time to, the parameter of the RF signal 1122 transitions from the parameter level PRa to the parameter level PRb at the time t2. As another example, during the cycle 1 of the clock signal 1102 (FIG. 11A), instead of transitioning from the parameter level PRb to the parameter level PRa at the time t8, the parameter of the RF signal 1122 transitions from the parameter level PRb to the parameter level PRa at the time t10. As yet another example, during the cycle 2 of the clock signal 1102, instead of transitioning from the parameter level PRa to the parameter level PRb at the time t16, the parameter of the RF signal 1122 transitions from the parameter level PRa to the parameter level PRb at a time t18. The time t18 occurs after the time t16.

In one embodiment, the parameter of an RF signal, similar to the RF signal 1122, transitions from the parameter level PRb to the parameter level PRa at a time t6 instead of the time t10. The time t6 occurs before the time t8. Also, the parameter of the RF signal transitions from the parameter level PRa to the parameter level PRb at a time t14 instead of the time t18. The time t14 occurs before the time t16.

FIG. 11H is an embodiment of the graph 1112 of the RF signal 1114.

FIG. 11I is an embodiment of a graph 1124 to illustrate a pulsing frequency of the parameter of the RF signal 1114 (FIG. 11F) is less than a pulsing frequency of the parameter of an RF signal 1126. The graph 1124 plots the parameter of the RF signal 1126 versus the time t. The RF signal 1126 is an example of the RF signal 116B (FIG. 1) or the RF signal 332 (FIG. 3A) or the RF signal 422 (FIG. 4).

During the cycle 1 of the clock signal 1102, at the time to, the parameter of the RF signal 1126 pulses from the parameter level PRa to the parameter level PRb and from the parameter level −PRa to the parameter level −PRb. The parameter levels PRb and −PRb represent a state S1 of the parameter of the RF signal 1126. Also, the parameter levels PRa and −PRa represent a state S2 of the parameter of the RF signal 1126. The parameter levels of the RF signal 1126 from the time t0 to the time t16 are PRb and −PRb. For example, the RF signal 1126 oscillates between the parameter levels PRb and −PRb from the time to to the time t16.

Further, during the cycle 2 of the clock signal 1102, at the time t16, the parameter of the RF signal 1126 pulses from the parameter level PRb to the parameter level PRa and from the parameter level −PRb to the parameter level −PRa. During the cycle 2 of the clock signal 1102, the parameter levels of the RF signal 1126 from the time t16 to a time t32 are PRa and −PRa. For example, the RF signal 1126 oscillates between the parameter levels PRa and −PRa from the time t16 to the time t32. The time t32 occurs after the time t16. In a similar manner, the parameter levels PRa and −PRa and the parameter levels PRb and −PRb repeat during a cycle 3 of the clock signal 1102. The cycle 3 is consecutive to the cycle 2 of the clock signal 1102. It should be noted that a frequency of oscillation of the RF signal 1126 is greater than a frequency of oscillation of the RF signal 1114.

The parameter levels PR2, −PR2, PR1, and −PR1 of the RF signal 1114 have a greater pulsing frequency than the parameter levels PRb, −PRb, PRa, and −PRa of the RF signal 1126. As an example, during the cycle 1 of the clock signal 1102 (FIG. 11A), the parameter of the RF signal 1114 is pulsed twice and the parameter level of the RF signal 1126 is pulsed once. To illustrate, during the cycle 1 of the clock signal 1102, the parameter of the RF signal 1114 is pulsed for a first instance at the time t0 and for a second instance at the time t8. In the illustration, during the cycle 1 of the clock signal 1102, the parameter of the RF signal 1126 is pulsed once at the time t0. In such a manner, during each cycle of the clock signal 1102, the parameter of the RF signal 1114 is pulsed with a greater pulsing frequency than the parameter of the RF signal 1126.

Also, a duty cycle of pulsing of the parameter of the RF signal 1114 is different from a duty cycle of pulsing of the parameter of the RF signal 1126. For example, the duty cycle of pulsing of the parameter of the RF signal 1114 is 50% and the duty cycle of pulsing of the parameter of the RF signal 1126 is 100%. To illustrate, the parameter level of the RF signal 1114 is PR2 for half of a time period of each clock cycle of the clock signal 1102 (FIG. 11A). In the illustration, the parameter level of the RF signal 1126 is PRb during the entire time period of each clock cycle of the clock signal 1102.

In one embodiment, a pulsing frequency of the parameter of another RF signal, similar to the RF signal 1126, is greater than the pulsing frequency of the parameter of the RF signal 1114. For example, during each cycle of the clock signal 1102, the parameter of the other RF signal pulses three times. To illustrate, the parameter of the other RF signal pulses at the time t0 from the parameter level PRa to the parameter level PRb, pulses at a time t4 from the parameter level PRb to the parameter level PRa, and pulses at the time t8 from the parameter level PRa to the parameter level PRb. The time t4 occurs after the time to and before the time t8.

It should be noted that pulsing of the parameter of any RF signals, described herein, between a set of positive parameter levels, such as from PRa to PRb or vice versa, occurs in synchronization with pulsing of the parameter of the RF signal between a set of negative parameter levels, such as from −PRa to −PRb or vice versa. For example, the parameter of the RF signal 1114 transitions from the parameter level PR1 to the parameter level PR2 at the time t0. In the example, the parameter of the RF signal 1114 simultaneously transitions from the parameter level −PR1 to the parameter level −PR2 at the time t0. As another example, the parameter of the RF signal 1114 transitions from the parameter level PR2 to the parameter level PR1 at the time t8. In the example, the parameter of the RF signal 1114 simultaneously transitions from the parameter level −PR2 to the parameter level −PR1 at the time t8.

FIG. 12A-1 is a diagram of an embodiment of a system 1200 to illustrate details of an MPS 1202. The MPS 1202 is an example of any of the LF MPS 102 and the HF MPS 104 (FIG. 1). The system 1200 includes the MPS 1202 and a host computer 1204. The host computer 1204 includes a processor 1206 and the memory device 1208. The processor 1206 is coupled to the memory device 1208. Examples of a processor, as used herein, include an application specific integrated circuit (ASIC), a programmable logic device (PLD), a microprocessor, microcontroller, and a central processing unit (CPU). Examples of a memory device, as used during, include a random access memory (RAM) and a read-only memory (ROM). To illustrate, the memory device is a flash memory or a redundant array of independent disks (RAID).

The MPS 1202 includes an input section 1210, an output section 1212, and a reactive circuit 1214. An example of the input section 1210 includes a signal generator and a portion of a gate driver. An example of the signal generator is a square wave oscillator that generates a square wave signal, such as a digital waveform or a pulse train. The square wave signal is sometimes referred to herein as a square waveform. The square waveform pulses between a first logic level, such as high or one, and a second logic level, such as low or zero. An example of the output section 1212 includes the remaining portion of the gate driver and a half-bridge transistor circuit. Further, an example of the reactive circuit 1214 includes a variable capacitor. Another example of the reactive circuit 1214 includes a fixed capacitor.

The input section 1210 is coupled to the output section 1212, which is further coupled to the reactive circuit 1214. The reactive circuit 1214 is coupled via an RF connection 1510 to a filter 1218. The filter 1218 is an example of any of the filters 106 and 108 (FIG. 1). For example, when the MPS 1202 is an example of the LF MPS 102, the filter 1218 is an example of the first filter 106. In the example, when the MPS 1202 is an example of the LF MPS 104, the filter 1218 is an example of the second filter 108. The processor 1206 is coupled to the input section 1210 via a transfer cable 1226. An example of a transfer cable, as used herein, includes a cable that allows a transfer of data in a serial manner or in a parallel manner or via a universal serial bus (USB) protocol.

The processor 1206 generates a recipe signal 1224. The recipe signal 1224 includes one or more parameter levels of the parameter of an RF signal 1222 to be output from the MPS 1202. The recipe signal 1224 further includes a frequency of the RF signal 1222. For example, the recipe signal 1224 includes a frequency of operation of the MPS 1202. Also, the recipe signal 1224 includes one or more transition times. For example, in case the recipe signal 1224 indicates that two parameter levels of the RF signal 1222 are to be achieved during each cycle of the clock signal 1102 (FIG. 11A), the recipe signal 1224 further includes a time for transitioning from a first one of the parameter levels to a second one of the parameter levels and a time for transitioning from the second one of the parameter level to the first one of the parameter levels. The recipe signal 1224 is sent from the processor 1206 to the input section 1210 via the transfer cable 1226.

In response to receiving the recipe signal 1224, the input section 1210 generates multiple square wave signals and provides the square wave signals to the output section 1212. Each of the square wave signals has the frequency received within the recipe signal 1224. The output section 1212 generates an amplified square waveform based on the multiple square wave signals received from the input section 1210. Moreover, the output section 1212 shapes an envelope, such as a peak-to-peak magnitude or a zero-to-peak magnitude, of the amplified square waveform. For example, a shaping control signal 1220 is supplied from the input section 1210 to the output section 1212 to generate the envelope. As an example, the input section 1210 generates the shaping control signal 1220 based on the one or more parameter levels and the one or more transition times, received within the recipe signal 1224. The shaping control signal 1220 has multiple voltage values for shaping the amplified square waveform. For example, a first voltage value shapes the amplified square waveform to have a first parameter level and a second voltage value shapes the amplified square waveform to have a second parameter level.

The amplified square waveform that is shaped is sent from the output section 1212 to the reactive circuit 1214. The reactive circuit 1214 removes, such as filters out, higher-order harmonics of the amplified square waveform to generate the RF signal 1222, which is a shaped sinusoidal waveform having a fundamental frequency. The fundamental frequency is the frequency received from the recipe signal 1224. The RF signal 1222 is an example of the RF signal 116A or 116B. For example, when the MPS 1202 is an example of the LF MPS 102, the RF signal 1222 is an example of the RF signal 116A. In the example, when the MPS 1202 is an example of the LF MPS 104, RF signal 1222 is an example of the RF signal 116B. The shaped sinusoidal waveform has the envelope that has a shape, such as a digital pulse shape, or a continuous wave shape, or an arbitrary pulse shape, or a multi-level pulse shape. The multiple-level pulse shape has multiple parameter levels of the RF signal 1222.

The RF signal 1222 is sent from the reactive circuit 1214 via the connection 1216 to the filter 1218. An example of the MPS 1202 is provided in U.S. Pat. No. 10,264,663, which is incorporated by reference herein in its entirety.

In some embodiments, the input section 1210 includes a controller board having the signal generator and further includes the gate driver, and the output section includes the half-bridge transistor circuit. The controller board includes a controller coupled to the signal generator to control the signal generator to generate the square wave signal at a pre-determined frequency, such as the high frequency or the low frequency.

FIG. 12A-2 is a diagram of an embodiment of a system 1250 to illustrate further details of the input section 1210 and the output section 1212. The input section 1210 includes a controller 1252, a signal generator 1254, and a gate driver system 1256. The output section includes an FET circuit 1258, a direct current (DC) voltage source 1262, and a field-effect transistor (FET) circuit 1258. An example of a controller, as used herein, include a combination of a processor and a memory device, and the processor is coupled to the memory device.

An example of the signal generator 1254 is a square wave oscillator that generates a square wave signal, such as a square waveform, which is a digital waveform or a pulse train. The square waveform pulses periodically and has square-shaped pulses. For example, the square waveform transitions during each cycle of the clock signal 1102 (FIG. 11A) between a first logic level, such as high or one, and a second logic level, such as low or zero. The signal generator 306 generates the square wave signal at the high frequency or the low frequency. An example of the gate driver system 1256 includes a combination of a first gate driver, a second gate driver, and a NOT gate. The second gate driver is coupled to the NOT gate. An example of the FET circuit 1258 is a half-bridge FET circuit. To illustrate, the half-bridge FET circuit has a first transistor and a second transistor, and both the first and second transistors are coupled to each other. To further illustrate, a drain of the first transistor is coupled to the DC voltage source 1262, a source of the first transistor is coupled to a drain of the second transistor, and a source of the second transistor is coupled to the ground potential. Also, the first gate driver of the gate driver system 1256 is coupled to a gate of the first transistor and the NOT gate of the gate driver system 1256 is coupled to a gate of the second transistor. An output of the FET circuit 1258 is between the source of the first transistor and the drain of the second transistor.

The processor 1206 is coupled to the controller 1252 via the transfer cable 1226. The controller 1252 is coupled to the signal generator 1254. The signal generator 1254 is coupled to the inputs of the first and second gate drivers of the gate driver system 1256. An output of the first gate drive and an output of the NOT gate is coupled to the FET circuit 1258. The FET circuit 1258 is coupled to the DC voltage source 1262 and to the reactive circuit 1214.

The controller 1252 receives the recipe signal 1224 from the processor 1206 via the transfer cable 1226. Upon receiving the recipe signal 1224, the controller 1252 identifies the frequency of the RF signal 1222 to be generated by the MPS 1202 and identifies the one or more parameter levels and the one or more transition times between the parameter levels from the recipe signal 1224. The processor 1206 generates a trigger signal, such as a turn on command signal, and provides the trigger signal to the controller 1252 via the transfer cable 1226. For example, the processor 1206 sends the trigger signal to the controller 1252 after a predetermined amount of time. To illustrate, the processor 1206 sends the trigger signal to the controller 1252 of the LF MPS 102 (FIG. 1) after the pre-determined amount of time since the trigger signal is sent to the controller 1252 of the HF MPS 104 (FIG. 1). Until the trigger signal is received, the LF MPS 102 and the HF MPS 104 are turned off.

Upon receiving the trigger signal, the controller 1252 provides the frequency to the signal generator 1254. Also, upon receiving the trigger signal, the controller 1252 generates the shaping control signal 1220 based on the one or more parameter levels and the one or more transition times. The controller 1252 provides the shaping control signal 1220 to the DC voltage source 1262.

Upon receiving the frequency, the signal generator 1254 generates a square wave signal 1264 and provides the square wave signal 1264 to the gate drivers of the gate driver system 1256. The first gate driver of the gate driver system 1256 amplifies the parameter of the square wave signal 1264 to output a first amplified square wave signal 1266. The second gate driver of the gate driver system 1256 amplifies the parameter of the square wave signal 1264 to output a second amplified square wave signal and provides the second amplified square wave signal to the NOT gate. The NOT gate inverts the second amplified square wave signal to output an inverted signal 1268, which is also square wave signal.

The signals 1266 and 1268 are provided to the gates of the FET circuit 1258. The first transistor of the FET circuit 1258 turns on and off according to the first amplified square wave signal 1266 and the second transistor of the FET circuit 1258 turns on and off according to the inverted signal 1268 to output an amplified square wave signal 1272 at the output of the FET circuit 1258.

Upon receiving the shaping control signal 1220, the DC voltage source 1262 provides a voltage signal 1270 to the FET circuit 1258. The voltage signal 1270 has voltage levels that are pulsed according to the one or more transition times indicated by shaping control signal 1220. Moreover, the voltage signal 1270 has one or more voltage levels that are generated based on the one or more parameter levels indicated by the shaping control signal 1220. The parameter of the amplified square wave signal 1272 is pulsed at the one or more transition times indicated by the voltage signal 1270 and has the one or more parameter levels also indicated by the voltage signal 1270. The reactive circuit receives the amplified square wave signal 1272 and removes harmonics from the amplified square wave signal 1272 to output the RF signal 1222 having a fundamental frequency, such as the high or low frequency.

It should be noted that in case the RF signal 1222 is a continuous wave signal, the recipe signal 1224 includes a single parameter level and no transition times. Upon receiving the recipe signal 1224, the controller 1252 generated the shaping control signal 1220 to indicate the single parameter level and the lack of transition times. In response to receiving the shaping control signal 1220, the DC voltage source 1262 generates the voltage signal 1270 having a single voltage level. Upon receiving the single voltage level and the signals 1266 and 1268, the FET circuit 1258 outputs the amplified square waveform 1262 having the single parameter level based on the single voltage level.

When the processor 1206 sends a turn off command signal to the controller 1252 via the transfer cable 1226, the controller 1252 sends a turn off control signal to the signal generator 1254. For example, the processor 1206 sends the turn off command signal to the controller 1252 after a predetermined amount of time. Upon receiving the turn off control signal, the signal generator 1254 stops generating the square wave signal 1264, and the MPS 1202 does not generate the RF signal 1222.

FIG. 12B is a diagram of an embodiment of a system 1280 to illustrate details of an RF generator 1280. The system 1280 includes the host computer 1204 and the RF generator 1282. The RF generator 1282 is an example of any the LF source RFG 402, the HF source RFG 404, the LF bias RFG 302, and the HF bias RF 304 (FIGS. 3A and 4).

The RF generator 1282 includes a digital signal processor (DSP) 1284, a parameter controller PRS1, a parameter controller PRS2, a frequency controller FC, a driver DRVR, and a power supply PS. An example of a driver, as used herein, includes one or more transistors. An example of the power supply PS is an oscillator that generates a sinusoidal RF signal.

The processor 1206 is coupled to the DSP 1284 via a transfer cable 1290. The DSP 1284 is coupled to the parameter controllers PRS1 and PRS2, and the frequency controller FC. The frequency controller FC and the parameter controllers PRS1 and PRS2 are coupled to the driver DRVR, which is coupled to the power supply PS. The DSP 1284 is coupled to the driver DRVR.

The processor 1206 generates a recipe signal 1286 and provides the recipe signal 1286 to the DSP 1284 via the transfer cable 1290. As an example, the recipe signal 1286 includes a first parameter level of an RF signal 1288 to be generated by the RF generator 1282, a second parameter level of the RF signal 1288, and a frequency of the RF signal 1288. The RF signal 1288 is an example of any of the RF signals 330, 332, 420, and 422 (FIGS. 3A and 4). Also, in the example, the first parameter level represents a state S1 of the RF signal 1288 and the second parameter level represents a state S2 of the RF signal 1288, the recipe signal 1286 includes a first transition time of a transition from the second parameter level to the first parameter level and a second transition time of a transition from the first parameter level to the second parameter level during each clock cycle of the clock signal 1102 (FIG. 11A).

The DSP 1284 receives the recipe signal 1286 from the processor 1206 and identifies the first and second parameter levels from the recipe signal 1286. Also, the DSP 1284 identifies the first and second transition times from the recipe signal 1286. The DSP 1284 provides the first parameter level and the first transition time to the parameter controller PRS1 and the second parameter level and a second transition time to the parameter controller PRS2. The parameter controller PRS1 stores the first parameter level and the first transition time within a memory device of the parameter controller PRS1 and the parameter controller PRS2 stores the second parameter level and the second transition time within a memory device of the parameter controller PRS2. Also, the DSP 1284 provides the frequency to the frequency controller FC. The frequency controller FC stores the frequency within a memory device of the frequency controller FC.

The processor 1206 generates and sends the trigger signal via the transfer cable 1290 to the DSP 1284. For example, the processor 1206 sends the trigger signal to the DSP 1284 after a predetermined amount of time. To illustrate, the processor 1206 sends the trigger signal to the DSP 1284 of the LF source RFG 402 after the pre-determined amount of time since the trigger signal is sent to the DSP 1284 of the HF source RFG 404.

Upon receiving the trigger signal, such as a digital pulse, from the processor 1206, the DSP 1284 sends the trigger signal to the parameter controllers PRS1 and PRS2 and to the frequency controller FC. Upon receiving the trigger signal, the parameter controller PRS1 generates a control signal at the first transition time based on the first parameter level for the state S1 and sends the control signal to the driver DRVR. Also, upon receiving the trigger signal, the frequency controller FC generates a control signal and sends the control signal to the driver DRVR. In response to receiving the control signal from the parameter controller PRS1 and the frequency controller FC, the driver generates a drive signal for the state S1 and sends the drive signal to the power supply PS. The power supply PS generates the first parameter level of the RF signal 1288 at the first transition time in response to receiving the drive signal for the state S1.

Furthermore, upon receiving the trigger signal, the parameter controller PRS2 generates a control signal at the second transition time based on the second parameter level for the state S2 and sends the control signal to the driver DRVR. In response to receiving the control signal from the parameter controller PRS2 and the frequency controller FC, the driver generates a drive signal for the state S2 and sends the drive signal to the power supply PS. The power supply PS generates the second parameter level of the RF signal 1288 at the second transition time in response to receiving the drive signal for the state S2. In this manner, the parameter of the RF signal 1288 transitions from the second parameter level to the first parameter level at the first transition time and from the first parameter level to the second parameter level at the second transition time.

When the processor 1206 sends the turn off command signal to the DSP 1284 via the transfer cable 1290, the DSP 1284 sends the turn off control signal to the driver DRVR. For example, the processor 1206 sends the turn off command signal to the DSP 1284 after a predetermined amount of time. Upon receiving the turn off control signal, the driver DRVR stops sending the drive signal to the power supply PS. When the drive signal is not received, the power supply PS turns off and stops generating the RF signal 1288.

In one embodiment, in case an RF signal to be generated by the RF generator 1282 includes a single parameter level, such as the first parameter level, another RF generator is used. The other RF generator has the same structure as the RF generator 1282 except that the other RF generator excludes the parameter controller PRS2. The processor 1206 generates another recipe signal and provides the other recipe signal to the DSP 1284. As an example, the other recipe signal is similar to the recipe signal 1286 except the other recipe signal excludes the first and second transition times and excludes the second parameter level for the state S2. The DSP 1284 receives the other recipe signal from the processor 1206 and identifies the first parameter level from the recipe signal 1286. The DSP 1284 provides the first parameter level to the parameter controller PRS1. The parameter controller PRS1 stores the first parameter level within the memory device of the parameter controller PRS1. Upon receiving the trigger signal from the processor 1206, the DSP 1284 sends the trigger signal to the parameter controller PRS1 and to the frequency controller FC. Upon receiving the trigger signal, the parameter controller PRS1 generates a control signal based on the first parameter level for the state S1 and sends the control signal to the driver DRVR. Also, upon receiving the trigger signal, the frequency controller FC generates a control signal and sends the control signal to the driver DRVR. In response to receiving the control signal from the parameter controller PRS1 and the frequency controller FC, the driver generates a drive signal for the state S1 and sends the drive signal to the power supply PS. The power supply PS generates the first parameter level of the RF signal 1288 in response to receiving the drive signal for the state S1.

Figures 13, 14:
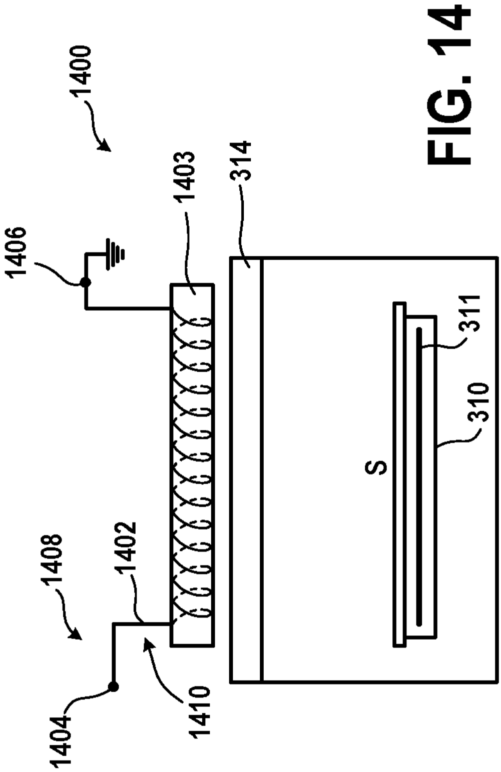
FIG. 13 is a diagram of an embodiment of a system to illustrate a control of a variable capacitor.
FIG. 14 is a diagram of an embodiment of a plasma chamber to illustrate a solenoid coil.

FIG. 13 is a diagram of an embodiment of a system 1300 to illustrate a control of a variable capacitor 1306. The system 1300 includes the host computer 1204, a driver 1302, a motor 1304, and the variable capacitor 1306. The variable capacitor 1306 is an example of any of the first capacitor 110, the second capacitor 112, the third capacitor 908 (FIG. 9A), the fourth capacitor 910 (FIG. 9B), the third capacitor 954 (FIG. 9B), and the fourth capacitor 956 (FIG. 9B).

An example of the motor 1304 is an alternating current motor, which includes a stator and a rotor. An example of the driver 1302 includes one or more transistors. The processor 1206 is coupled to the driver 1302, which is coupled to the motor 1304, which is coupled to the capacitor 1306. The processor 1206 generates sends a control signal based on a capacitance of the capacitor 1306 to be achieved. Upon receiving the control signal, the driver 1302 generates a drive signal, such as a current signal, and sends the drive signal to the motor 1304. The motor 1304 operates to change an amount of overlap between a first plate and a second plate of the capacitor 1306 to change a capacitance of the capacitor 1306.

FIG. 14 is a diagram of an embodiment of a plasma chamber 1400 to illustrate a solenoid coil 1402. The plasma chamber 1400 includes the solenoid coil 1402 and the substrate support 310. The solenoid coil 1402 is situated above the dielectric window 314 and is wrapped around a dielectric mandrel 1403. The solenoid coil 1402 has an end 1404 and an opposite end 1406. As an example, when the solenoid coil 1402 is used instead of the RF coil 114, the end 1404 is coupled to the point 122 (FIGS. 1, 7A, 7B, and 9A). As another example, when the solenoid coil 1402 is used instead of the RF coil 114, the end 1404 is coupled to the output 416 (FIG. 4). As yet another example, when the solenoid coil 1402 is used instead of the RF coil 904, the end 1404 is coupled to the fourth capacitor 910 (FIG. 9A). As still another example, when the solenoid coil 1402 is used instead of the RF coil 904, the end 1404 is coupled to the point 960 (FIG. 9B). As another example, when the solenoid coil 1402 is used instead of the RF coil 904, the end 1404 is coupled to the filter 983 (FIG. 9C). As yet another example, when the solenoid coil 1402 is used instead of the RF coil 904, the end 1404 is coupled to the filter 992 (FIG. 9D).

When an RF signal 1408 is received by the solenoid coil 1402, a magnetic field is generated by the solenoid coil 1402 and extends through the dielectric window 314 into the plasma chamber 1400. The RF signal 1408 is an example of any of the RF signals 123 (FIG. 1), 426 (FIG. 4), 706 (FIG. 7A), 756 (FIG. 7B), 922 (FIG. 9A), 920 (FIG. 9A), 966 (FIG. 9B), 970 (FIG. 9D), 984 (FIG. 9E), and 994 (FIG. 9F). When the one or more process gases are supplied to the plasma chamber 1400 in addition to the RF signal 1408, plasma is stricken or maintained within the plasma chamber 1400 to process the substrate S. When the plasma is formed within the plasma chamber 1400, RF power is reflected in the form of a reflected RF signal 1410 from the plasma chamber 1400 via the solenoid coil 1402 towards the point 1404. The reflected RF signal 1410 is an example of any of the reflected RF signals 115 (FIG. 1), 428 (FIG. 4), 708 (FIG. 7A), 758 (FIG. 7B), 924 (FIG. 9A), 930 (FIG. 9A), 980 (FIG. 9B), 974 (FIG. 9B), 986 (FIG. 9C), and 996 (FIG. 9D).

In one embodiment, with reference to FIG. 9A, the solenoid coil 1402 is use instead of the RF coil 114 and another solenoid coil is used instead of the RF coil 904.

In an embodiment, with reference to FIG. 9B, the solenoid coil 1402 is used in place of the RF coil 114 and another solenoid coil is used in place of the RF coil 904.

Figure 15:
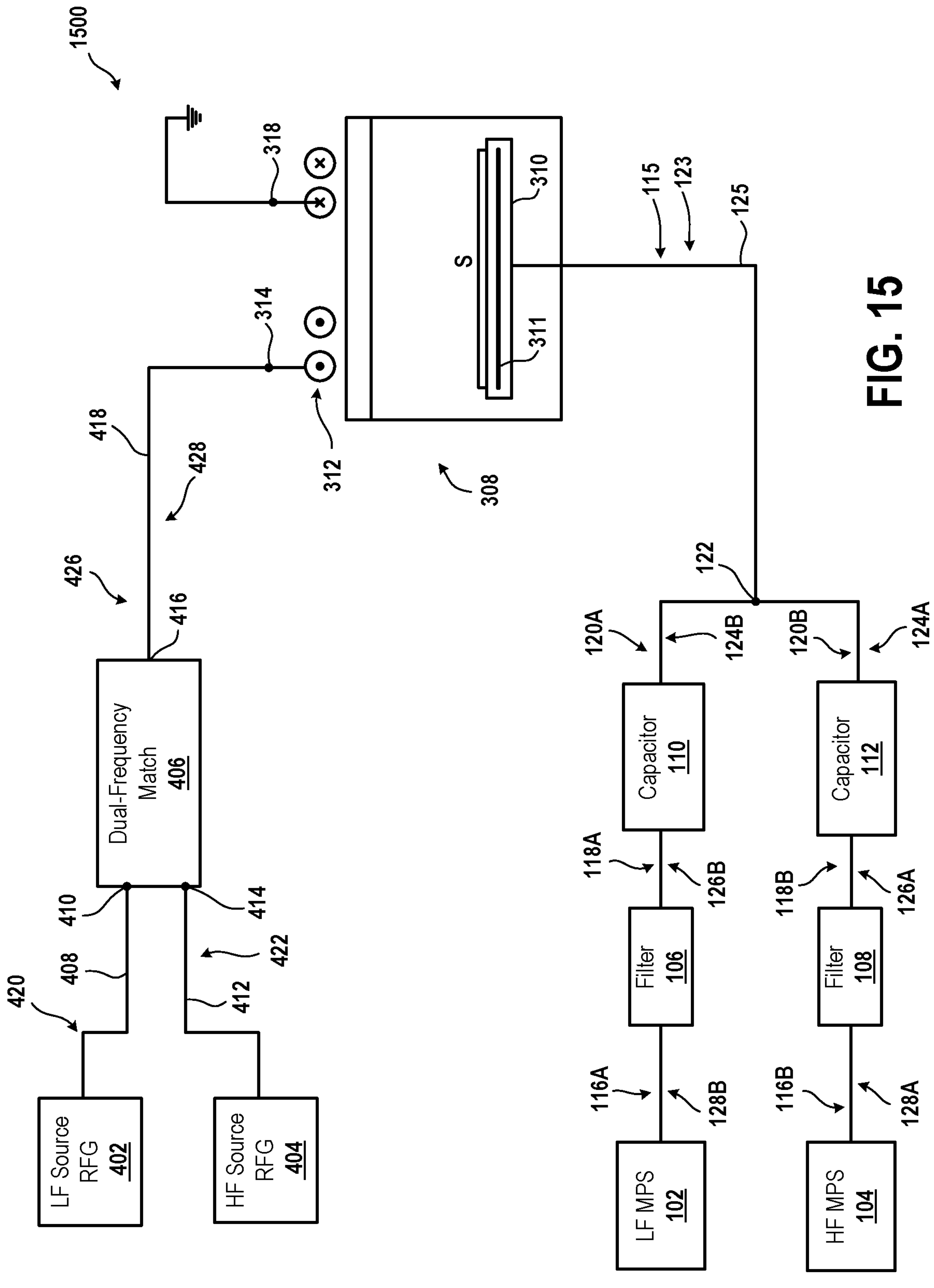
FIG. 15 is a diagram of an embodiment of a plasma system to illustrate use of the LF MPS and the HF MPS with a substrate support.

FIG. 15 is a diagram of an embodiment of a plasma system 1500 to illustrate use of the LF MPS 102 and the HF MPS 102 with the substrate support 310. The plasma system 1500 includes the LF source RFG 402, the HF source RFG 404, the dual-frequency match 406, the plasma chamber 308, the LF MPS 102, the HF MPS 104, the first filter 106, the second filter 108, the first capacitor 110, and the second capacitor 112. In the plasma system 1500, the point 122 is coupled to the lower electrode 311 via the RF connection 125, such as an RF transmission line.

When the modified RF signal 426 is supplied to the RF coil 312, the combined RF signal 123 is supplied to the lower electrode 311, and the one or more process gases are supplied to the plasma chamber 308, plasma is generated or maintained within the plasma chamber 308. When the plasma is generated or maintained, RF power is reflected from the plasma towards via the lower electrode 311 to the RF connection 125 in the form of the reflected RF signal 115.

FIG. 16A is a diagram of an embodiment of a system 1600 to illustrate a master slave configuration. In the master slave configuration, the LF MPS 102 is a master and the HF MPS 104 is a slave. For example, a controller of the LF MPS 102 is coupled to a controller of the HF MPS 104 via a transfer cable 1602. Instead of the host computer 1204 (FIG. 12) providing, within the recipe signal 1224 (FIG. 12A-1), the high frequency, one or more parameter levels, and transition times between the parameter levels of the RF signal 116B generated by the HF MPS 104, the controller of the LF MPS 102 generates a recipe signal 1604 and sends the recipe signal 1604 via the transfer cable 1602 to the controller of the HF MPS 104. The recipe signal 1604 is an example of the recipe signal 1224 (FIG. 12A-2). The recipe signal 1604 includes the high frequency, one or more parameter levels, and transition times between the parameter levels of the RF signal 116B to be output by the HF MPS 104. The HF MPS 104 generates the RF signal 116B based on the high frequency, one or more parameter levels, and transition times between the parameter levels indicated within the recipe signal 1604.

FIG. 16B is a diagram of an embodiment of a system 1610 to illustrate a master slave configuration. In the master slave configuration, the HF MPS 104 is a master and the LF MPS 102 is a slave. For example, a controller of the HF MPS 104 is coupled to a controller of the LF MPS 102 via a transfer cable 1612. Instead of the host computer 1204 (FIG. 12) providing, within the recipe signal 1224 (FIG. 12A-1), the low frequency, one or more parameter levels, and transition times between the parameter levels of the RF signal 116A to be generated by the LF MPS 104, the controller of the HF MPS 104 generates a recipe signal 1614 and sends the recipe signal 1614 via the transfer cable 1612 to the controller of the LF MPS 102. The recipe signal 1614 is an example of the recipe signal 1224 (FIG. 12A-2). The recipe signal 1614 includes the low frequency, one or more parameter levels, and transition times between the parameter levels of the RF signal 116A to be output by the LF MPS 102. The LF MPS 102 generates the RF signal 116A based on the low frequency, one or more parameter levels, and transition times between the parameter levels indicated within the recipe signal 1614.

FIG. 16C is a diagram of an embodiment of a system 1620 to illustrate a master slave configuration. In the master slave configuration, the LF source RFG 402 is a master and the HF MPS 104 is a slave. For example, a DSP of the LF source RFG 402 is coupled to a controller of the HF MPS 104 via a transfer cable 1622. Instead of the host computer 1204 (FIG. 12) providing, within the recipe signal 1224 (FIG. 12A-1), the high frequency, one or more parameter levels, and transition times between the parameter levels of the RF signal 116B generated by the HF MPS 104, the DSP of the LF source RFG 402 generates a recipe signal 1624 and sends the recipe signal 1624 via the transfer cable 1622 to the controller of the HF MPS 104. The recipe signal 1624 is an example of the recipe signal 1224 (FIG. 12B). The recipe signal 1624 includes the high frequency, one or more parameter levels, and transition times between the parameter levels of the RF signal 116B to be output by the HF MPS 104. The HF MPS 104 generates the RF signal 116B based on the high frequency, one or more parameter levels, and transition times between the parameter levels indicated within the recipe signal 1624.

FIG. 16D is a diagram of an embodiment of a system 1630 to illustrate a master slave configuration. In the master slave configuration, the HF source RFG 404 is a master and the LF MPS 102 is a slave. For example, a DSP of the HF source RFG 404 is coupled to a controller of the LF MPS 102 via a transfer cable 1632. Instead of the host computer 1204 (FIG. 12) providing, within the recipe signal 1224 (FIG. 12A-1), the low frequency, one or more parameter levels, and transition times between the parameter levels of the RF signal 116A to be generated by the LF MPS 102, the DSP of the HF source RFG 404 generates a recipe signal 1634 and sends the recipe signal 1634 via the transfer cable 1632 to the controller of the LF MPS 102. The recipe signal 1634 is an example of the recipe signal 1224 (FIG. 12A-2). The recipe signal 1634 includes the low frequency, one or more parameter levels, and transition times between the parameter levels of the RF signal 116A to be output by the LF MPS 102. The LF MPS 102 generates the RF signal 116A based on the low frequency, one or more parameter levels, and transition times between the parameter levels indicated within the recipe signal 1634.

FIG. 16E is a diagram of an embodiment of a system 1640 to illustrate a master slave configuration. In the master slave configuration, the LF MPS 102 is a master and the HF source RFG 404 is a slave. For example, a controller of the LF MPS 102 is coupled to a DSP of the HF source RFG 404 via a transfer cable 1642. Instead of the host computer 1204 (FIG. 12) providing, within the recipe signal 1286 (FIG. 12B), the high frequency, one or more parameter levels, and transition times between the parameter levels of the RF signal 422 to be generated by the HF source RFG 404, the controller of the LF MPS 102 generates a recipe signal 1644 and sends the recipe signal 1644 via the transfer cable 1642 to the DSP of the HF source RFG 404. The recipe signal 1644 is an example of the recipe signal 1286 (FIG. 12B). The recipe signal 1644 includes the high frequency, one or more parameter levels, and transition times between the parameter levels of the RF signal 422 to be output by the HF source RFG 404. The HF source RFG 404 generates the RF signal 422 based on the high frequency, one or more parameter levels, and transition times between the parameter levels indicated within the recipe signal 1644.

FIG. 16F is a diagram of an embodiment of a system 1650 to illustrate a master slave configuration. In the master slave configuration, the HF MPS 104 is a master and the LF source RFG 402 is a slave. For example, a controller of the HF MPS 104 is coupled to a DSP of the LF source RFG 402 via a transfer cable 1652. Instead of the host computer 1204 (FIG. 12) providing, within the recipe signal 1286 (FIG. 12B), the low frequency, one or more parameter levels, and transition times between the parameter levels of the RF signal 420 to be generated by the LF source RFG 402, the controller of the HF MPS 104 generates a recipe signal 1654 and sends the recipe signal 1654 via the transfer cable 1652 to the DSP of the LF source RFG 402. The recipe signal 1654 is an example of the recipe signal 1286 (FIG. 12B). The recipe signal 1654 includes the low frequency, one or more parameter levels, and transition times between the parameter levels of the RF signal 420 to be output by the LF source RFG 402. The LF source RFG 402 generates the RF signal 420 based on the low frequency, one or more parameter levels, and transition times between the parameter levels indicated within the recipe signal 1654.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics to fabricate an integrated circuit for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment, described above, are combined with one or more features of any other embodiment, also described above, without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A system comprising:

a first matchless plasma source configured to generate a first sinusoidal waveform, wherein the first sinusoidal waveform is generated based on a first square waveform, wherein the first sinusoidal waveform has a first frequency;

a first filter coupled to the first matchless plasma source, wherein the first filter is configured to filter a second frequency from interfering with the first sinusoidal waveform;

a first capacitive circuit coupled to the first filter, wherein the first capacitive circuit is configured to balance a reactance of the first filter with a reactance of an RF coil of a plasma chamber to output a first radio frequency (RF) signal, wherein the first capacitive circuit is configured to provide the first RF signal to a point that is coupled to the RF coil;

a second matchless plasma source configured to generate a second sinusoidal waveform, wherein the second sinusoidal waveform is generated based on a second square waveform, wherein the second sinusoidal waveform has the second frequency;

a second filter coupled to the second matchless plasma source, wherein the second filter is configured to filter the first frequency from interfering with the second sinusoidal waveform; and a second capacitive circuit coupled to the second filter, wherein the second capacitive circuit is configured to balance a reactance of the second filter with the reactance of the RF coil to output a second RF signal, wherein the second capacitive circuit is configured to provide the second RF signal to the point.

2. The system of claim 1, wherein the first RF signal is combined with the second RF signal at the point to provide a combined RF signal to the RF coil.

3. The system of claim 1, wherein the second frequency is greater than the first frequency.

4. The system of claim 1, further comprising the plasma chamber including the RF coil and a substrate support.

5. The system of claim 4, further comprising:

a first bias RF generator configured to generate a third RF signal;

a match coupled to the first bias RF generator;

a second bias RF generator coupled to the match, wherein the second bias RF generator is configured to generate a fourth RF signal, wherein the match is configured to receive the third and fourth RF signals and modify impedances of the third and fourth RF signals to output a combined RF signal, wherein the match is configured to provide the combined RF signal to the substrate support.

6. The system of claim 4, wherein the substrate support is coupled to a ground potential.

7. The system of claim 1, wherein the first capacitive circuit is configured to receive a reflected RF signal having RF power reflected from the plasma chamber, wherein the reflected RF signal has the second frequency.

8. The system of claim 1, wherein the second capacitive circuit is configured to receive a reflected RF signal having RF power reflected from the plasma chamber, wherein the reflected RF signal has the first frequency.

9. The system of claim 1, wherein there is a lack of a match between the first matchless plasma source and the RF coil and there is a lack of a match between the second matchless plasma source and the RF coil.

10. A system comprising:

a matchless plasma source configured to generate a sinusoidal waveform, wherein the sinusoidal waveform is generated based on a square waveform, wherein the sinusoidal waveform has a first frequency;

a first filter coupled to the matchless plasma source, wherein the first filter is configured to filter a second frequency from interfering within the sinusoidal waveform;

a capacitive circuit coupled to the first filter, wherein the capacitive circuit is configured to balance a reactance of the first filter with a reactance of an RF coil of a plasma chamber to output a first radio frequency (RF) signal, wherein the capacitive circuit is configured to provide the first RF signal to a point that is coupled to the RF coil;

a source RF generator configured to generate a second RF signal having the second frequency; and an impedance matching network coupled to the source RF generator, wherein the impedance matching network is configured to receive the second RF signal and modify an impedance of the second RF signal to output a modified RF signal, wherein the impedance matching network includes a second filter, wherein the second filter is configured to filter the first frequency from interfering with the second RF signal, wherein the impedance matching network is configured to provide the modified RF signal to the point.

11. The system of claim 10, wherein the point is configured to combine the first RF signal with the modified RF signal to provide a combined RF signal to the RF coil.

12. The system of claim 10, wherein the second frequency is greater than the first frequency or is equal to the first frequency or is less than the first frequency.

13. The system of claim 10, further comprising the plasma chamber including the RF coil and a substrate support.

14. The system of claim 13, further comprising:

a first bias RF generator configured to generate a third RF signal;

a match coupled to the first bias RF generator;

a second bias RF generator coupled to the match, wherein the second bias RF generator is configured to generate a fourth RF signal, wherein the match is configured to receive the third and fourth RF signals and modify impedances of the third and fourth RF signals to output a combined RF signal, wherein the match is configured to provide the combined RF signal to the substrate support.

15. The system of claim 13, wherein the substrate support is coupled to a ground potential.

16. The system of claim 10, wherein the capacitive circuit is configured to receive a reflected RF signal having RF power reflected from the plasma chamber, wherein the reflected RF signal has the second frequency.

17. The system of claim 10, wherein there is a lack of a match between the matchless plasma source and the RF coil, wherein the match includes a physical housing.

18. A system comprising:

a first matchless plasma source configured to generate a first sinusoidal waveform, wherein the first sinusoidal waveform is generated based on a first square waveform, wherein the first sinusoidal waveform has a first frequency;

a first filter coupled to the first matchless plasma source, wherein the first filter is configured to filter a second frequency from interfering with the first sinusoidal waveform;

a first capacitive circuit coupled to the first filter, wherein the first capacitive circuit is configured to balance a reactance of the first filter with a reactance of a first radio frequency (RF) coil of a plasma chamber to output a first RF signal, wherein the first capacitive circuit is configured to provide the first RF signal to a point that is coupled to the first RF coil;

a second matchless plasma source configured to generate a second sinusoidal waveform, wherein the second sinusoidal waveform is generated based on a second square waveform, wherein the second sinusoidal waveform has the second frequency;

a second filter coupled to the second matchless plasma source, wherein the second filter is configured to filter the first frequency from interfering with the second sinusoidal waveform;

a second capacitive circuit coupled to the second filter, wherein the second capacitive circuit is configured to balance a reactance of the second filter with a reactance of the first RF coil and a reactance of a second RF coil of the plasma chamber to output a second RF signal; and a signal splitter coupled to the second capacitive circuit, wherein the signal splitter is configured to split the second RF signal into a third RF signal and a fourth RF signal, wherein the signal splitter includes a third capacitive circuit and a fourth capacitive circuit, wherein the third capacitive circuit is configured to receive the third RF signal and balance the reactance of the first RF coil of the plasma chamber with the reactance of the second filter to provide a fifth RF signal to the point, wherein the fourth capacitive circuit is configured to receive the fourth RF signal and balance the reactance of the second RF coil with the reactance of the second filter to provide a sixth RF signal to the second RF coil.

19. The system of claim 18, wherein the point is configured to combine the first RF signal with the fifth RF signal to provide a seventh RF signal to the first RF coil.

20. The system of claim 18, wherein the second frequency is greater than the first frequency.

21. The system of claim 18, further comprising the plasma chamber including the first RF coil, the second RF coil, and a substrate support.

22. The system of claim 21, further comprising:

a first bias RF generator configured to generate a seventh RF signal;

a match coupled to the first bias RF generator;

a second bias RF generator coupled to the match, wherein the second bias RF generator is configured to generate an eighth RF signal, wherein the match is configured to receive the seventh and eighth RF signals and modify impedances of the seventh and eighth RF signals to output a combined RF signal, wherein the match is configured to provide the combined RF signal to the substrate support.

23. The system of claim 21, wherein the substrate support is coupled to a ground potential.

* * * * *